US011404562B2

(12) United States Patent
Huang et al.

(10) Patent No.: US 11,404,562 B2
(45) Date of Patent: Aug. 2, 2022

(54) TUNNELING FIELD EFFECT TRANSISTORS

(71) Applicant: Intel Corporation, Santa Clara, CA (US)

(72) Inventors: Cheng-Ying Huang, Portland, OR (US); Willy Rachmady, Beaverton, OR (US); Matthew V. Metz, Portland, OR (US); Ashish Agrawal, Hillsboro, OR (US); Benjamin Chu-Kung, Portland, OR (US); Uygar E. Avci, Portland, OR (US); Jack T. Kavalieros, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 16/632,266

(22) PCT Filed: Aug. 18, 2017

(86) PCT No.: PCT/US2017/047523
§ 371 (c)(1),
(2) Date: Jan. 17, 2020

(87) PCT Pub. No.: WO2019/035842
PCT Pub. Date: Feb. 21, 2019

(65) Prior Publication Data
US 2020/0168724 A1    May 28, 2020

(51) Int. Cl.
*H01L 29/66* (2006.01)
*H01L 29/08* (2006.01)
*H01L 29/78* (2006.01)

(52) U.S. Cl.
CPC .... *H01L 29/66977* (2013.01); *H01L 29/0847* (2013.01); *H01L 29/66522* (2013.01);
(Continued)

(58) Field of Classification Search
CPC .......................... H01L 29/0847; H01L 29/785
See application file for complete search history.

(56) References Cited

U.S. PATENT DOCUMENTS 7,834,345 B2 * 11/2010 Bhuwalka ........... H01L 29/7391
257/28
9,548,381 B1 * 1/2017 Krishnan .......... H01L 29/78618
(Continued)

FOREIGN PATENT DOCUMENTS

KR      1020150085663 A      7/2015
WO        2019035842 A1      2/2019

OTHER PUBLICATIONS

PCT International Search Report and Written Opinion issued in PCT Application No. PCT/US2017/047523 dated Feb. 26, 2018; 12 pages.
(Continued)

*Primary Examiner* — Fernando L Toledo
*Assistant Examiner* — Valerie N Newton
(74) *Attorney, Agent, or Firm* — Patent Capital Group

(57) ABSTRACT

Disclosed herein are tunneling field effect transistors (TFETs), and related methods and computing devices. In some embodiments, a TFET may include: a first source/drain material having a p-type conductivity; a second source/drain material having an n-type conductivity; a channel material at least partially between the first source/drain material and the second source/drain material, wherein the channel material has a first side face and a second side face opposite the first side face; and a gate above the channel material, on the first side face, and on the second side face.

20 Claims, 50 Drawing Sheets

(52) U.S. Cl.
CPC .. *H01L 29/66795* (2013.01); *H01L 29/66969* (2013.01); *H01L 29/785* (2013.01)

(56) References Cited

U.S. PATENT DOCUMENTS

| | | | |
|---|---|---|---|
| 9,627,508 B2* | 4/2017 | Chudzik | H01L 29/7391 |
| 10,276,663 B2* | 4/2019 | Chen | H01L 29/165 |
| 10,734,511 B2* | 8/2020 | Huang | H01L 29/7391 |
| 2010/0059737 A1 | 3/2010 | Bhuwalka et al. | |
| 2010/0097135 A1 | 4/2010 | Curatola et al. | |
| 2011/0042757 A1 | 2/2011 | Tan et al. | |
| 2011/0303950 A1* | 12/2011 | Lauer | H01L 29/165 257/192 |
| 2015/0041847 A1 | 2/2015 | Kotlyar et al. | |
| 2016/0240666 A1* | 8/2016 | Miyata | H01L 29/0847 |
| 2016/0322479 A1* | 11/2016 | Liu | H01L 29/516 |
| 2018/0308959 A1* | 10/2018 | Afzalian | H01L 29/0676 |

OTHER PUBLICATIONS

Wikipedia, "Tunnel field-effect transistor," accessed at https://en.wikipedia.org/wiki/Tunnel_field-effect_transistor on Jul. 9, 2017.

* cited by examiner

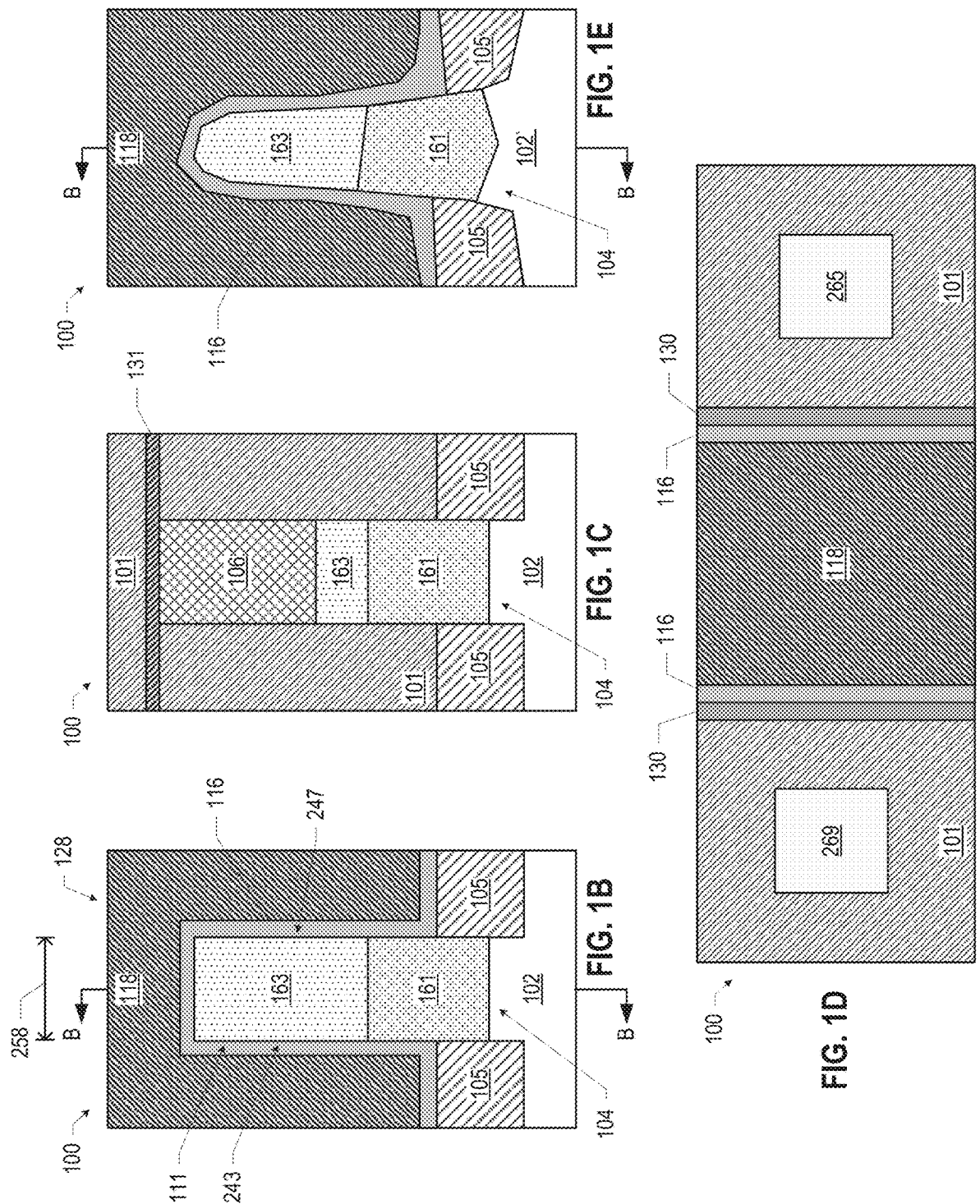

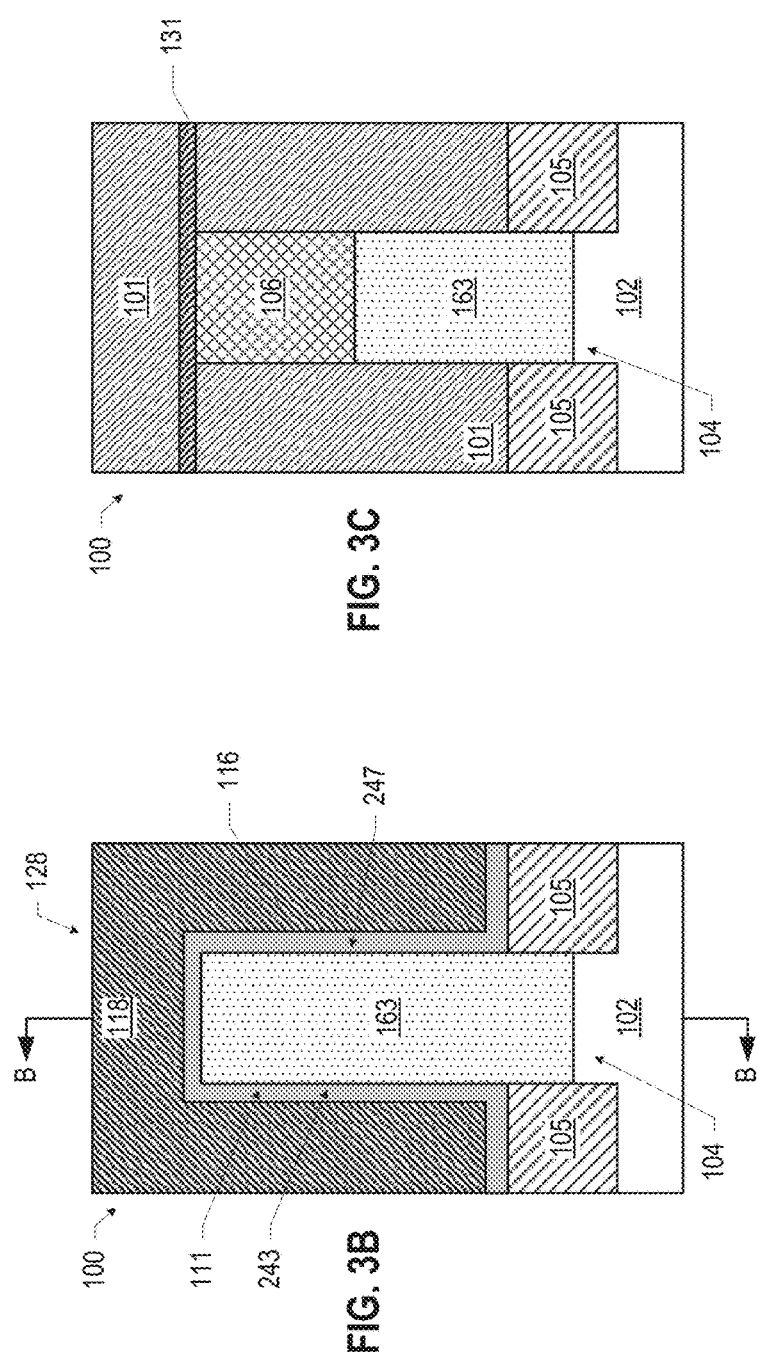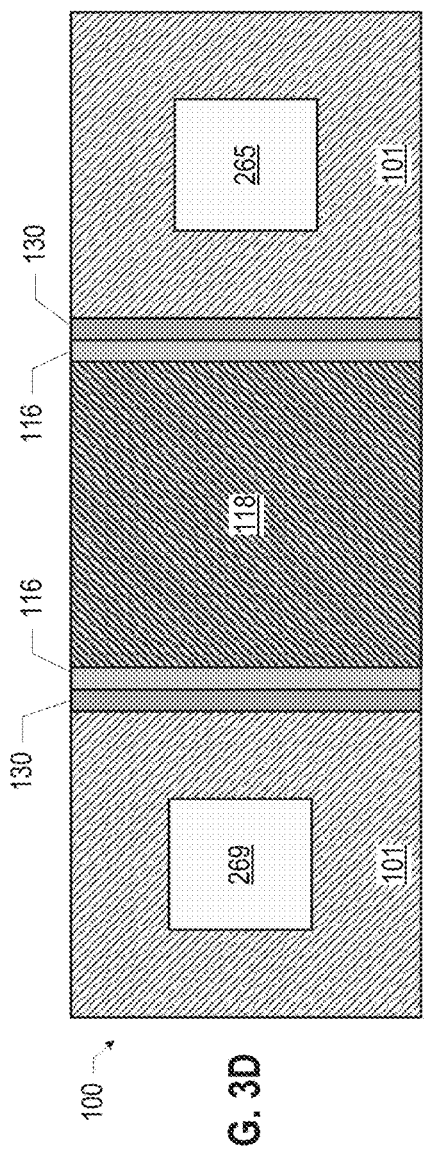

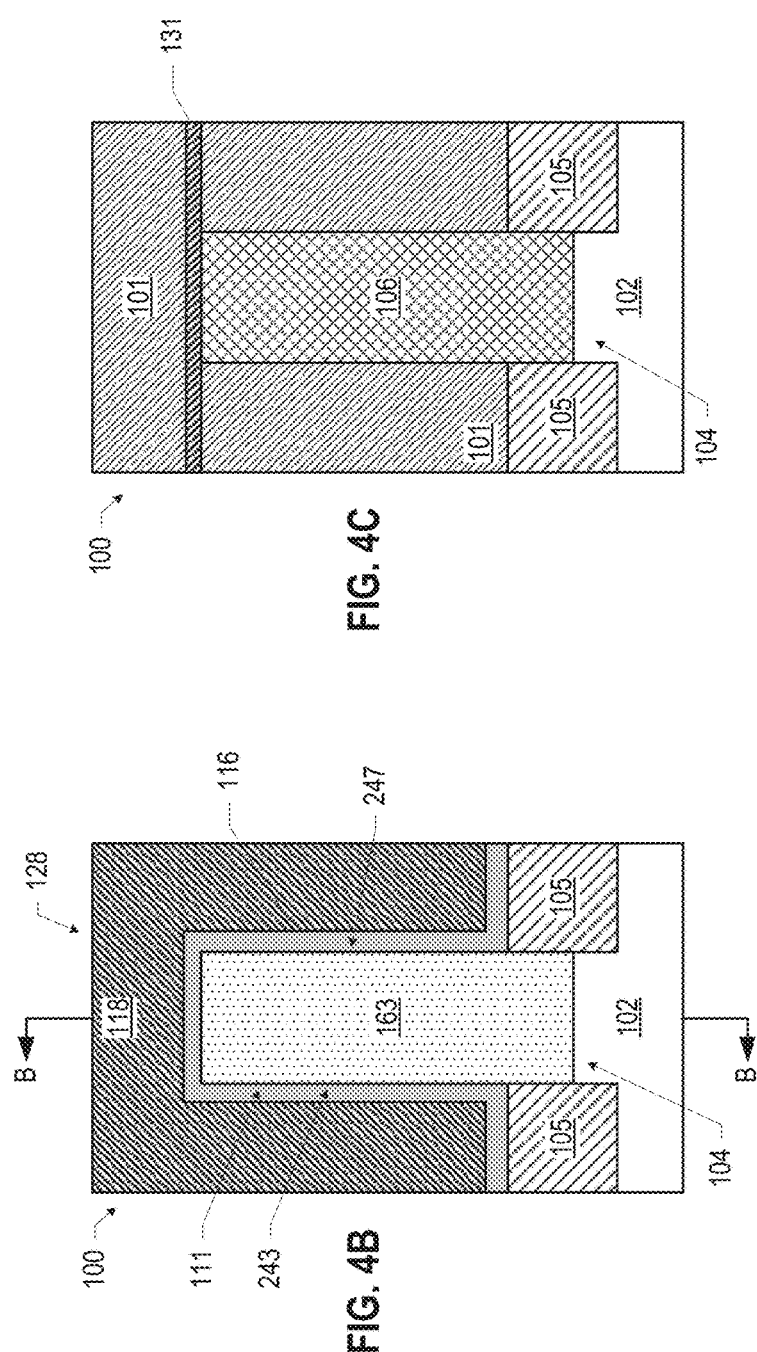

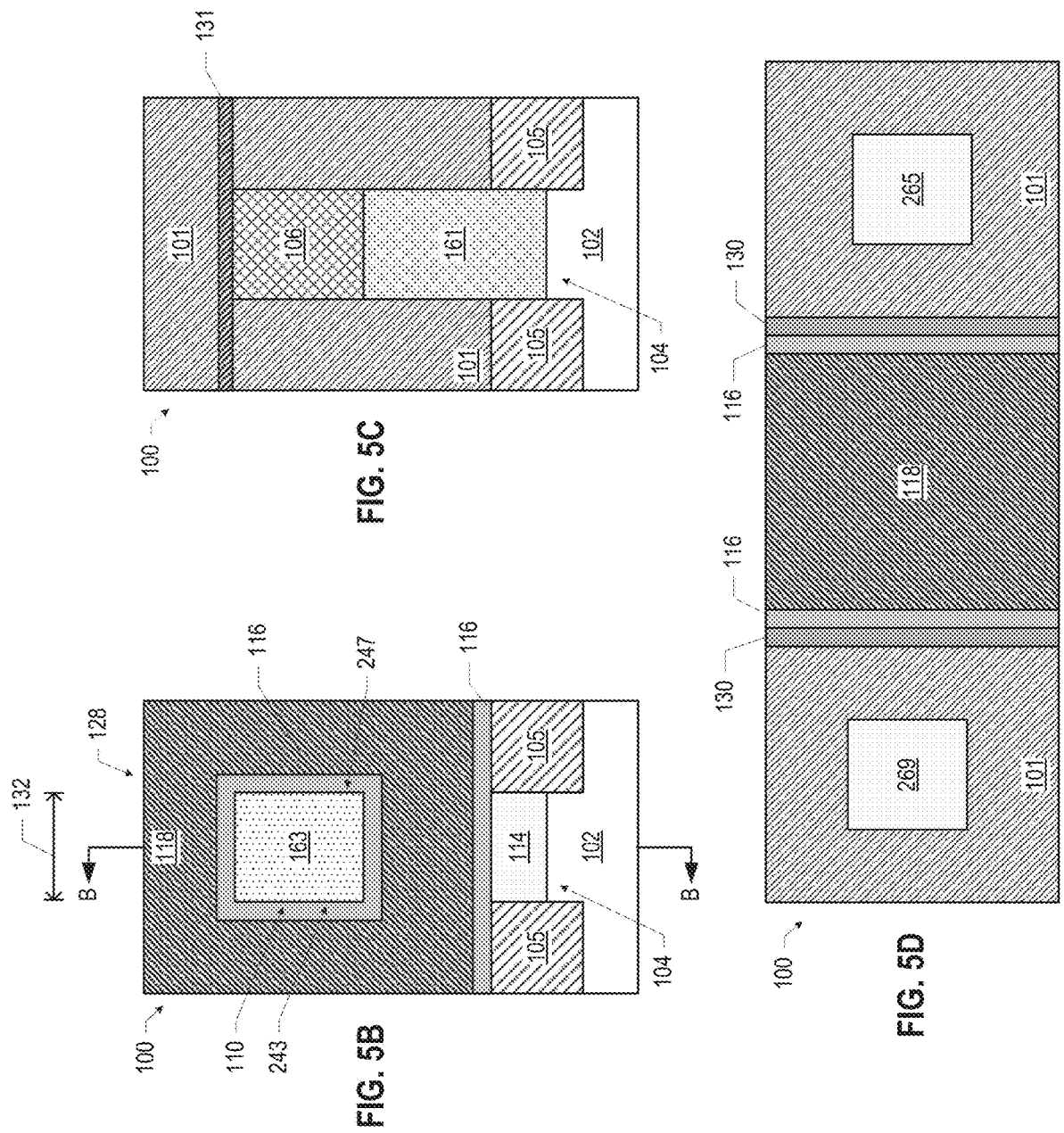

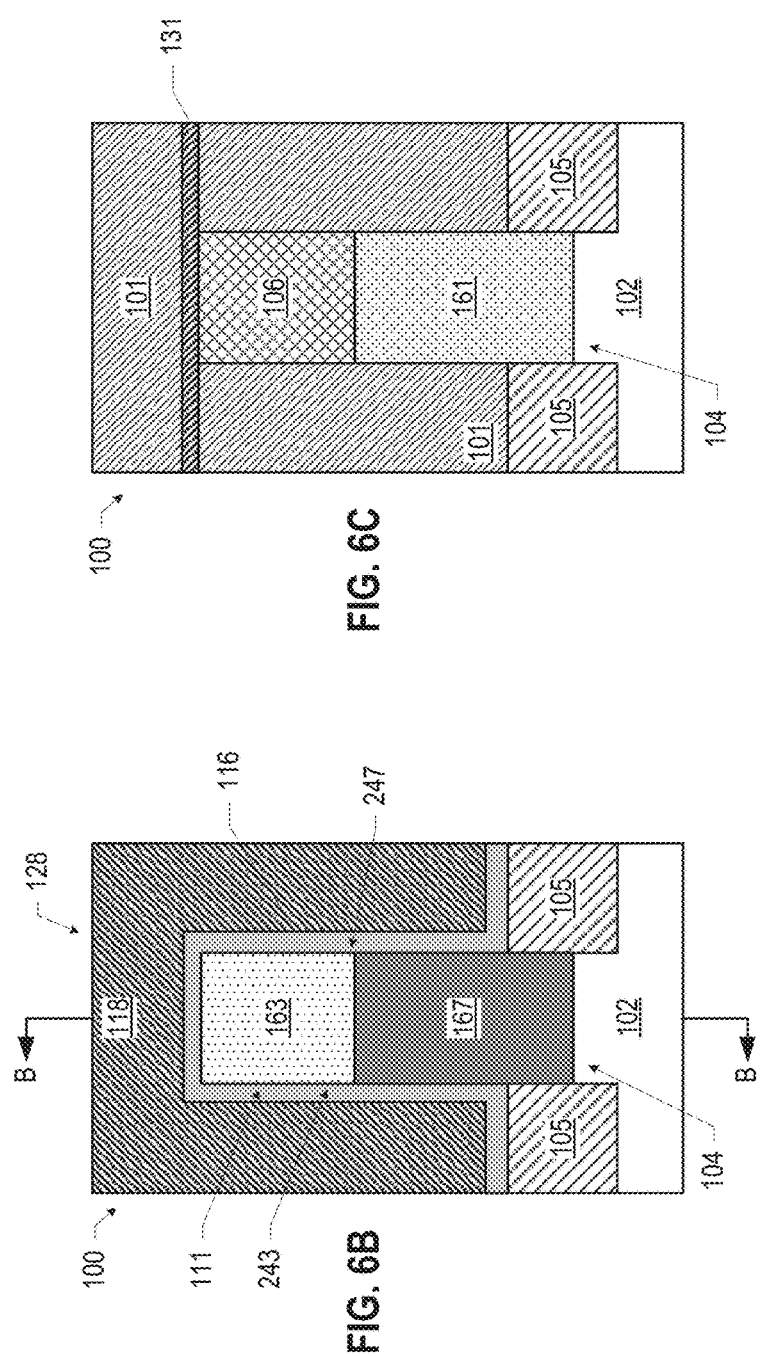

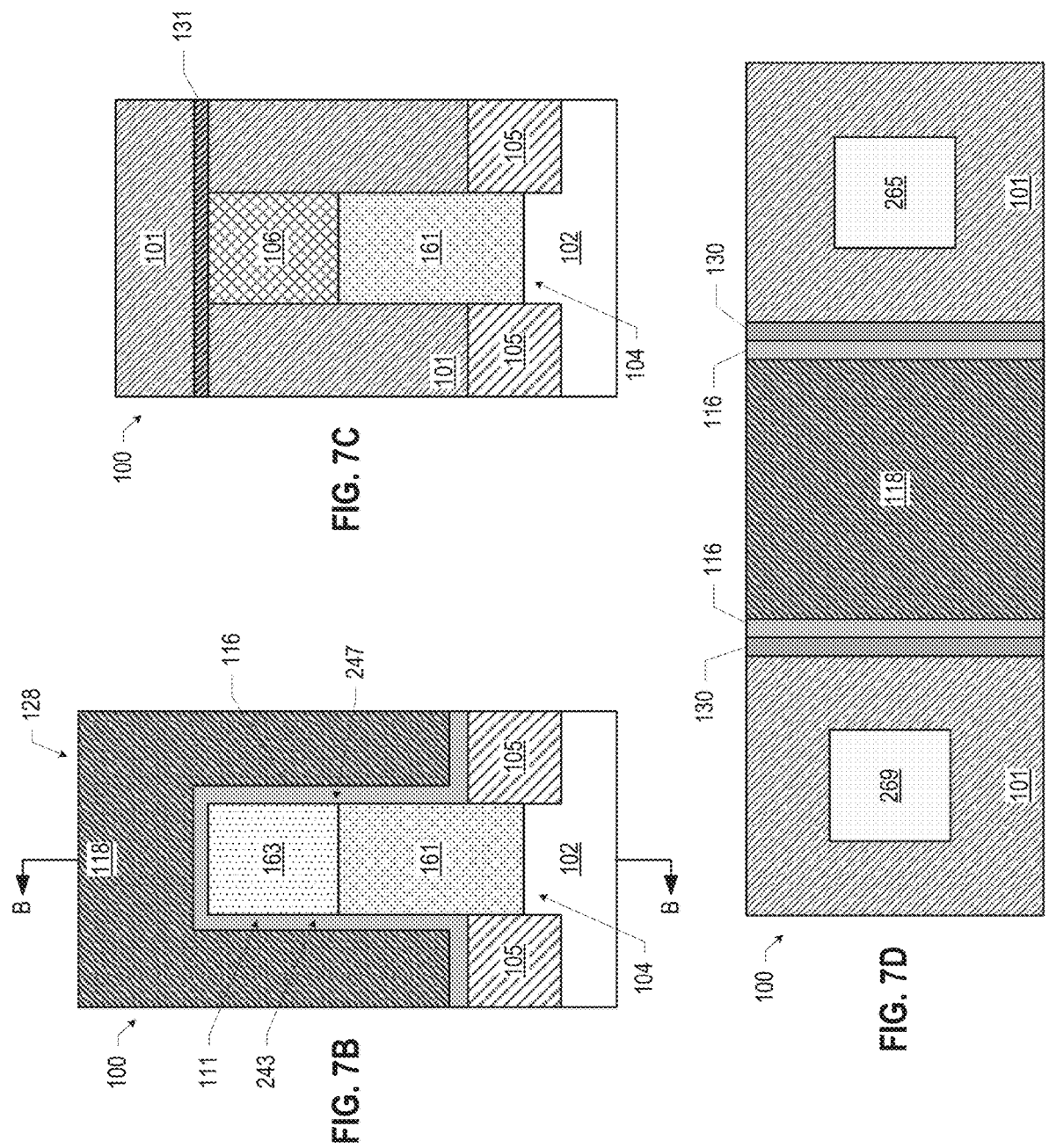

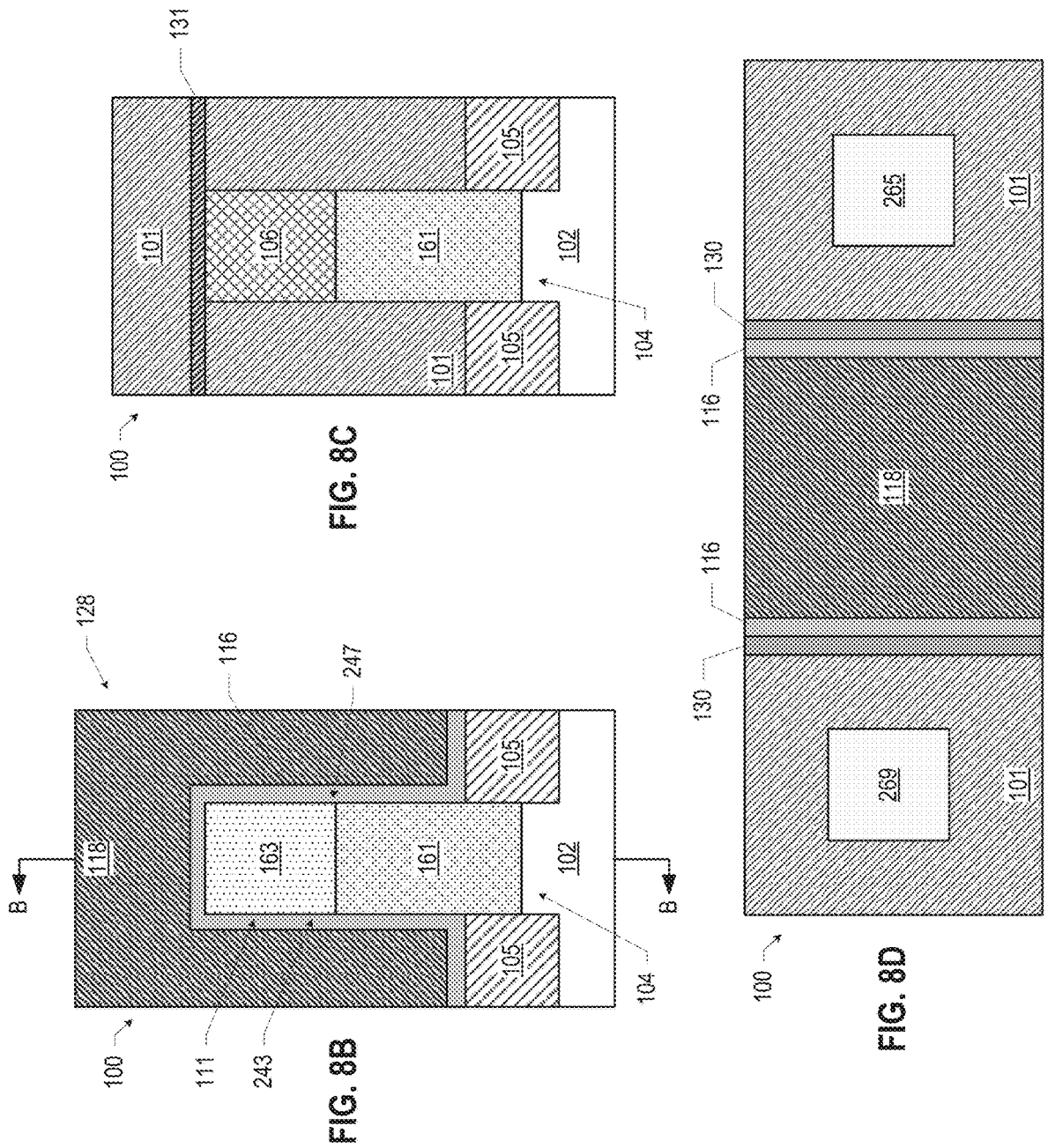

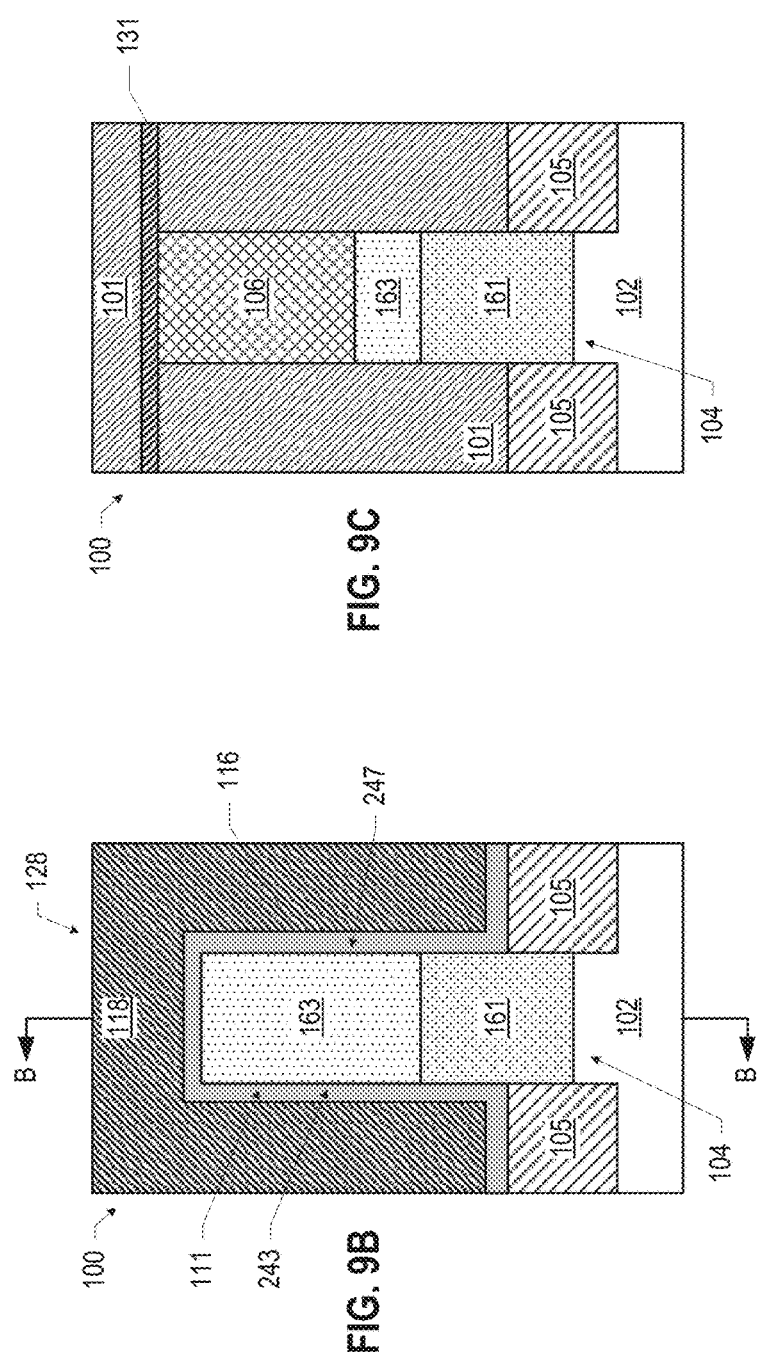

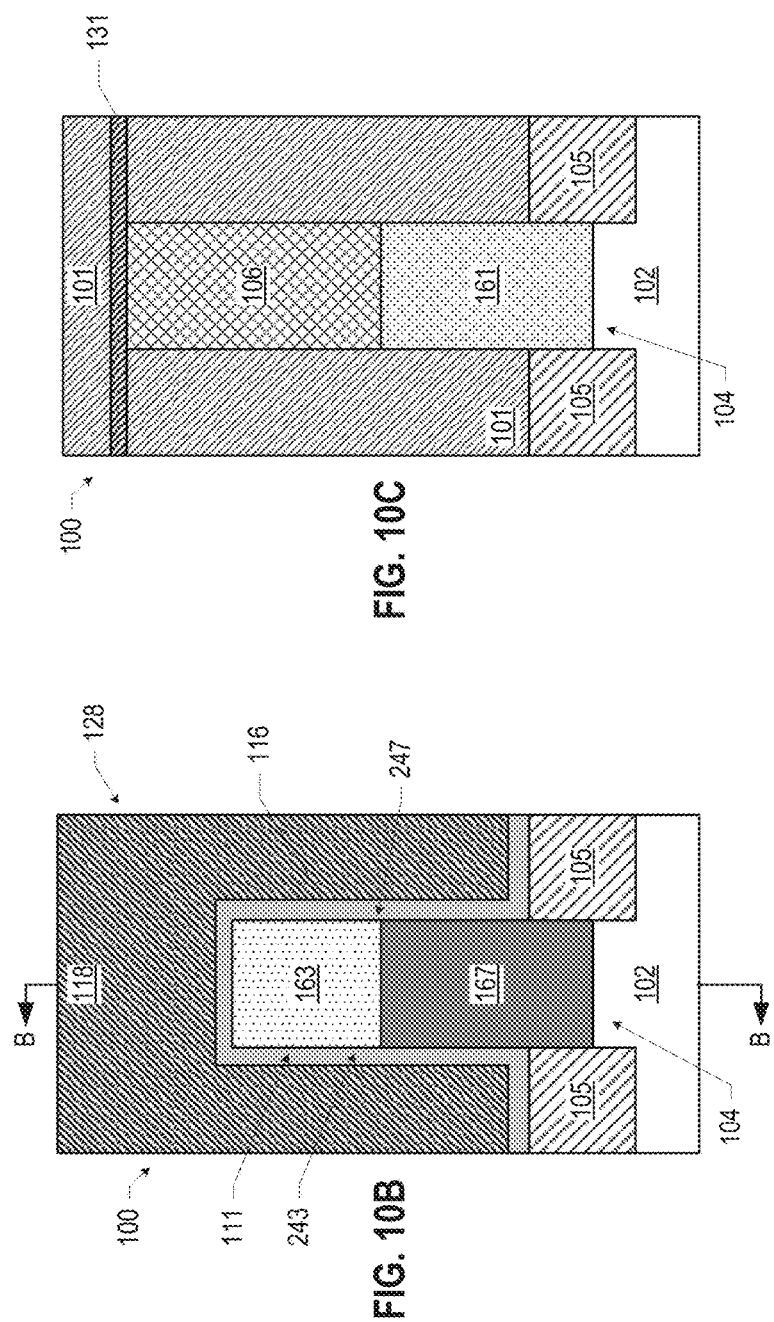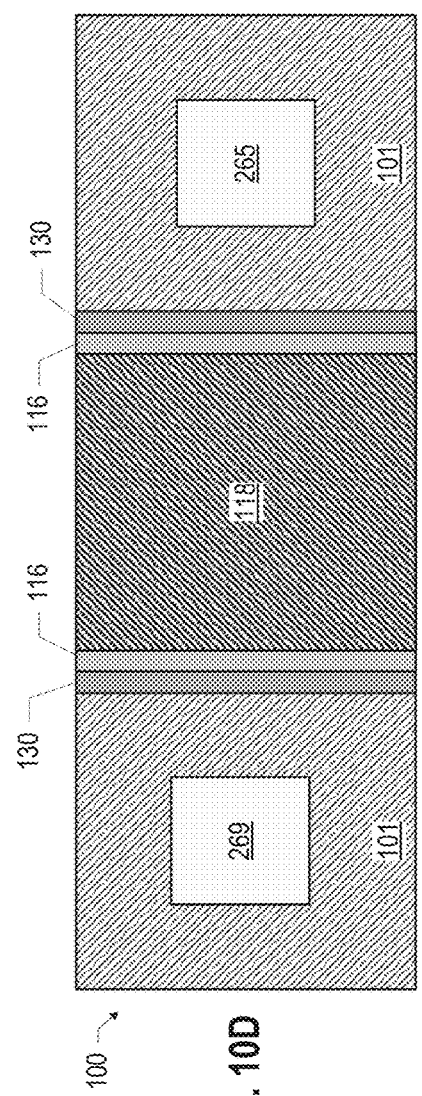

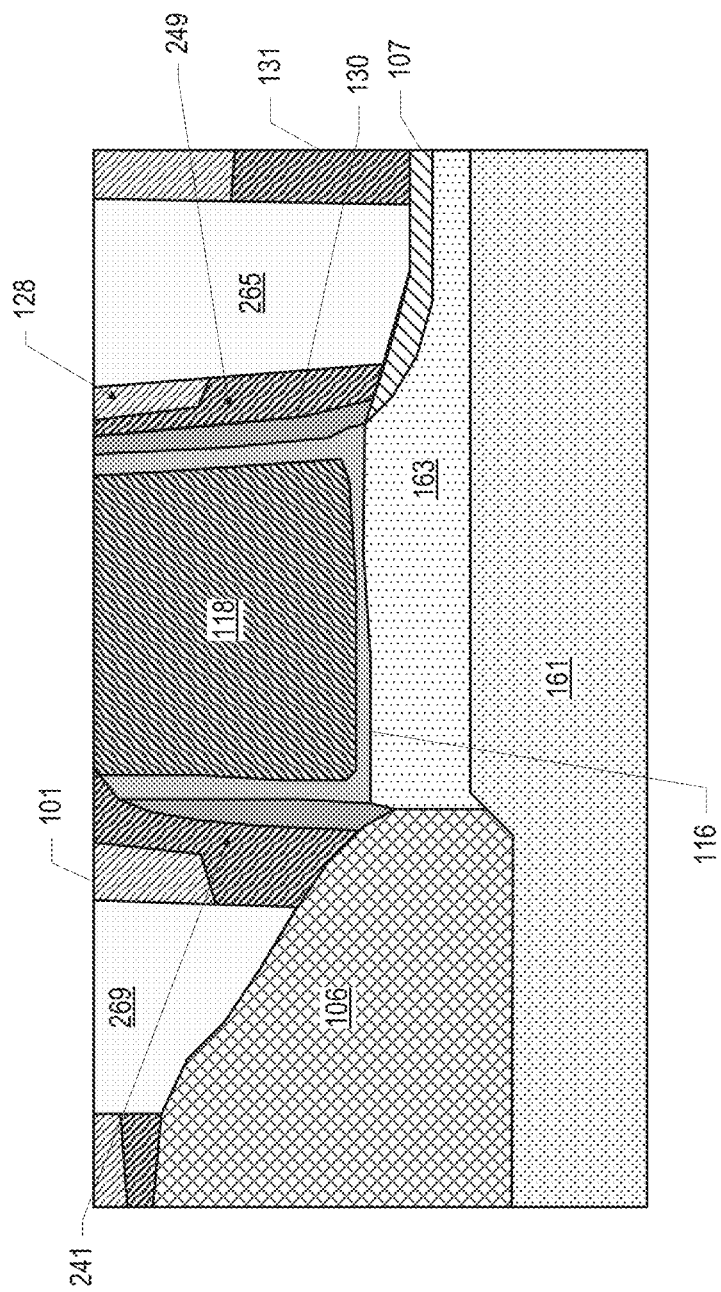

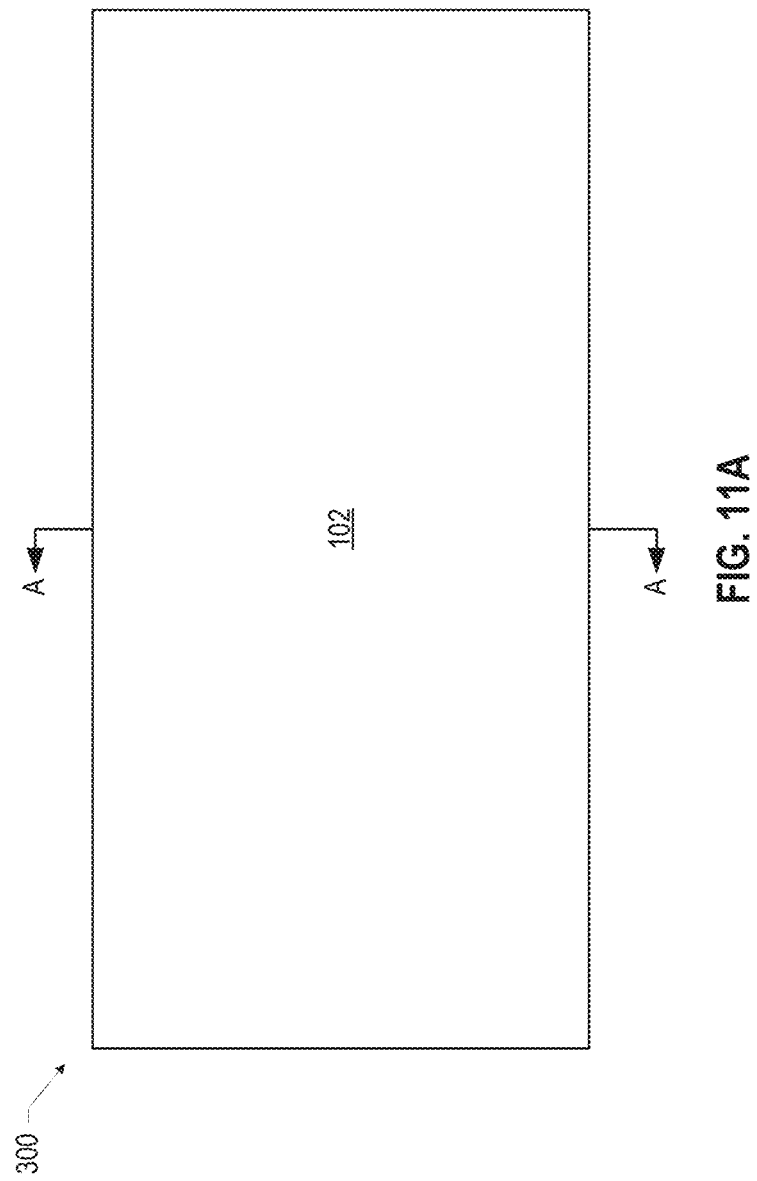

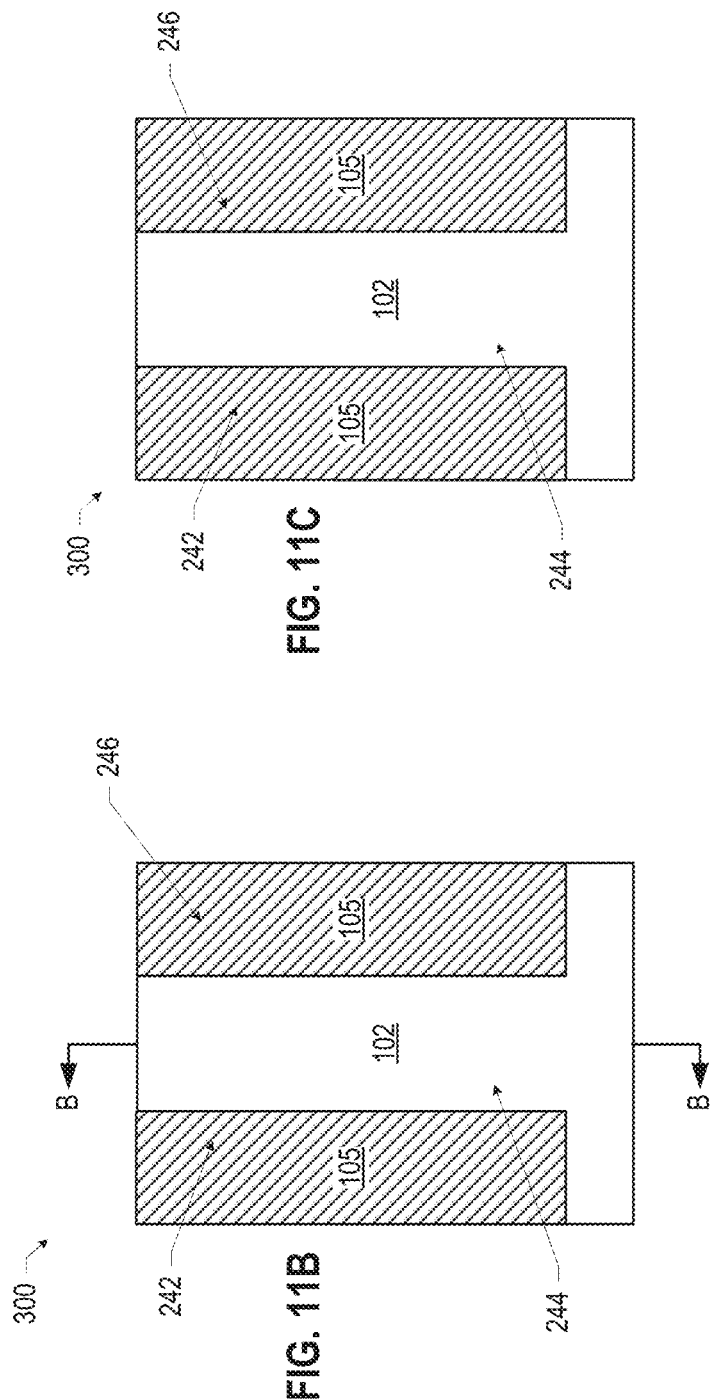
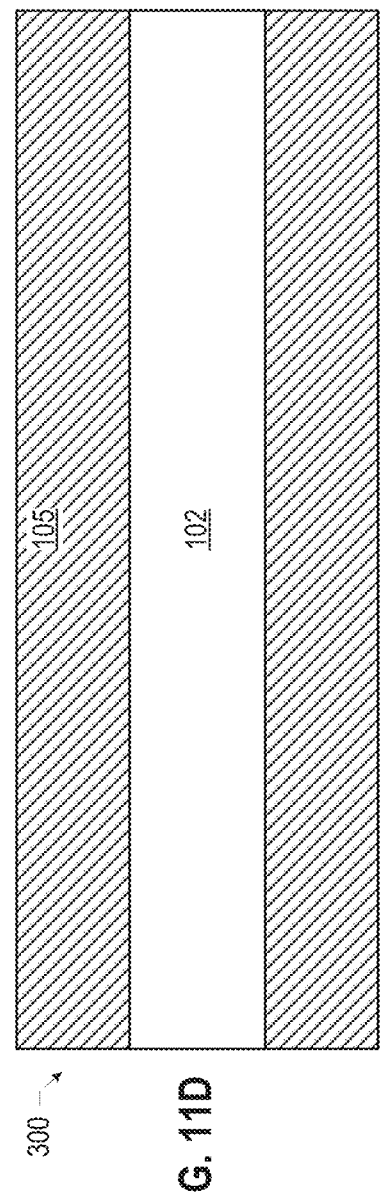

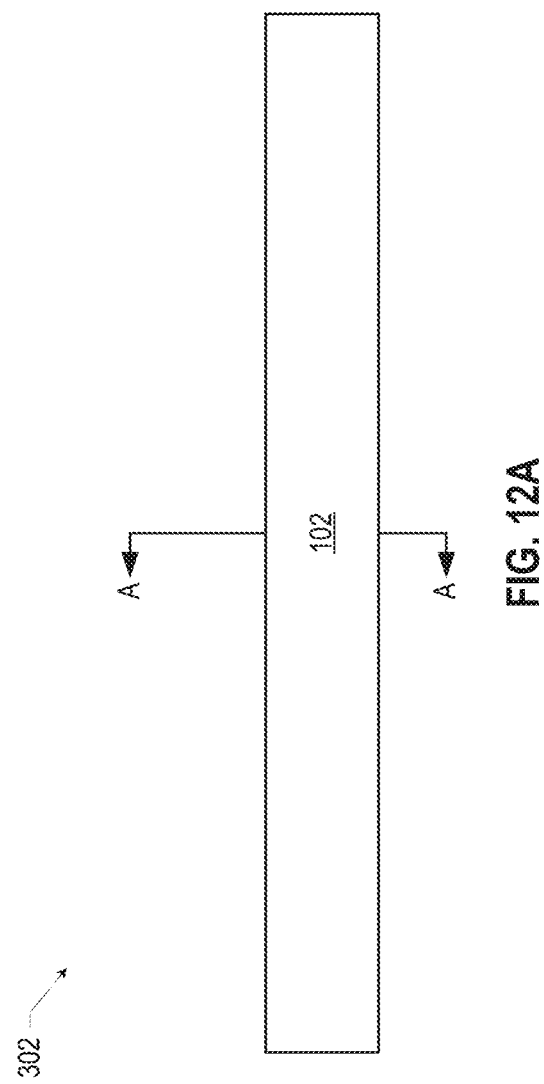

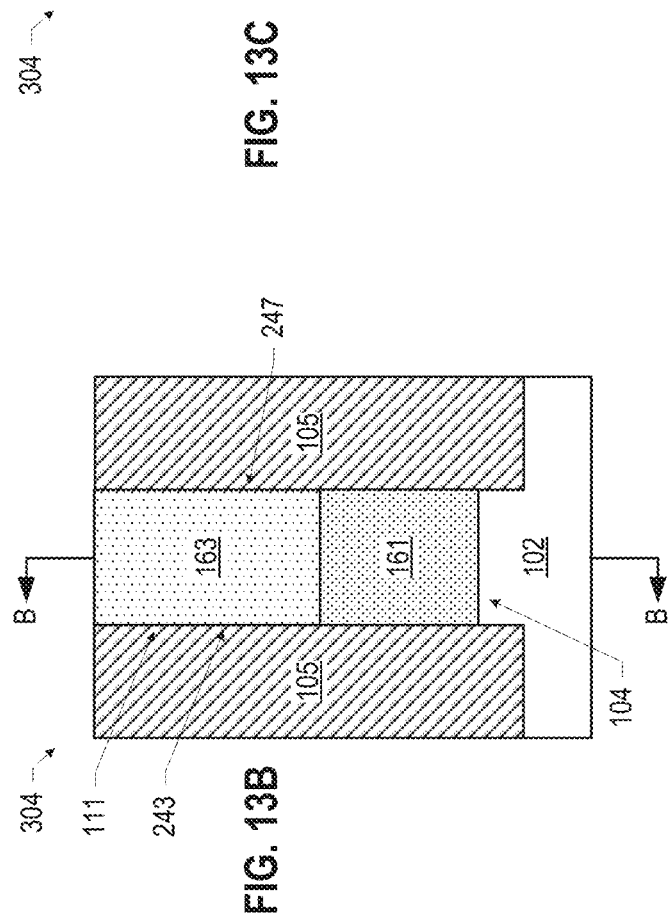
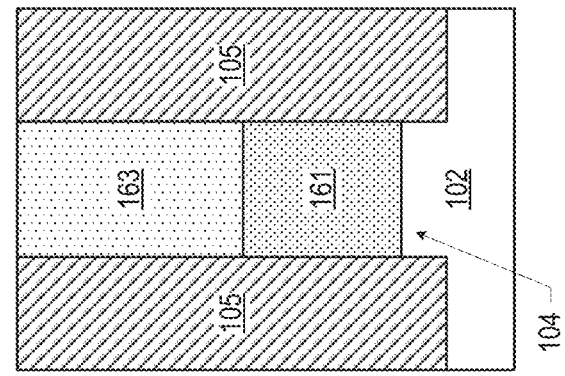
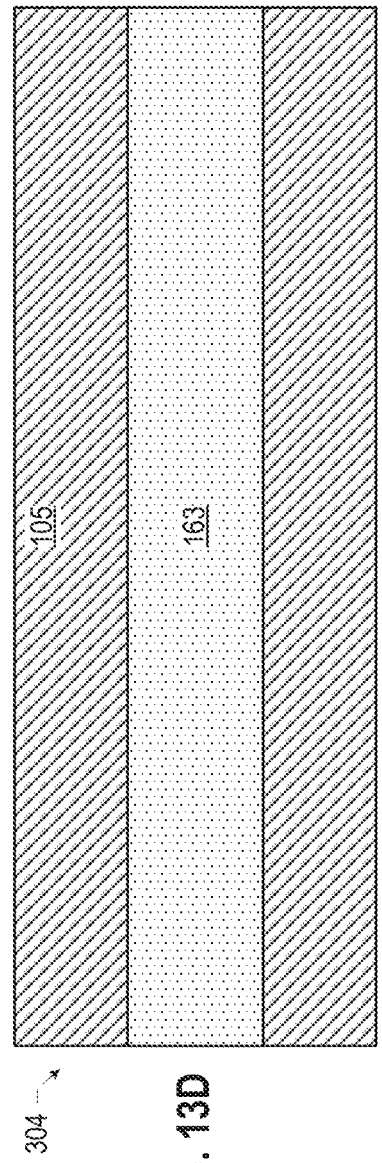
FIG. 13B
FIG. 13C
FIG. 13D

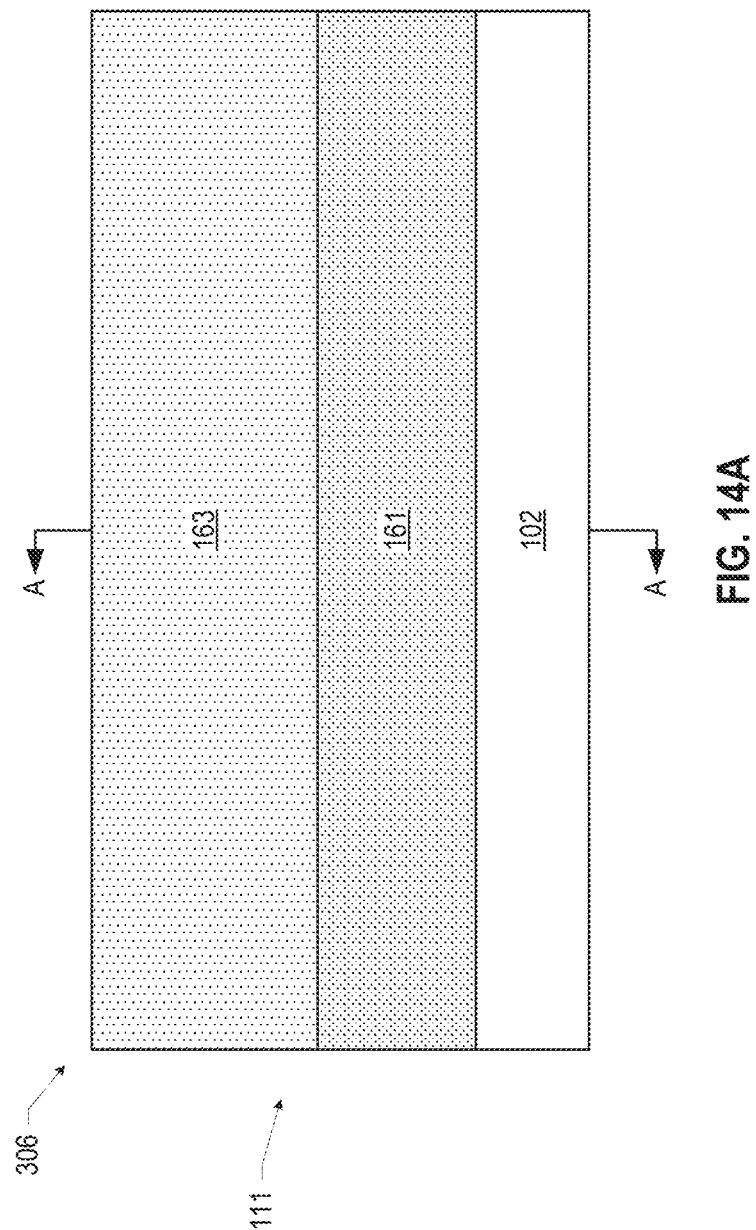

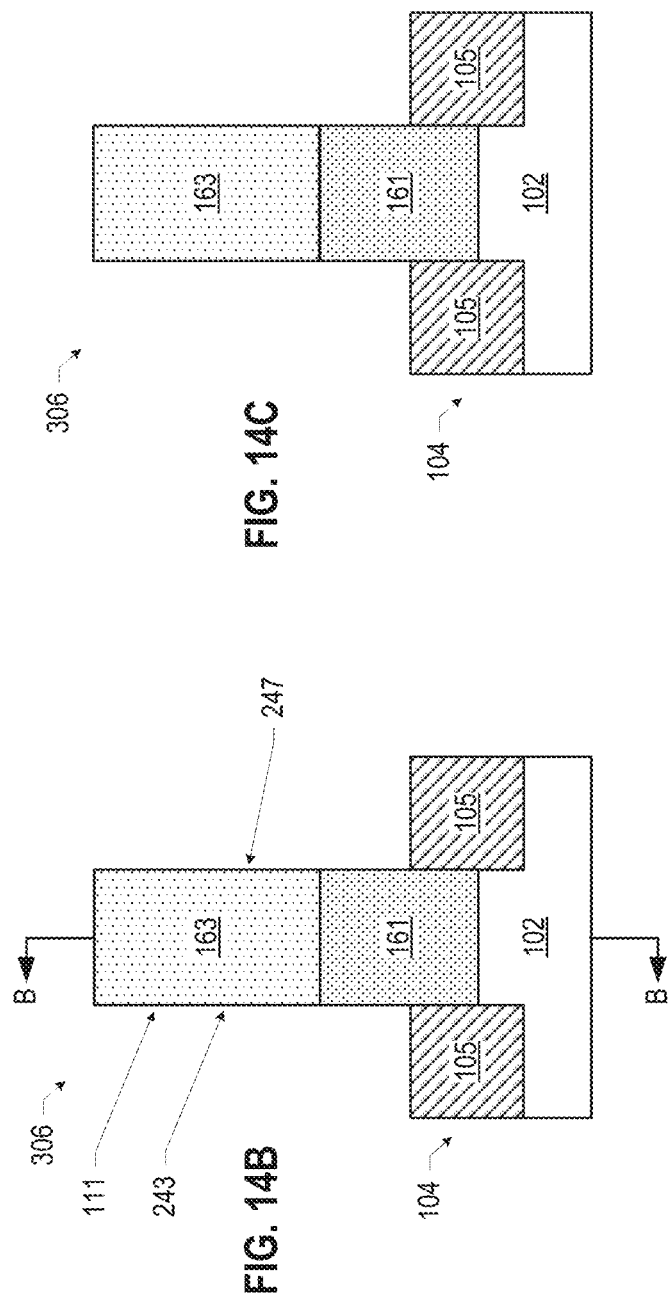
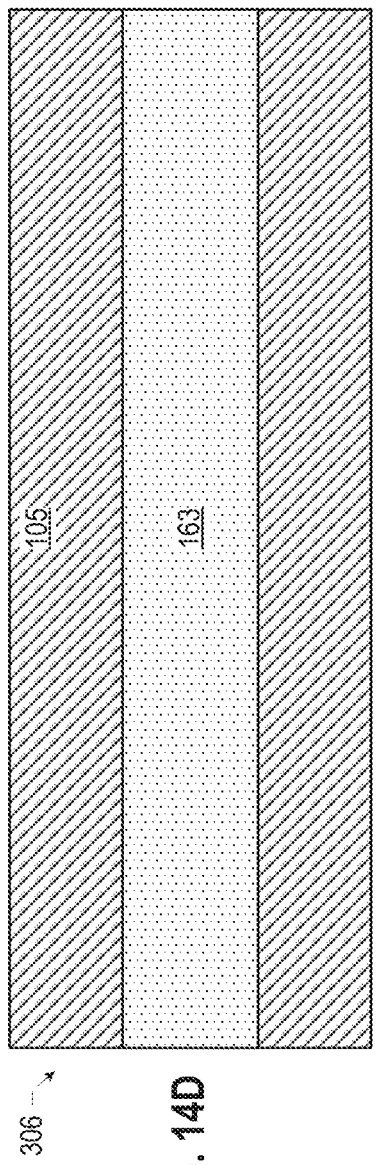
FIG. 14B
FIG. 14C
FIG. 14D

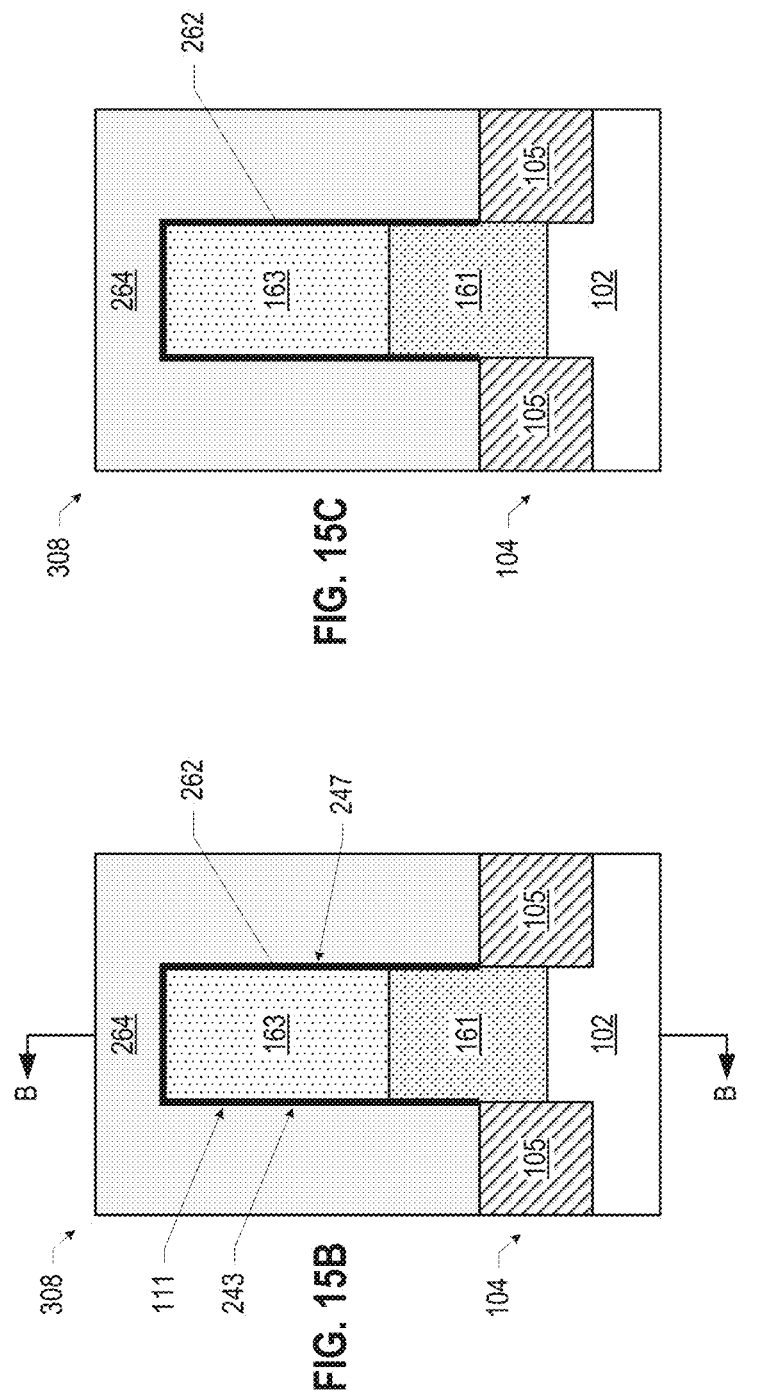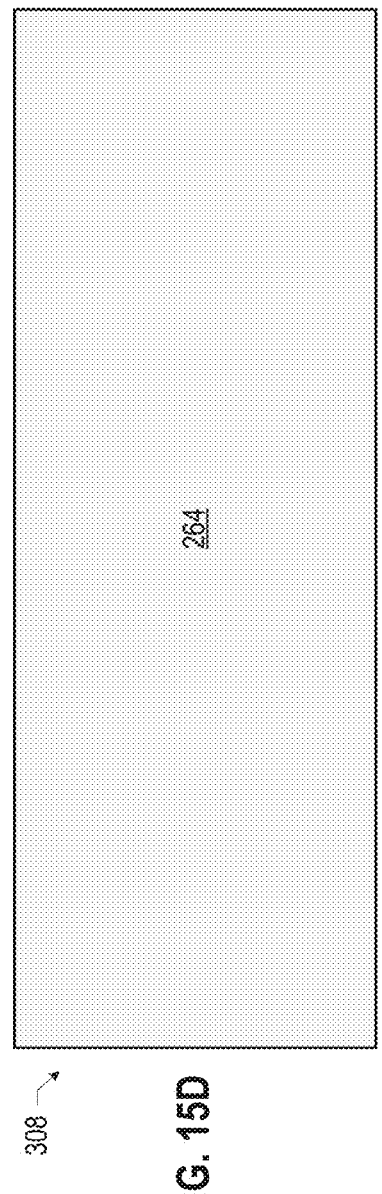

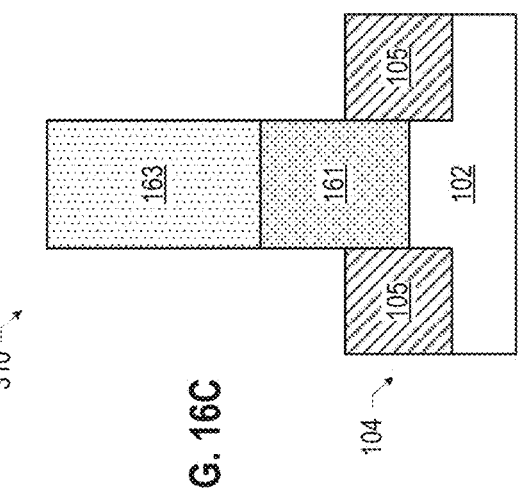
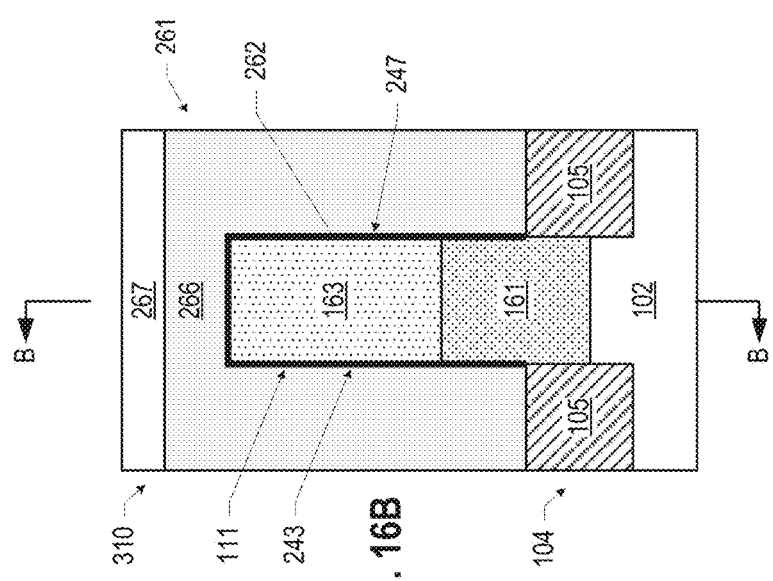
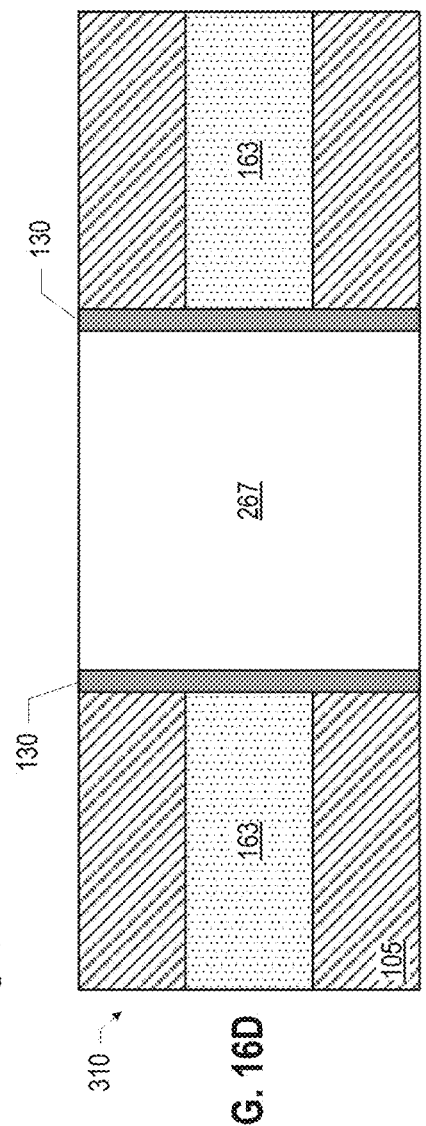

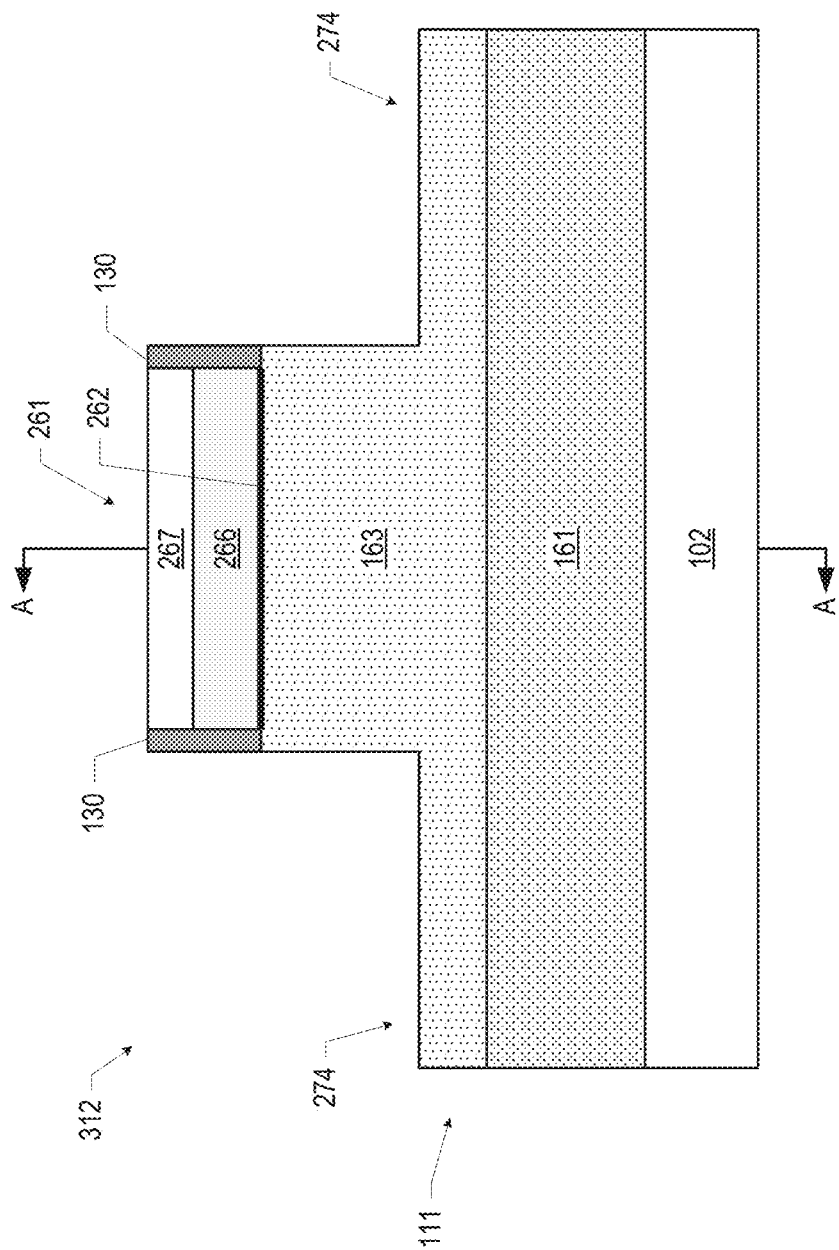

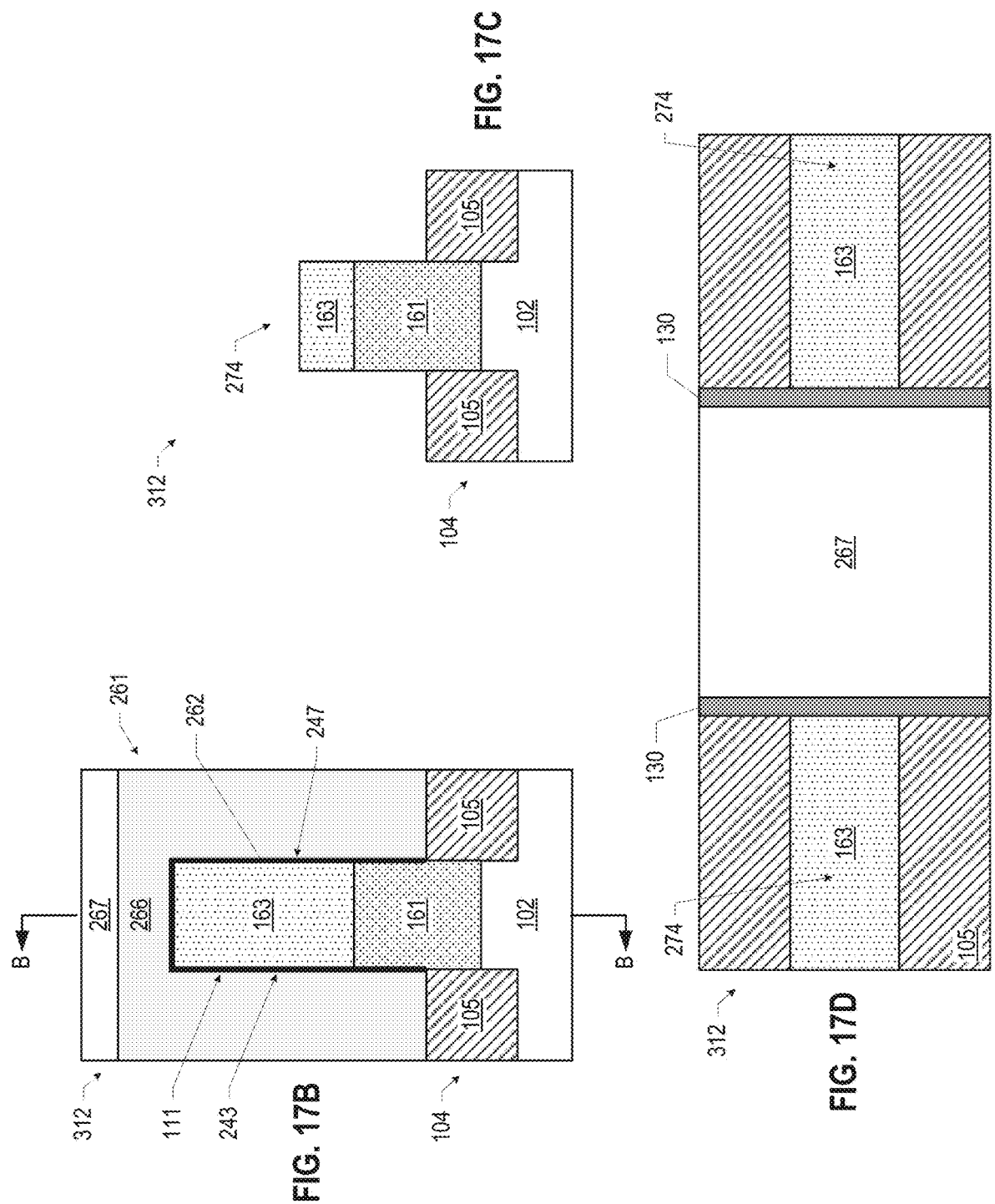

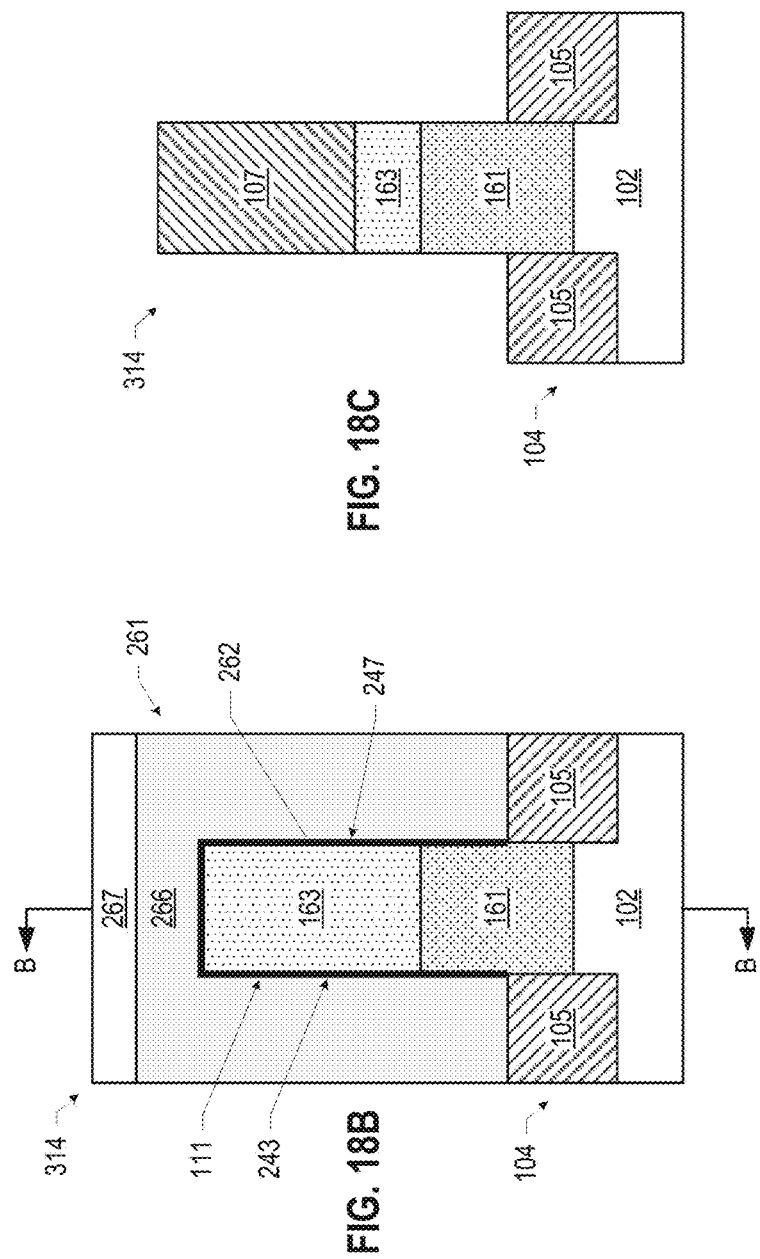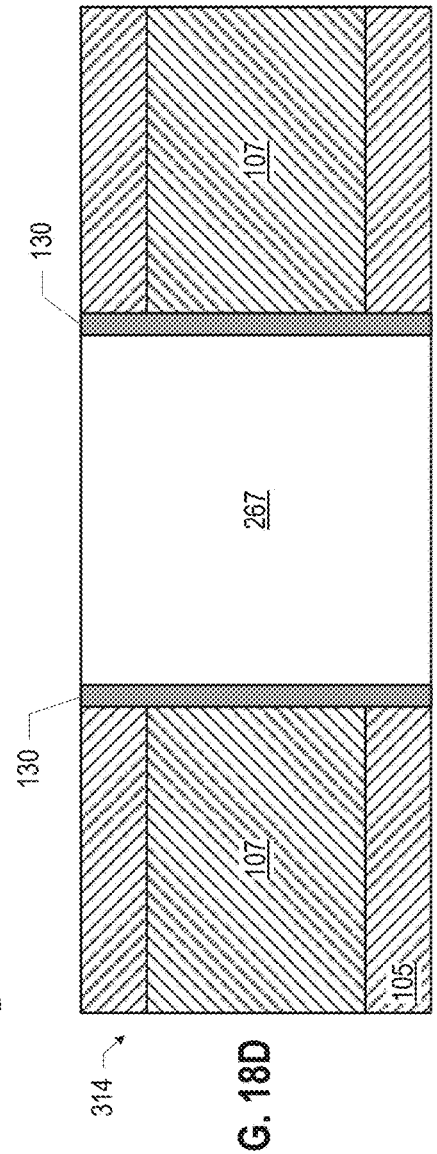

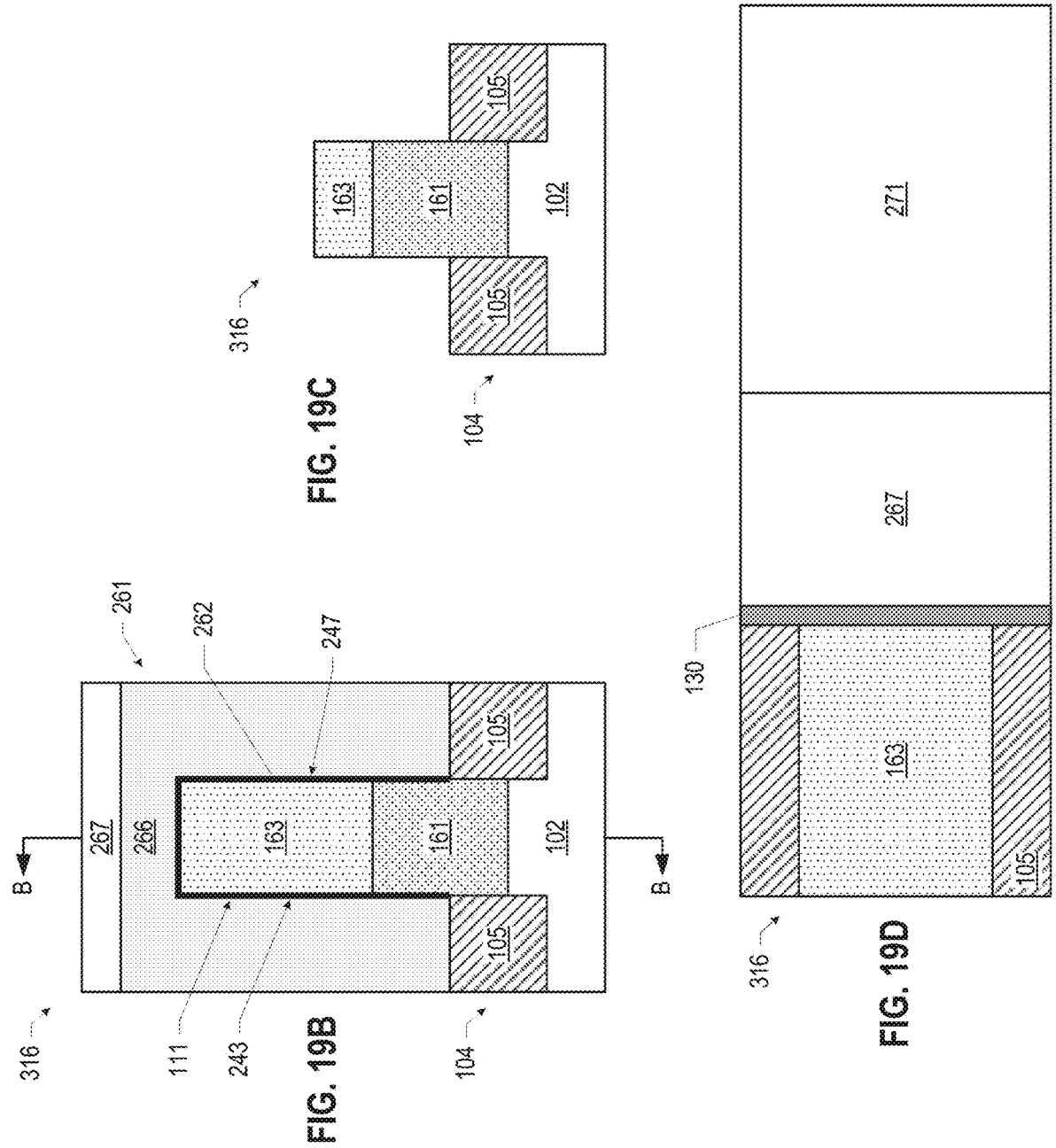

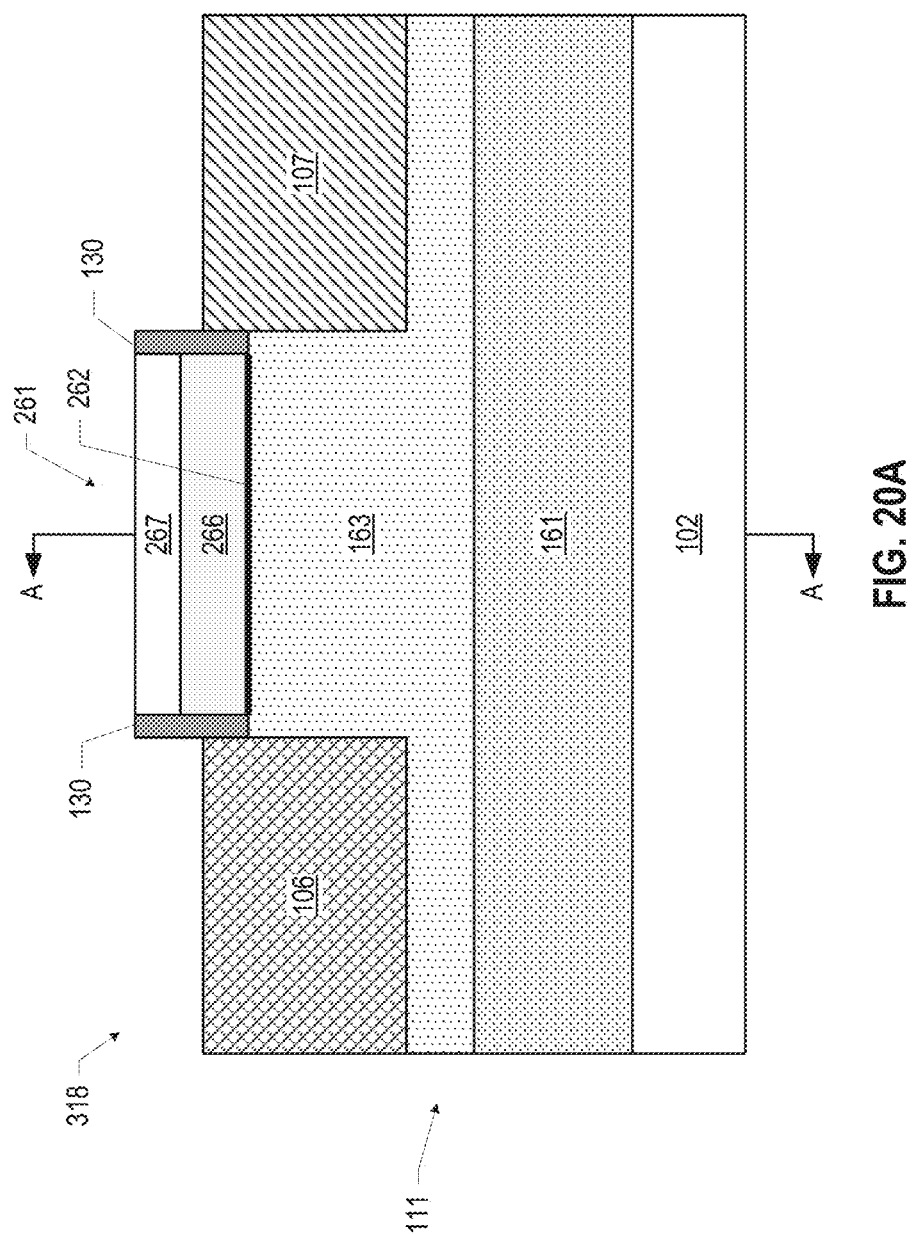

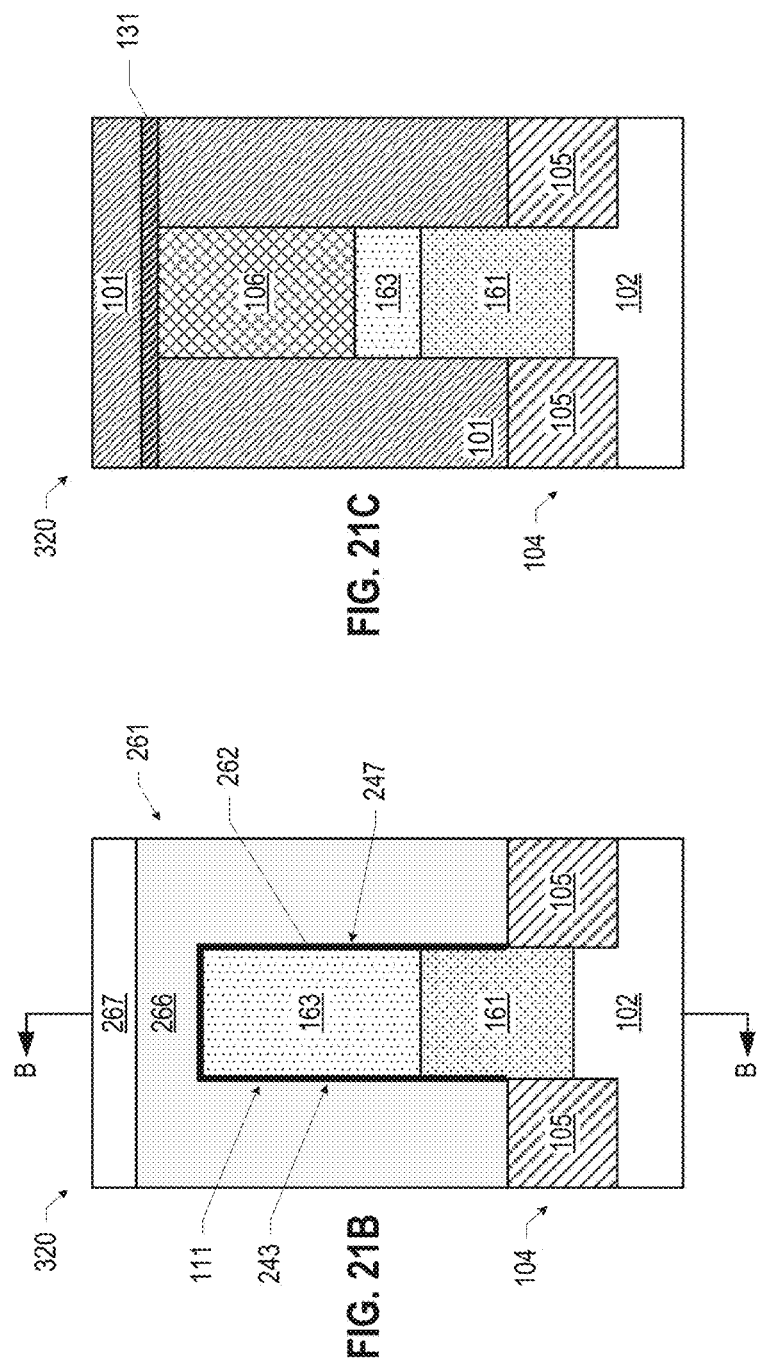
FIG. 21C
FIG. 21B
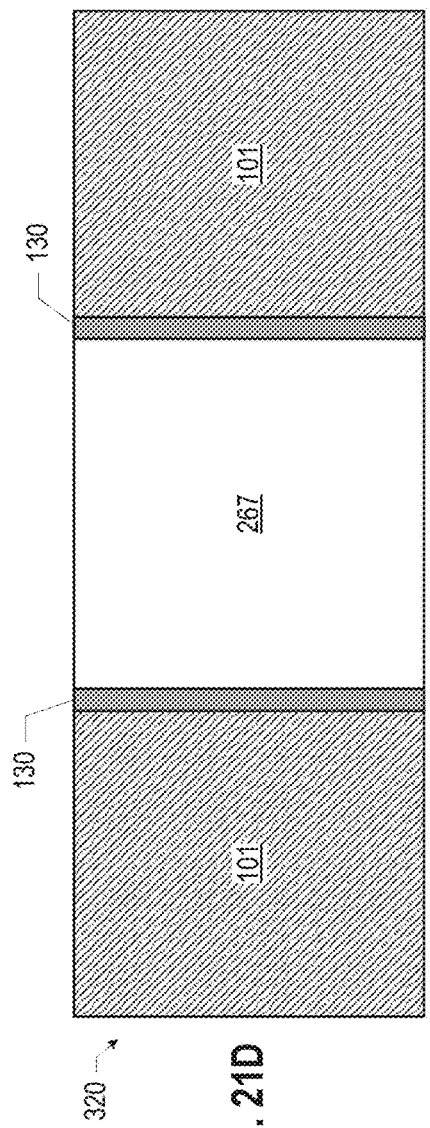
FIG. 21D

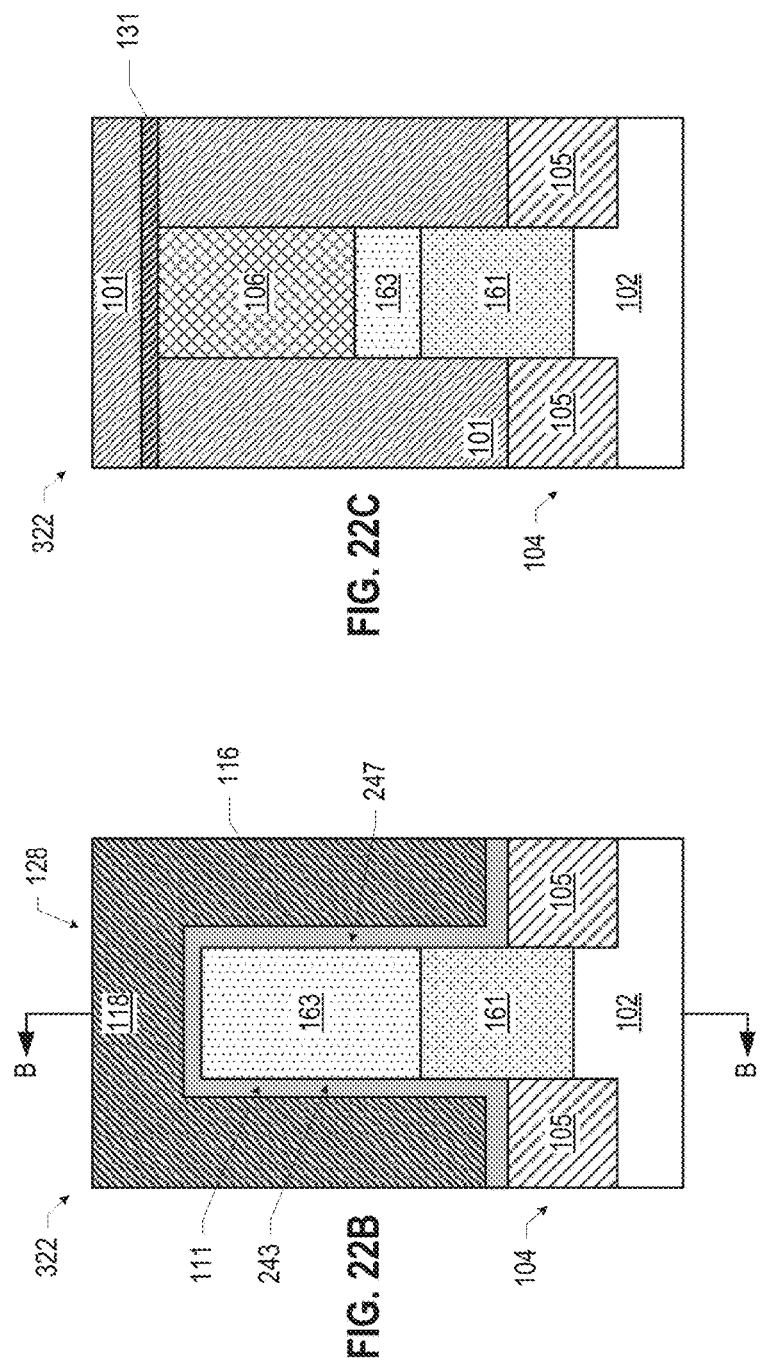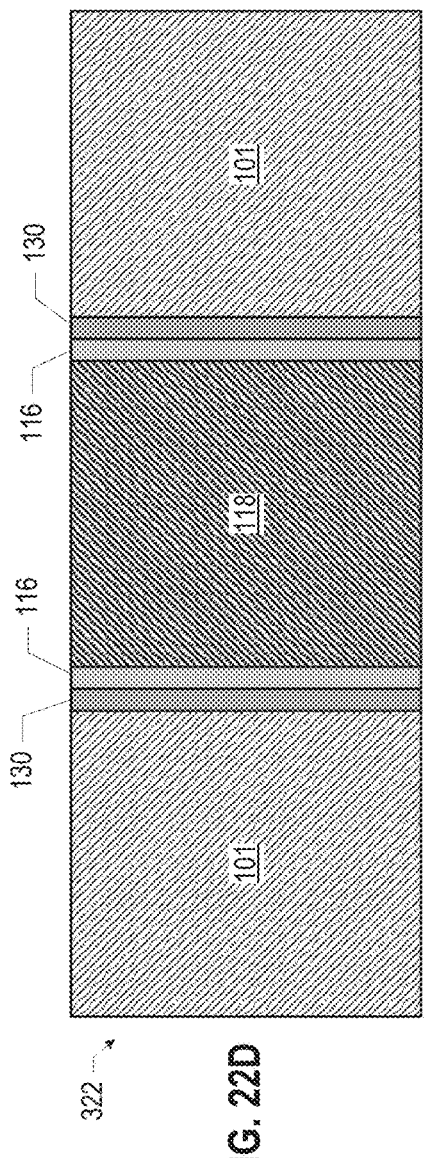

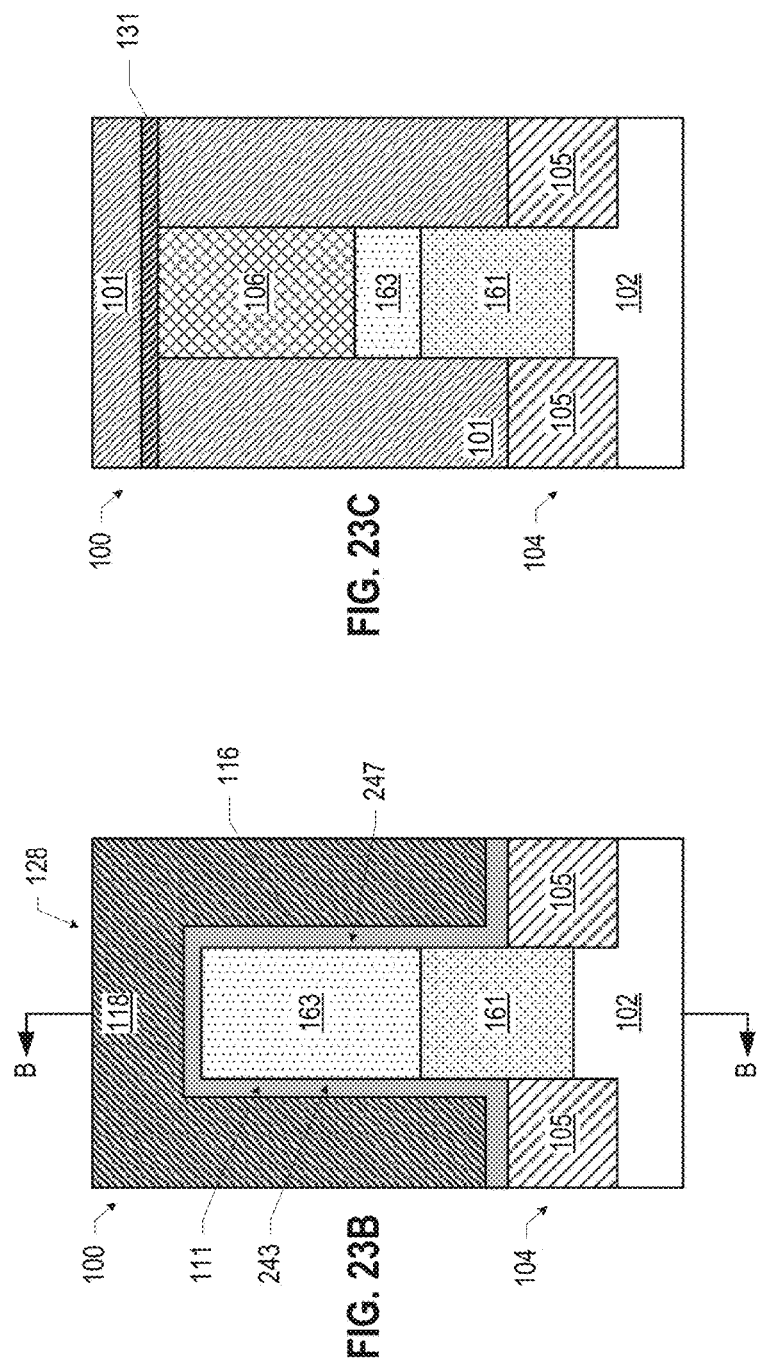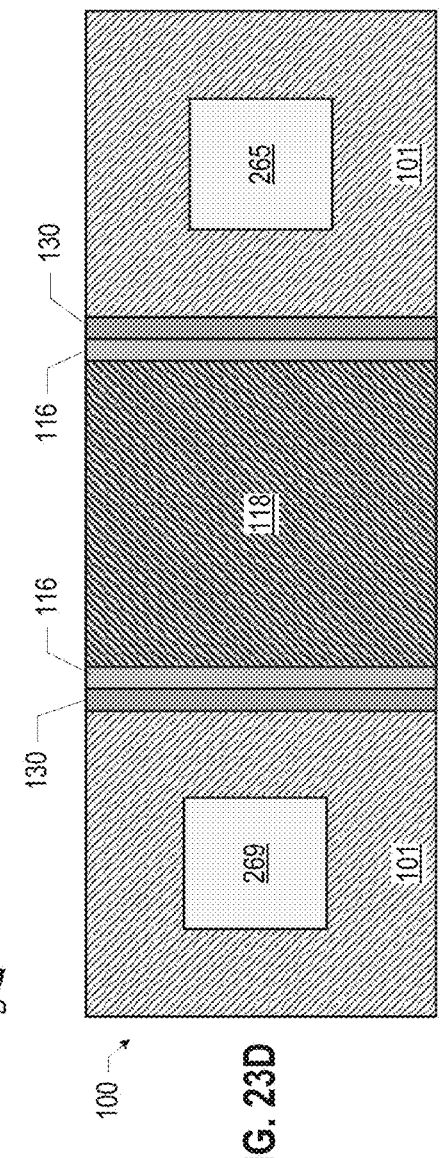

TUNNELING FIELD EFFECT TRANSISTORS

CROSS-REFERENCE TO RELATED APPLICATION

This application is a national stage application under 35 U.S.C. § 371 of PCT International Application Serial No. PCT/US2017/047523, filed on Aug. 18, 2017 and entitled "TUNNELING FIELD EFFECT TRANSISTORS," which is hereby incorporated by reference herein in its entirety.

BACKGROUND

One characteristic of a field effect transistor is its subthreshold swing, the gate voltage required to increase the drain current by a factor of ten. In conventional metal oxide semiconductor field effect transistors (MOSFETs), the subthreshold swing may be greater than or equal to approximately 60 millivolts/decade of current, limited by thermionic emission.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 1A-1E, 2A-2D, 3A-3D, 4A-4D, 5A-5D, 6A-6D, 7A-7D, 8A-8D, 9A-9D, and 10A-10E are views of various embodiments of a tunneling field effect transistor (TFET).

FIGS. 11A-11D, 12A-12D, 13A-13D, 14A-14D, 15A-15D, 16A-16D, 17A-17D, 18A-18D, 19A-19D, 20A-20D, 21A-21D, 22A-22D, and 23A-23D are various views of assemblies in different stages of the manufacture of a TFET, in accordance with various embodiments.

DETAILED DESCRIPTION

Figure 1A:
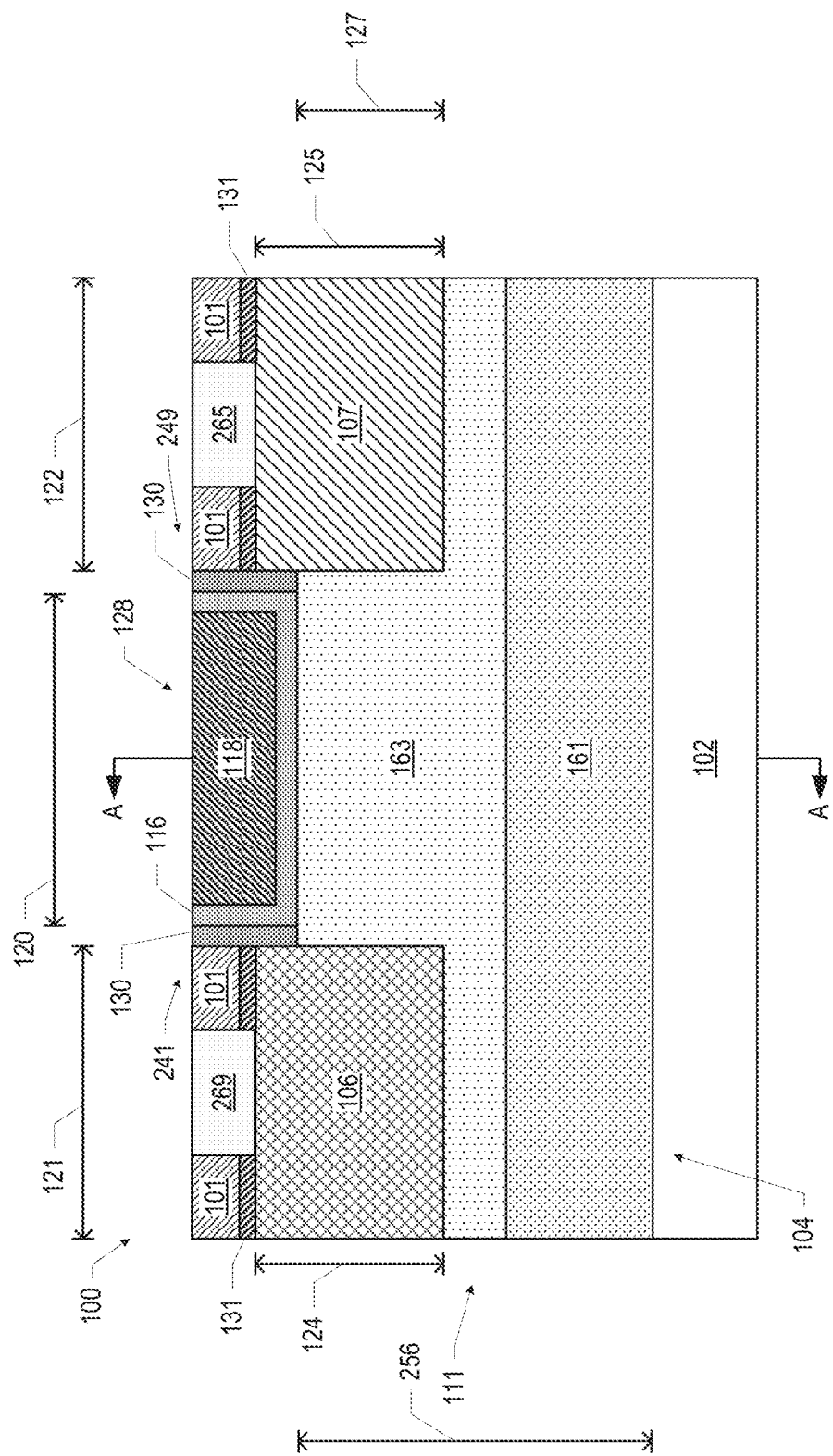

Disclosed herein are tunneling field effect transistors (TFETs) and related methods and computing devices. In some embodiments, a TFET may include: a first source/drain material having a p-type conductivity; a second source/drain material having an n-type conductivity; a channel material at least partially between the first source/drain material and the second source/drain material, wherein the channel material has a first side face and a second side face opposite the first side face; and a gate above the channel material, on the first side face and on the second side face.

As noted above, conventional metal oxide semiconductor field effect transistors (MOSFETs) may transport charge by thermionic emission, thermally inducing the flow of charges over a potential energy barrier. In such MOSFETS, the subthreshold swing may be greater than or equal to 60 millivolts/decade of current, limited by the physics of thermionic emission. The subthreshold swing is inversely proportional to the ability of the MOSFET to switch quickly between the off state (corresponding to high resistance and low current flow) and the on state (corresponding to low resistance and high current flow), and thus this lower bound on subthreshold swing for conventional MOSFETs represents a limit on the performance achievable by these MOSFETs.

The TFETs disclosed herein may not be limited by thermionic emission as conventional MOSFETs are and may be able to achieve a lower subthreshold swing and thus improved performance. In the TFETs disclosed herein, the principal current transport mechanism may be tunneling through a potential energy barrier; at a sufficient gate bias, high current may be achieved by tunneling across the junction between a p-type source and a channel in an n-type TFET (or by tunneling across the junction between an n-type source and a channel in a p-type TFET).

Because of their improved subthreshold swing relative to conventional MOSFETs, some of the TFETs disclosed herein may achieve a higher on-current at a lower supply voltage than conventional MOSFETs. Thus, some of the TFETs disclosed herein may be particularly suitable for low power devices, such as mobile computing devices (e.g., smartphones or tablets), wearable computing devices, implantable computing or medical devices, etc. For example, in some embodiments, the TFETs disclosed herein may be included in devices having a supply voltage less than 0.5 volts.

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment, Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, a "high-k dielectric material" may refer to a material having a higher dielectric constant than silicon oxide. As used herein, the term "conductively coupled" refers to electrical coupling, unless otherwise indicated.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. As used herein, a material that "includes" an element may include that element in a compound with one or more other elements; for example, a channel region that includes indium may include pure indium, indium arsenide, indium gallium arsenide, etc.

The accompanying drawings are not necessarily drawn to scale. Although many of the drawings illustrate rectilinear structures with flat walls and right-angle corners, this is simply for ease of illustration and actual devices made using these techniques will exhibit rounded corners, surface roughness, and other features. For ease of discussion, the term "FIG. 1" may be used to refer to the collection of drawings of FIGS. 1A-1E, the term "FIG. 2" may be used to refer to the collection of drawings of FIGS. 2A-2D, etc.

FIGS. 1A-1E are various views of a TFET 100, in accordance with some embodiments. FIG. 1A is a side cross-sectional view of the TFET 100 along the fin 111, FIG. 1B is a side cross-sectional view taken through the section A-A of FIG. 1A (through the gate electrode 118), FIG. 1C is a side view taken toward the first source/drain material region 106, and FIG. 1D is a top view. FIG. 1E, discussed further below, represents the same view as FIG. 13, but depicts the non-idealities that commonly arise in device manufacture. Although only a single TFET 100 is depicted in FIG. 1 (and others of the accompanying drawings), this is simply for ease of illustration, and an electronic component (e.g., any of the components discussed below with reference to FIGS. 25-29) may include any number of the TFETs 100 (e.g., in an array or any other desired arrangement) disclosed herein.

The TFET 100 may include a first source/drain material region 106, a second source/drain material 107, and a channel material 163 that is disposed at least partially between the first source/drain material region 106 and the second source/drain material 107 to provide a channel for carriers during operation of the TFET 100. The first source/drain material region 106 and the second source/drain material 107 may have opposite conductivity types; that is, the first source/drain material region 106 may include ample p-type impurities (to increase the concentration of holes) and the second source/drain material 107 may include ample n-type impurities (to increase the concentration of electrons), or the first source/drain material region 106 may include ample n-type impurities and the second source/drain material 107 may include ample p-type impurities. The channel material 163 may have a first side face 243 and a second, opposing side face 247.

A gate 128 may be disposed above the channel material 163 and may extend down onto the first side face 243 and the second side face 247. The gate 128 may include a gate dielectric 116 and a gate electrode 118. In some embodiments, spacers 130 may be present at the first side 241 of the gate 128 and the second, opposite side 249 of the gate 128.

An insulating material 101 may be disposed on and around the source/drain materials 106 and 107. The insulating material 101 may be an interlayer dielectric (ILD), such as undoped silicon oxide, doped silicon oxide (e.g., borophosphosilicate glass (BPSG) or phosphosilicate glass (PSG)), silicon nitride, silicon oxynitride, or any combination. In some embodiments, an etch stop material 131 (e.g., silicon nitride) may be disposed between the insulating material 101 and the top surfaces of the source/drain materials 106 and 107; in other embodiments, the etch stop material 131 may not be present.

A first source/drain contact 269 may be on the first source/drain material 106, and a second source/drain contact 265 may be on the second source/drain material 107. The source/drain contacts 265 and 269 may include any suitable conductive materials, such as tungsten, cobalt, or other contact metals. In some embodiments, the source/drain contacts 265 and 269 may include multiple metals; for example, the source/drain contacts 265 and 269 may include a layer of a work function metal or a barrier metal and a fill layer of another metal (e.g., tungsten or cobalt). Additional interconnect structures (not shown), such as the conductive vias and lines discussed below with reference to FIG. 26, may be in contact with the source/drain contacts 269 and 265 to route electrical signals to/from the source/drain contacts 269 and 265. Similarly, additional interconnect structures (not shown) may be in contact with the gate electrode 118 to route electrical signals to/from the gate 128.

In the embodiment of FIG. 1, the channel material 163 may be part of a fin 111 that also includes a buffer material 161. The fin 111 may be formed on a substrate 102 having a top surface 104; in particular, the buffer material 161 may be disposed on the top surface 104, and the channel material 163 may be disposed on the buffer material 161. In some embodiments in which the substrate 102 is crystalline silicon, the top surface 104 may have a <111> facet (which may improve the growth of the buffer material 161 and the channel material 163 when these are epitaxially grown on the substrate 102, as discussed below) or a <100> facet.

In some embodiments, the top surface 104 of the substrate 102, the buffer material 161, the source/drain materials 106 and 107, and the channel material 163 each have a lattice constant, and the lattice constants of some or all of these materials may be different. Differences in lattice constant between two adjacent materials may result in stress within the materials due to their lattice mismatch. For example, when a first material with a smaller lattice constant is grown on a second material with a larger lattice constant, the first material may exhibit a tensile strain and the second material may exhibit a compressive strain. If the thickness of a material is less than critical thickness, the strain can be maintained; if the thickness is greater than the critical thickness, the material may start to relax and form defects. In one embodiment, the channel material 163 and the source/drain materials 106 and 107 may be uniaxially lattice-stressed in a direction parallel to the length 120 of the gate 128 and may be lattice-relaxed in a direction perpendicular to the length 120 of the gate 128.

In some embodiments, the substrate 102 may be a distinct crystalline substrate (silicon, germanium, gallium arsenide, sapphire, etc.). In some embodiments, the substrate 102 may not be a distinct crystalline substrate but may instead be a structure that includes one or more interconnect layers; such embodiments of the substrate 102 may be appropriate when the TFET 100 will be a back-end device or will be included in a package substrate or other assembly.

The buffer material 161 may include one or more epitaxial single crystalline semiconductor layers grown atop the substrate 102. In one such embodiment, the buffer material 161 may include a material (or materials) having a lattice constant different from the substrate 102. The buffer material 161 may serve to grade the lattice constant from the substrate 102 to the channel material 163. In some embodiments, the buffer material 161 may include a group III-V material. In some embodiments, the buffer material 161 may include gallium (e.g., included in a binary or ternary compound), arsenic (e.g., included in a binary or ternary compound), antimony (e.g., included in a binary or ternary compound), indium, phosphorus, aluminum, aluminum arsenide, aluminum antimonide, gallium arsenide, gallium antimonide, indium phosphide, indium gallium arsenide, aluminum gallium arsenide, indium aluminum arsenide, aluminum arsenic antimonide, aluminum gallium antimonide, indium gallium antimonide, or gallium arsenic antimonide. In some embodiments, the buffer material 161 may include germanium, silicon, or silicon germanium.

The channel material 163 may include any suitable material for providing a TFET channel. In some embodiments, the channel material may include gallium, indium, arsenic, indium gallium arsenide, or indium arsenide. In some embodiments, the channel material 163 may include silicon or germanium.

The source/drain materials 106 and 107 may include any suitable material. For example, the source/drain materials 106 and 107 may include gallium, antimony, indium, arsenic, nitrogen, phosphorus, gallium antimonide, indium gallium arsenide, indium arsenide, phosphorus, gallium arsenide, indium antimonide, gallium phosphide, indium aluminum arsenide, gallium antimony phosphide, gallium arsenic antimonide, gallium nitride, or indium phosphide. In some embodiments, the source/drain materials 106 and 107 may include silicon, germanium, silicon germanium, or germanium tin.

In some embodiments, the first source/drain material 106 may include indium, gallium, and arsenic (e.g., in the form of indium gallium arsenide) and may include a p-type impurity so as to have a p-type conductivity; the second source/drain material 107 may include indium, gallium, and arsenic (e.g., in the form of indium gallium arsenide) and may include an n-type impurity so as to have an n-type conductivity; and the channel material 163 may include indium, gallium, and arsenic (e.g., in the form of indium gallium arsenide). In some such embodiments, the buffer material 161 may include a group III-V material, such as gallium arsenide, and the substrate 102 may be a crystalline silicon substrate.

In some embodiments, the first source/drain material 106 may include gallium and antimony (e.g., in the form of gallium antimonide) and may include a p-type impurity so as to have a p-type conductivity; the second source/drain material 107 may include iridium and arsenic (e.g., in the form of indium arsenide) and may include an n-type impurity so as to have an n-type conductivity; and the channel material 163 may include indium and arsenic (e.g., in the form of indium arsenide). In some such embodiments, the buffer material 161 may include a group III-V material, such as gallium arsenide, and the substrate 102 may be a crystalline silicon substrate.

In some embodiments, the first source/drain material 106 may include gallium and antimony (e.g., in the form of gallium antimonide) and may include a p-type impurity so as to have a p-type conductivity; the second source/drain material 107 may include iridium and arsenic (e.g., in the form of indium arsenide) and may include an n-type impurity so as to have an n-type conductivity; and the channel material 163 may include indium, gallium, and arsenic (e.g., in the form of indium gallium arsenide). In some such embodiments, the buffer material 161 may include a group III-V material, such as gallium arsenic antimonide, and the substrate 102 may be a crystalline silicon substrate.

In some embodiments, the first source/drain material 106 may include indium and arsenic (e.g., in the form of indium arsenide) and may include a p-type impurity so as to have a p-type conductivity; the second source/drain material 107 may include indium and phosphorus (e.g., in the form of indium phosphide) and may include an n-type impurity so as to have an n-type conductivity; and the channel material 163 may include indium, gallium, and arsenic (e.g., in the form of indium gallium arsenide). In some such embodiments, the buffer material 161 may include a group III-V material, such as gallium arsenide, and the substrate 102 may be a crystalline silicon substrate.

In some embodiments, the first source/drain material 106, the second source/drain material 107, and the channel material 163 may all include a same group III-V material (e.g., indium gallium arsenide). In some such embodiments, the substrate 102 may be a crystalline silicon substrate.

In some embodiments, the first source/drain material 106, the second source/drain material 107, and the channel material 163 may all include silicon. In some such embodiments, the substrate 102 may be a crystalline silicon substrate.

In some embodiments, the first source/drain material 106, the second source/drain material 107, and the channel material 163 may all include germanium. In some such embodiments, the substrate 102 may be a crystalline silicon substrate.

As noted above, the source/drain materials 106 and 107 may have an n-type conductivity or a p-type conductivity, and the conductivity types of the first source/drain material 106 may be opposite to the conductivity type of the second source/drain material 107. When a source/drain material includes silicon or germanium, p-type impurities may include boron, aluminum, gallium, or indium, and n-type impurities may include phosphorous, arsenic, or antimony. When a source/drain material includes a group III-V material, p-type impurities may include beryllium, zinc, magnesium, cadmium or carbon, and n-type impurities may include silicon, germanium, tin, tellurium, sulfur, or selenium. In some embodiments, the source/drain materials 106 and 107 may have a doping concentration between $1\times10^{18}$ atoms/cm$^3$ to $1\times10^{21}$ atoms/cm$^3$. The source/drain materials 106 and 107 may have a uniform doping concentration or may include sub-regions of different concentrations or dopant profiles. As discussed in further detail below, in some embodiments, the source/drain materials 106 and 107 may be formed by removing portions of the fin 111 and then epitaxially growing the source/drain materials 106 and 107. In other embodiments, the source/drain materials 106 and 107 may be formed by doping portions of the fin 111.

A shallow trench isolation (STI) layer 105 may be present at the base of the fin 111, on the substrate 102. The STI layer 105 may serve to reduce current leakage between TFETs 100 formed adjacent to one another. The STI layer 105 may include any appropriate dielectric material, such as silicon oxide, silicon nitride, silicon oxynitride, a low-k dielectric, and any combination thereof. In some embodiments, the top surface 104 of the substrate 102 may be recessed beneath the top surface of the STI layer 105.

The gate dielectric 116 may include any suitable gate dielectric, such as, but not limited to, silicon dioxide, silicon oxynitride, and silicon nitride. In some embodiments, the gate dielectric 116 may include a high-k gate dielectric layer, such as a metal oxide dielectric (e.g., tantalum oxide, titanium oxide, hafnium oxide, hafnium silicon oxide, zirconium oxide, etc.). The gate dielectric 116 may also include other types of high-k dielectric layers, such as, but not limited to, lead zirconate titanate (PZT) or barium strontium titanate (BST). The gate dielectric 116 may include any combination of the above dielectric materials; in some embodiments, the gate dielectric 116 may include multiple different layers of dielectric materials.

The gate electrode 118 may at least partially surround a portion of the channel material 163, and the gate dielectric 116 may be disposed between the gate electrode 118 and the channel material 163. The gate electrode 118 may be formed of any suitable conductive material. For example, in some embodiments, the gate electrode 118 may include a superconducting material. In some embodiments, the gate electrode 118 may include a metal such as, but not limited to, titanium, titanium nitride, tantalum, tantalum nitride, tungsten, ruthenium, titanium aluminum, or any combination thereof. In some embodiments, the gate electrode 118 may include multiple metal layers. For example, the gate electrode 118 may include a barrier metal layer proximate to the gate dielectric 116 (e.g., a thin layer of titanium nitride or tantalum nitride), and a bulk metal layer arranged (e.g., nickel or tungsten) so that the barrier metal layer is between the bulk metal layer and the gate dielectric 116.

The dimensions of the elements in a TFET 100 may take any suitable values. In some embodiments, the length 120 of the gate electrode 118 may be between 10 nanometers and 100 nanometers (e.g., between 20 nanometers and 40 nanometers, or equal to 30 nanometers). In some embodiments, the thickness of the spacers 130 (i.e., in the direction of the length 120) may be between 1 nanometer and 10 nanometers (e.g., between 3 nanometers and 5 nanometers, between 4 nanometers and 6 nanometers, or between 4 nanometers and 7 nanometers). In some embodiments, the gate dielectric 116 may have a thickness between 10 angstroms and 60 angstroms. In a specific embodiment, the gate dielectric 116 includes hafnium oxide and has a thickness between 1 nanometer and 6 nanometers. In some embodiments, the fin 111 may have a fin width 258 less than 30 nanometers (e.g., less than 25 nanometers, or less than 10 nanometers) In some embodiments, the fin height 256 may be between 3 nanometers and 75 nanometers.

In some embodiments, the length 121 of the first source/drain material 106 may be between 25 nanometers and 500 nanometers. In some embodiments, the length 122 of the second source/drain material 107 may take any of the values discussed above for the length 121; the length 122 may be the same as, or different from, the length 121. In some embodiments, the height 124 of the first source/drain material 106 may be between 10 nanometers and 150 nanometers. In some embodiments, the height 125 of the second source/drain material 107 may take any of the values discussed above for the height 124; the height 124 may be the same as, or different from, the height 125. In the embodiment of FIG. 1, the height 127 of the portion of the channel material 163 between the first source/drain material 106 and the second source/drain material 107 may be between 3 nanometers and 75 nanometers.

As noted above, although many of the drawings illustrate rectilinear structures with flat walls and right-angle corners, this is simply for ease of illustration and actual devices made using these techniques will exhibit rounded corners, surface roughness, and other features. For example, FIG. 1E is a cross-sectional view of the TFET 100, sharing the same perspective of FIG. 1B. As illustrated in FIG. 1E, in some embodiments, the fin 111 may have a tapered shape that is wider closer to the substrate 102 and narrower closer to the gate 128. The first side face 243 of the channel material 163, the top face of the channel material 163, and the second side face 247 of the channel material 163 may not be delineated by sharp corners but may instead refer to different portions of the surface of the channel material 163. In FIG. 1E, the gate dielectric 116 may have more uniform thickness closer to the top surface of the fin 111 but may be thicker closer to the base of the fin 111 (e.g., closer to the substrate 102).

Figure 2A:
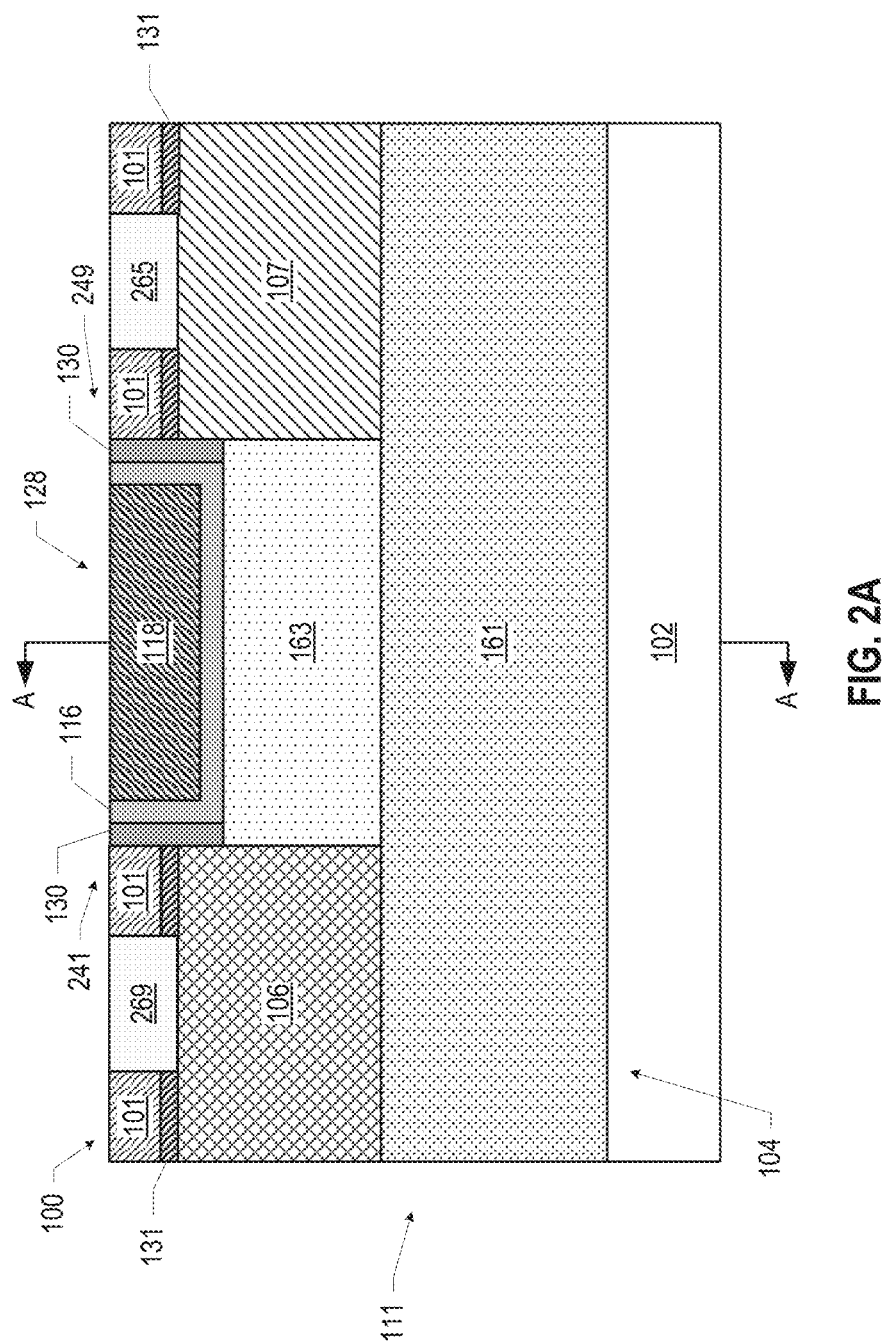
Figure 2C:
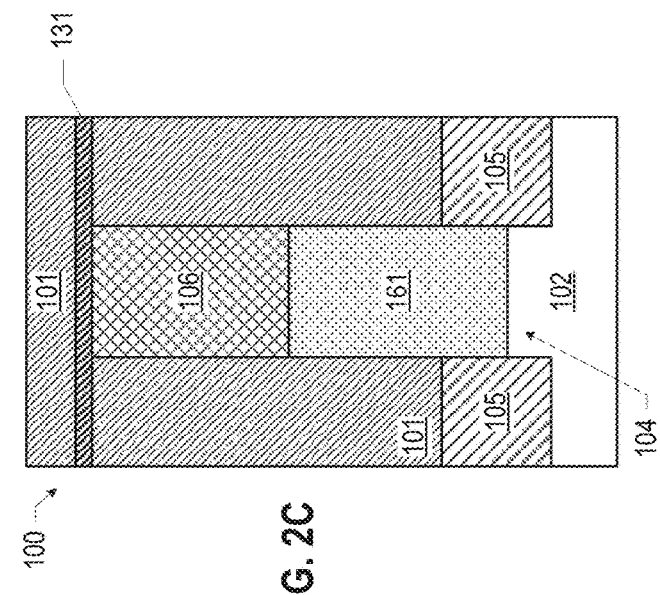
Figure 2B:
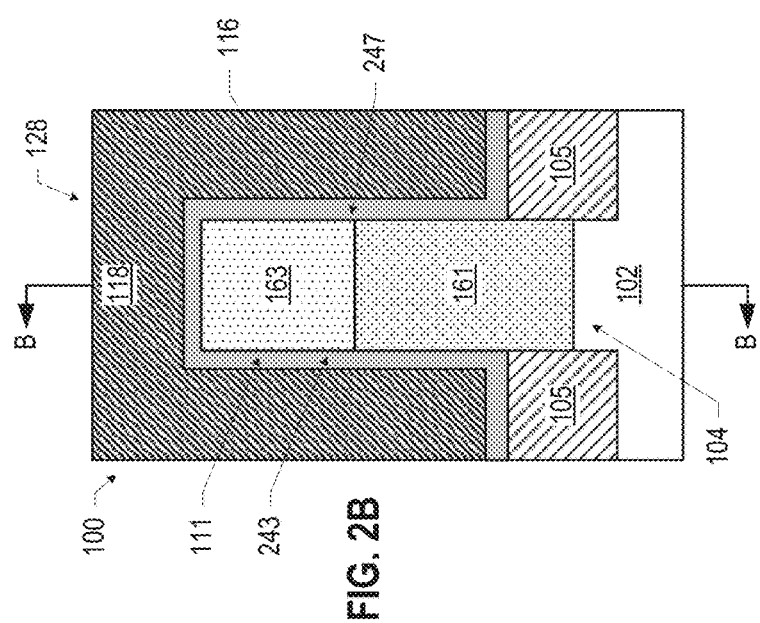
Figure 2D:
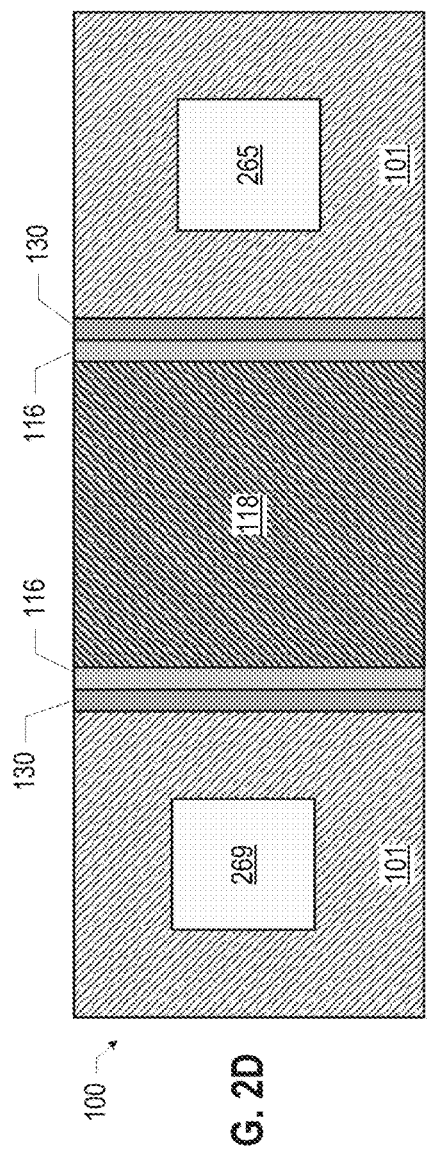

FIGS. 2A-2O are various views of another example of a TFET 100, in accordance with some embodiments. FIG. 2A is a side cross-sectional view of the TFET 100 along the fin 111, FIG. 2B is a side cross-sectional view taken through the section A-A of FIG. 2A (through the gate electrode 118), FIG. 2C is a side view taken toward the first source/drain material region 106, and FIG. 2D is a top view. The TFET 100 of FIG. 2 (and any other suitable TFETs 100 disclosed herein) may be referred to as a heterojunction TFET when the channel material 163 and the source material (the first source/drain material 106 or the second source/drain material 107, as appropriate) have different material compositions, and thus have a band offset. In a heterojunction TFET, the drain material (the first source/drain material 106 or the second source/drain material 107, as appropriate) may or may not have the same material composition as the channel material 163. Leakage may be reduced when the drain material has a larger band gap than the channel material 163.

Like the TFET 100 of FIG. 1, the TFET 100 of FIG. 2 may include a first source/drain material region 106, a second source/drain material 107, and a channel material 163 that is disposed at least partially between the first source/drain material region 106 and the second source/drain material 107 to provide a channel for carriers during operation of the TFET 100. The first source/drain material region 106 and the second source/drain material 107 may have opposite conductivity types. The channel material 163 may have a first side face 243 and a second, opposing side face 247. A gate 128 may be disposed above the channel material 163 and may extend down onto the first side face 243 and the second side face 247, FIG. 2 depicts a number of additional elements in the TFET 100; these elements may take any of the forms discussed above, in any appropriate combination, and discussion of these elements is not repeated here for ease of illustration.

In the IFET 100 of FIG. 2, the first source/drain material 106 and the second source/drain material 107 may extend down to and be in contact with the buffer material 161, in contrast to the TFET 100 of FIG. 1 in which additional portions of the channel material 163 are disposed between the buffer material 161 and the source/drain materials 106 and 107. As noted above with reference to FIG. 1, although the source/drain materials 106 and 107 are shown in FIG. 2 as having equal heights 124 and 125, this need not be the case; the heights 124 and 125 may be different, and one or both of the source/drain materials 106 and 107 may extend into recesses in the buffer material 161.

The TFET 100 of FIG. 2 may include any of the materials, material combinations, and dimensions discussed above with reference to FIG. 1. For example, in some embodiments of the TFET 100 of FIG. 2, the first source/drain material 106 may include gallium and antimony (e.g., in the form of gallium antimonide) and may include a p-type impurity so as to have a p-type conductivity; the second source/drain material 107 may include indium and arsenic (e.g., in the form of indium arsenide) and may include an n-type impurity so as to have an n-type conductivity; and the channel material 163 may include indium and arsenic (e.g., in the form of indium arsenide). This embodiment of the TFET 100 may be an n-type TFET 100. In some such embodiments, the buffer material 161 may include a group III-V material, such as gallium arsenide, and the substrate 102 may be a crystalline silicon substrate.

In another example of the TFET 100 of FIG. 2, the first source/drain material 106 may include gallium and antimony (e.g., in the form of gallium antimonide) and may include a p-type impurity so as to have a p-type conductivity; the second source/drain material 107 may include indium and arsenic (e.g., in the form of indium arsenide) and may include an n-type impurity so as to have an n-type conductivity; and the channel material 163 may include indium, gallium, and arsenic (e.g., in the form of indium gallium arsenide). This embodiment of the TFET 100 may be an n-type TFET 100. In some such embodiments, the buffer material 161 may include a group III-V material, such as gallium arsenic antimonide, and the substrate 102 may be a crystalline silicon substrate.

In another example of the TFET 100 of FIG. 2, the first source/drain material 106 may include indium and arsenic (e.g., in the form of indium arsenide) and may include a p-type impurity so as to have a p-type conductivity; the second source/drain material 107 may include indium and phosphorus (e.g., in the form of indium phosphide) and may include an n-type impurity so as to have an n-type conductivity; and the channel material 163 may include indium, gallium, and arsenic (e.g., in the form of indium gallium arsenide). This embodiment of the TFET 100 may be an n-type TFET 100. In some such embodiments, the buffer material 161 may include a group III-V material, such as gallium arsenide, and the substrate 102 may be a crystalline silicon substrate.

Figure 3A:
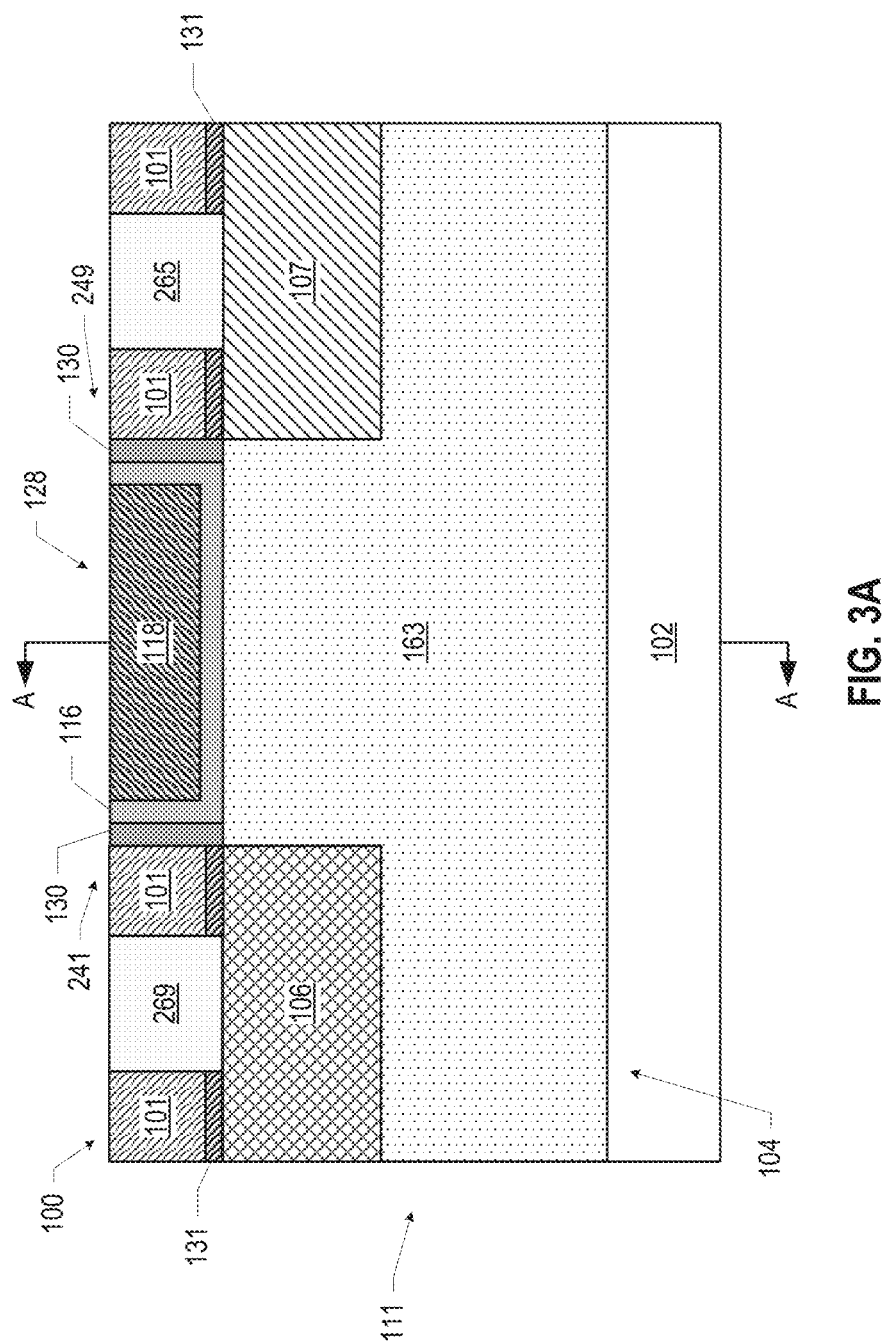

FIGS. 3A-3D are various views of another example of a TFET 100, in accordance with some embodiments. FIG. 3A is a side cross-sectional view of the TFET 100 along the fin 111, FIG. 3B is a side cross-sectional view taken through the section A-A of PG. 3A (through the gate electrode 118), FIG. 3C is a side view taken toward the First source/drain material region 106, and FIG. 3D is a top view.

Like the TFETs 100 of FIGS. 1 and 2, the TFET 100 of FIG. 3 may include a first source/drain material region 106, a second source/drain material 107, and a channel material 163 that is disposed at least partially between the first source/drain material region 106 and the second source/drain material 107 to provide a channel for carriers during operation of the TFET 100. The first source/drain material region 106 and the second source/drain material 107 may have opposite conductivity types. The channel material 163 may have a first side face 243 and a second, opposing side face 247. A gate 128 may be disposed above the channel material 163 and may extend down onto the first side face 243 and the second side face 247. FIG. 3 depicts a number of additional elements in the TFET 100; these elements may take any of the forms discussed above, in any appropriate combination, and discussion of these elements is not repeated here for ease of illustration.

The TFET 100 of FIG. 3 may not include a buffer material 161 between the first source/drain material 106 and the second source/drain material 107 (unlike the embodiments of FIGS. 1 and 2); instead, the channel material 163 may be disposed on the substrate 102, and the source/drain materials 106 and 107 may be disposed on some of the channel material 163.

The TFET 100 of FIG. 3 may include any of the materials, material combinations, and dimensions discussed above with reference to FIG. 1. For example, in some embodiments of the TFET 100 of FIG. 3, the first source/drain material 106, the second source/drain material 107, and the channel material 163 may all include a same group III-V material (e.g., indium gallium arsenide). This embodiment of the TFET 100 may be an n-type TFET 100. In some such embodiments, the substrate 102 may be a crystalline silicon substrate.

In other embodiments of the TFET 100 of FIG. 3, the first source/drain material 106, the second source/drain material 107, and the channel material 163 may all include silicon. In some such embodiments, the substrate 102 may be a crystalline silicon substrate.

In other embodiments of the TFET 100 of FIG. 3, the first source/drain material 106, the second source/drain material 107, and the channel material 163 may all include germanium. In some such embodiments, the substrate 102 may be a crystalline silicon substrate.

Figure 4A:
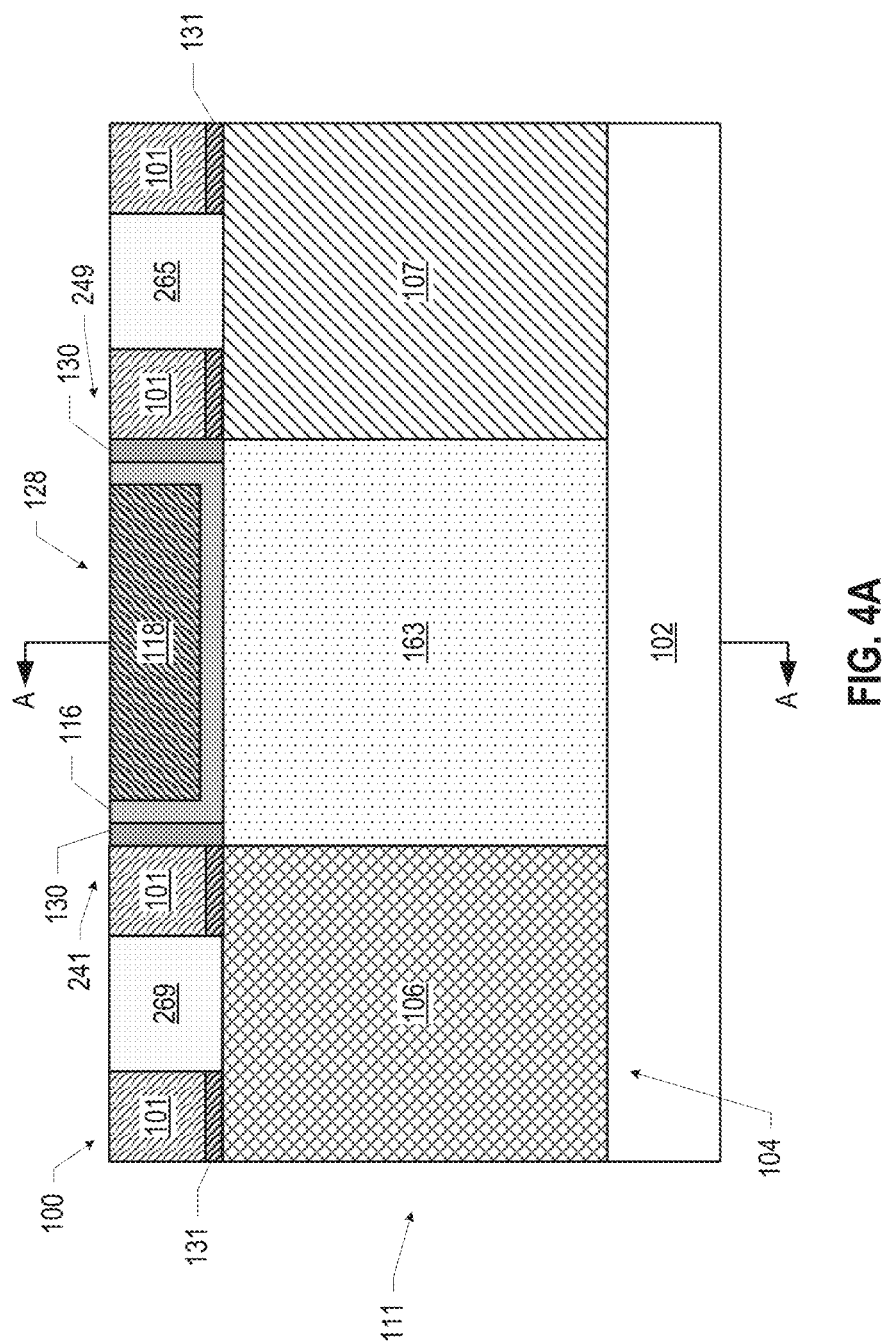

FIGS. 4A-4D are various views of another example of a TFET 100, in accordance with some embodiments. FIG. 4A is a side cross-sectional view of the TFET 100 along the fin 111, FIG. 4B is a side cross-sectional view taken through the section A-A of FIG. 4A (through the gate electrode 118), FIG. 4C is a side view taken toward the first source/drain material region 106, and FIG. 4D is a top view.

Like the TFETs 100 of FIGS. 1-3, the TFET 100 of FIG. 4 may include a first source/drain material region 106, a second source/drain material 107, and a channel material 163 that is disposed at least partially between the first source/drain material region 106 and the second source/drain material 107 to provide a channel for carriers during operation of the TFET 100. The first source/drain material region 106 and the second source/drain material 107 may have opposite conductivity types. The channel material 163 may have a first side face 243 and a second, opposing side face 247. A gate 128 may be disposed above the channel material 163 and may extend down onto the first side face 243 and the second side face 247. FIG. 4 depicts a number of additional elements in the TFET 100; these elements may take any of the forms discussed above, in any appropriate combination, and discussion of these elements is not repeated here for ease of illustration.

The TFET 100 of FIG. 4 may not include a buffer material 161 between the first source/drain material 106 and the second source/drain material 107 (unlike the embodiments of FIGS. 1 and 2), and unlike the embodiment of FIG. 3, the source/drain materials 106 and 107 may extend down to contact the substrate 102. In some embodiments, the source/drain materials 106 and 107 may be grown on the substrate 102, as discussed below. The channel material 163 may also be disposed on the substrate 102.

The TFET 100 of FIG. 4 may include any of the materials, material combinations, and dimensions discussed above with reference to FIG. 1, For example, in some embodiments of the TFET 100 of FIG. 4, the first source/drain material 106, the second source/drain material 107, and the channel material 163 may all include a same group III-V material (e.g., indium gallium arsenide). In some such embodiments, the substrate 102 may be a crystalline silicon substrate.

In other embodiments of the TFET 100 of FIG. 4, the first source/drain material 106, the second source/drain material 107, and the channel material 163 may all include silicon. In some such embodiments, the substrate 102 may be a crystalline silicon substrate.

In other embodiments of the TFET 100 of FIG. 4, the first source/drain material 106, the second source/drain material 107, and the channel material 163 may all include germanium. In some such embodiments, the substrate 102 may be a crystalline silicon substrate.

Figure 5A:
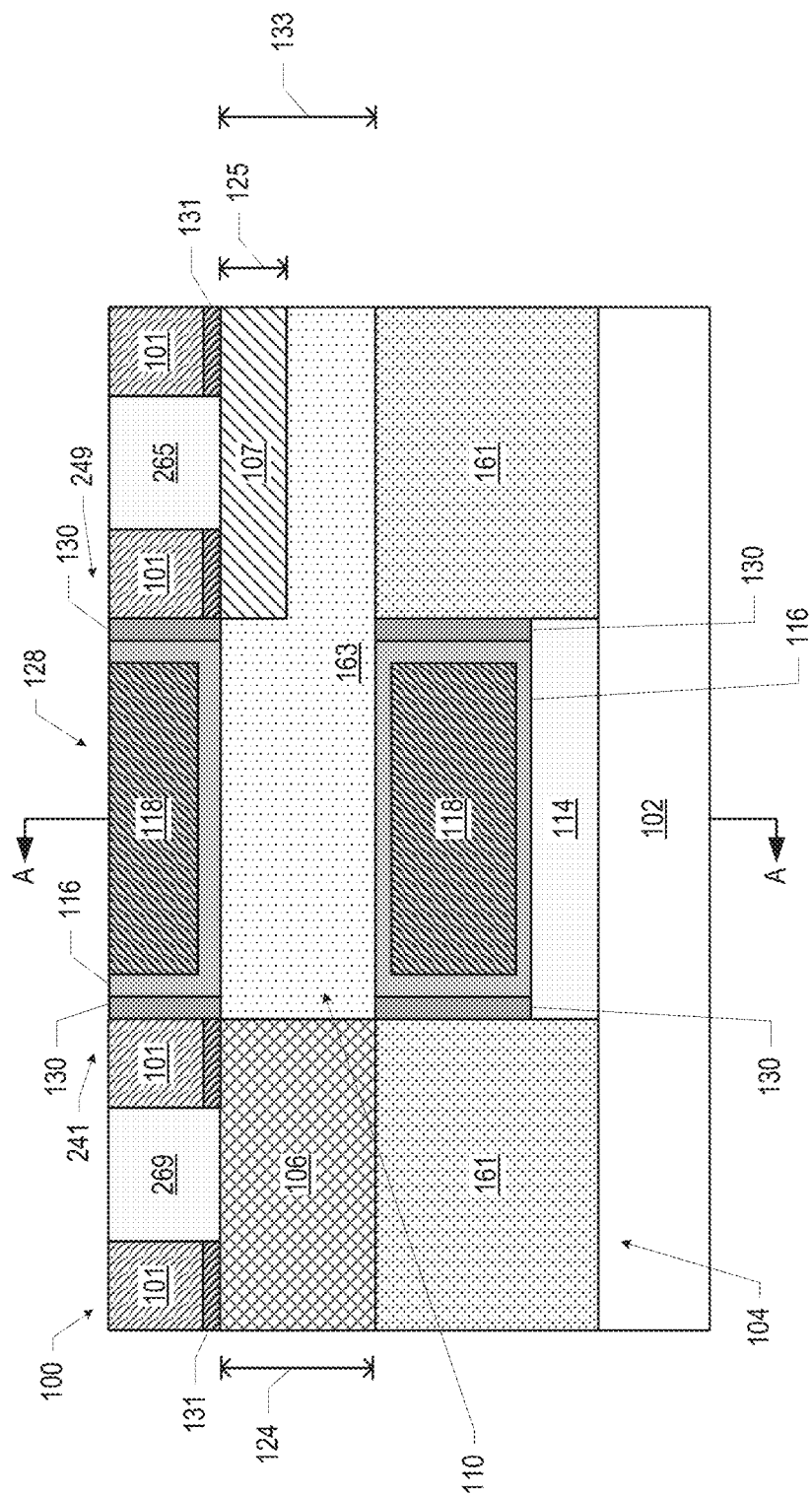

FIGS. 5A-5D are various views of another example of a TFET 100, in accordance with some embodiments. FIG. 5A is a side cross-sectional view of the TFET 100 along the nanowire portion 110, FIG. 5B is a side cross-sectional view taken through the section A-A of FIG. 5A (through the gate electrode 118), FIG. 5C is a side view taken toward the first source/drain material region 106, and FIG. 5D is a top view.

Like the TFETs 100 of FIGS. 1-4, the TFET 100 of FIG. 4 may include a first source/drain material region 106, a second source/drain material 107, and a channel material 163 that is disposed at least partially between the first source/drain material region 106 and the second source/drain material 107 to provide a channel for carriers during operation of the TFET 100. The first source/drain material region 106 and the second source/drain material 107 may have opposite conductivity types. The channel material 163 may have a first side face 243 and a second, opposing side face 247 (as well as top and bottom faces in contact with the gate 128, as discussed below). A gate 128 may be disposed above the channel material 163 and may extend down onto the first side face 243 and the second side face 247. FIG. 5 depicts a number of additional elements in the TFET 100; these elements may take any of the forms discussed above, in any appropriate combination, and discussion of these elements is not repeated here for ease of illustration.

In the TFET 100 of FIG. 5, the channel material 163 has a nanowire portion 110 that is surrounded by the gate 128; that is, the gate 128 is on the side faces 243 and 247, as well as the top face and the bottom face of the nanowire portion 110. The TFET 100 of FIG. 5 may thus be referred to as a "gate-all-around" TFET 100. The first source/drain material 106 may be disposed on a portion of buffer material 161 (which may be disposed on the substrate 102), while the second source/drain material 107 may be spaced apart from the buffer material 161 by a portion of the channel material 163. The channel material 163 may thus have an "L-shape" in cross-section, with a height under the gate 128 that is greater than a height under the second source/drain material 107. The height 124 of the first source/drain material 106 may be greater than the height 125 of the second source/drain material 107, as shown. Although a single nanowire portion 110 is shown in FIG. 5, the channel material 163 may include multiple nanowire portions 110 arranged in a vertical array, with the gate 128 wrapped around each of the multiple nanowire portions 110.

In some embodiments, the TFET 100 may include a bottom gate isolation material 114 disposed on the top surface 104 of the substrate 102 and under the nanowire portion 110. The bottom gate isolation material 114 may serve as a capacitive isolation barrier to prevent parasitic coupling between the top surface 104 and the gate 128. The effectiveness of the bottom gate isolation material 114 as a capacitive isolation barrier may depend at least in part on its thickness and material composition. In some embodiments, the bottom gate isolation material 114 may include any dielectric material, such as silicon oxide, silicon nitride, silicon oxynitride, low-k dielectric materials, etc. In some particular embodiments, the bottom gate isolation material 114 may include a silicon oxide layer. In some embodiments, the thickness of the bottom gate isolation material 114 may be sufficiently thick so as to isolate the top surface 104 from capacitive coupling by the gate 128. In a particular embodiment, the thickness of the bottom gate isolation material 114 may be between 5 nanometers and 200 nanometers.

The nanowire portion 110 may run parallel to the top surface 104. The nanowire portion 110 may have a thickness 133 and a width 132. In some embodiments, the thickness 133 may be between 5 nanometers and 40 nanometers (e.g., between 5 nanometers and 10 nanometers, or equal to 10 nanometers). In some embodiments, the width 132 may be between 5 nanometers and 50 nanometers. In some embodiments, the nanowire portion 110 may be ribbon-shaped in that the width 132 is greater than the thickness 133. In some embodiments, the cross-section of the nanowire portion 110 may be circular or oval-shaped rather than rectangular.

The TFET 100 of FIG. 5 may include any of the materials, material combinations, and dimensions discussed above with reference to FIG. 1. For example, in some embodiments of the TFET 100 of FIG. 5, the first source/drain material 106 may include indium, gallium, and arsenic (e.g., in the form of indium gallium arsenide) and may include a p-type impurity so as to have a p-type conductivity; the second source/drain material 107 may include indium, gallium, and arsenic (e.g., in the form of indium gallium arsenide) and may include an n-type impurity so as to have an n-type conductivity; and the channel material 163 may include indium, gallium, and arsenic (e.g., in the form of indium gallium arsenide). This embodiment of the TFET 100 may be an n-type TFET 100. In some such embodiments, the buffer material 161 may include a group III-V material, such as gallium arsenide, and the substrate 102 may be a crystalline silicon substrate.

Although many of the TFETs 100 illustrated in the accompanying drawings include a fin 111, any of the TFETs 100 disclosed herein may be modified so that the channel material 163 includes one or more nanowire portions 110 (and thus are all-around-gate TFETs 100).

Figure 6A:
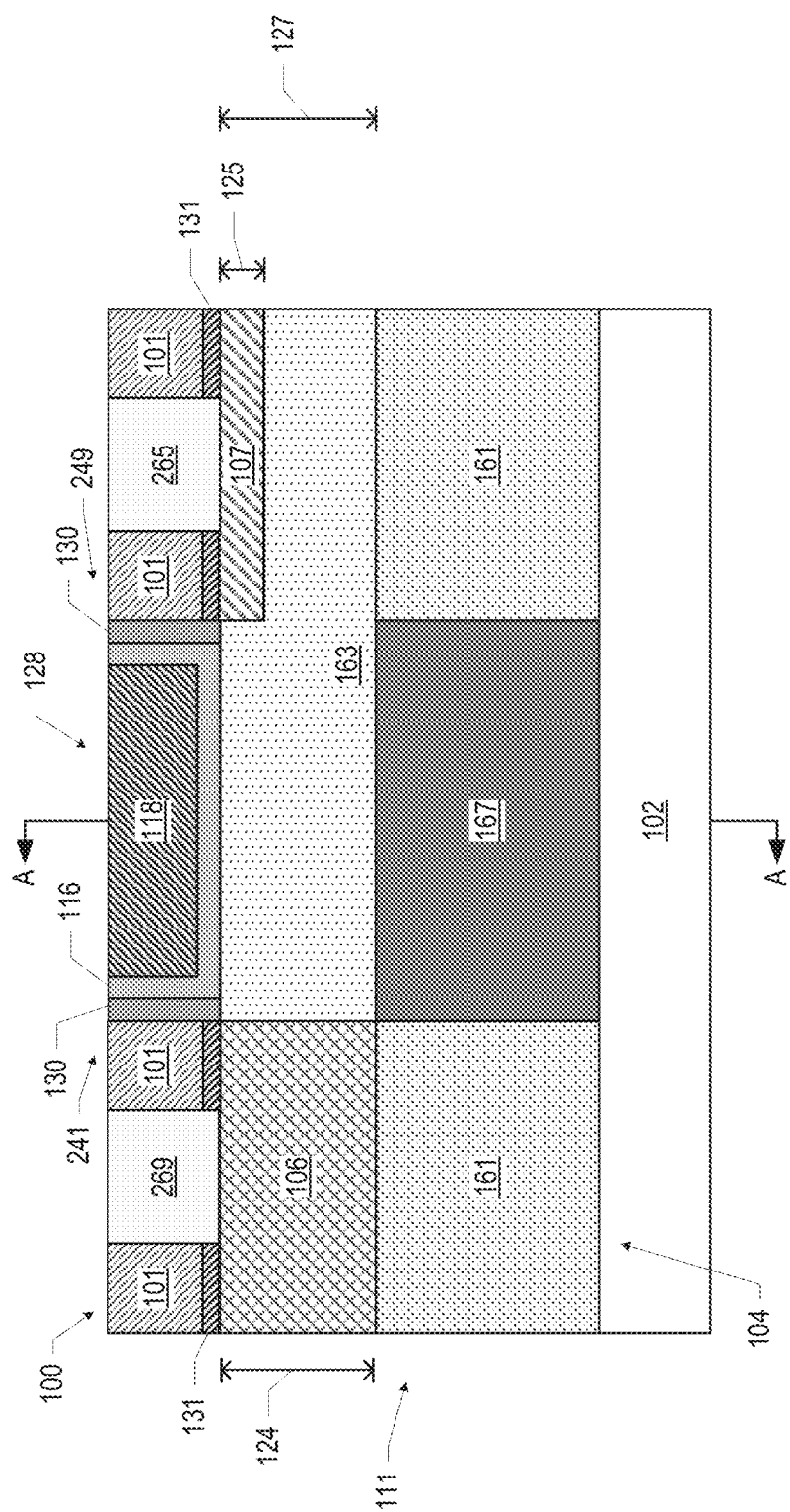

FIGS. 6A-6D are various views of another example of a TFET 100, in accordance with some embodiments. FIG. 6A is a side cross-sectional view of the TFET 100 along the fin 111, FIG. 6B is a side cross-sectional view taken through the section A-A of FIG. 6A (through the gate electrode 118), FIG. 6C is a side view taken toward the first source/drain material region 106, and FIG. 6D is a top view.

Like the TFETs 100 of FIGS. 1-5, the TFET 100 of FIG. 6 may include a first source/drain material region 106, a second source/drain material 107, and a channel material 163 that is disposed at least partially between the first source/drain material region 106 and the second source/drain material 107 to provide a channel for carriers during operation of the TFET 100. The first source/drain material region 106 and the second source/drain material 107 may have opposite conductivity types. The channel material 163 may have a first side face 243 and a second, opposing side face 247. A gate 128 may be disposed above the channel material 163, and may extend down onto the first side face 243 and the second side face 247. FIG. 6 depicts a number of additional elements in the TFET 100; these elements may take any of the forms discussed above, in any appropriate combination, and discussion of these elements is not repeated here for ease of illustration.

In the TFET 100 of FIG. 6, an oxide material 167 may be disposed under the portion of the channel material 163 that is under the gate 128. The oxide material 167 may separate that portion of the channel material 163 from the substrate 102. The first source/drain material 106 may extend down to and be in contact with the buffer material 161, while the second source/drain material 107 may be spaced apart from the buffer material 161 by a portion of the channel material 163. Like the TFET 100 of FIG. 5, the channel material 163 of the TFET 100 of FIG. 6 may thus have an "L-shape" in cross-section, with a height under the gate 128 that is greater than a height under the second source/drain material 107.

The height 124 of the first source/drain material 106 may be greater than the height 125 of the second source/drain material 107, as shown.

The TFET 100 of FIG. 6 may include any of the materials, material combinations, and dimensions discussed above with reference to FIG. 1. For example, in some embodiments of the TFET 100 of FIG. 6, the first source/drain material 106 may include indium, gallium, and arsenic (e.g., in the form of indium gallium arsenide) and may include a p-type impurity so as to have a p-type conductivity; the second source/drain material 107 may include indium, gallium, and arsenic (e.g., in the form of indium gallium arsenide) and may include an n-type impurity so as to have an n-type conductivity; and the channel material 163 may include indium, gallium, and arsenic (e.g., in the form of indium gallium arsenide). This embodiment of the TFET 100 may be an n-type TFET 100. In some such embodiments, the buffer material 161 may include a group III-V material, such as gallium arsenide, and the substrate 102 may be a crystalline silicon substrate.

Figure 7A:
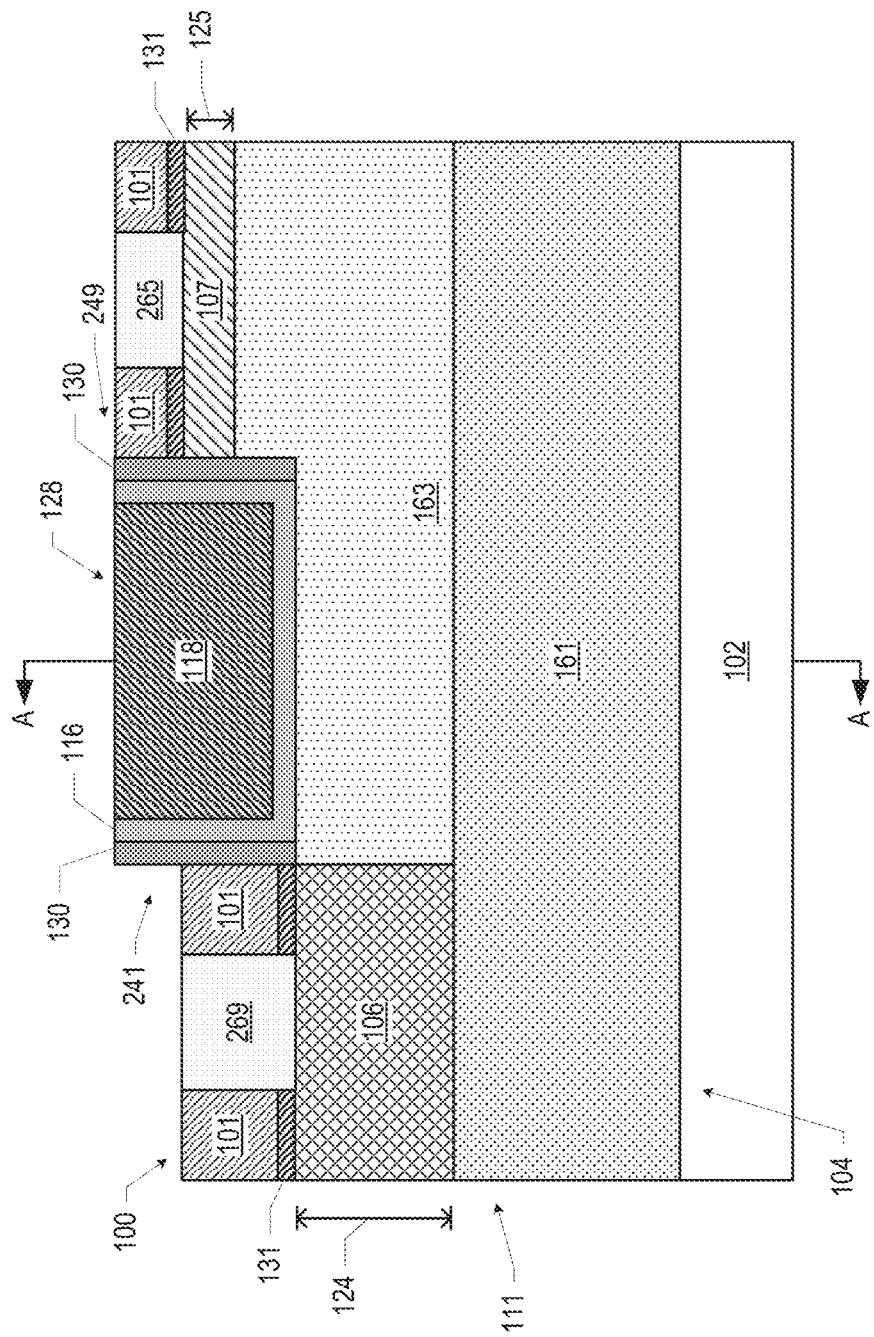

FIGS. 7A-7D are various views of another example of a TFET 100, in accordance with some embodiments. FIG. 7A is a side cross-sectional view of the TFET 100 along the fin 111, FIG. 7B is a side cross-sectional view taken through the section A-A of FIG. 7A (through the gate electrode 118), FIG. 7C is a side view taken toward the first source/drain material region 106, and FIG. 7O is a top view.

Like the TFETs 100 of FIGS. 1-6, the TFET 100 of FIG. 7 may include a first source/drain material region 106, a second source/drain material 107, and a channel material 163 that is disposed at least partially between the first source/drain material region 106 and the second source/drain material 107 to provide a channel for carriers during operation of the TFET 100. The first source/drain material region 106 and the second source/drain material 107 may have opposite conductivity types. The channel material 163 may have a first side face 243 and a second, opposing side face 247. A gate 128 may be disposed above the channel material 163 and may extend down onto the first side face 243 and the second side face 247. FIG. 7 depicts a number of additional elements in the TFET 100; these elements may take any of the forms discussed above, in any appropriate combination, and discussion of these elements is not repeated here for ease of illustration.

In the TFET 100 of FIG. 7, the first source/drain material 106 may extend down to and be in contact with the buffer material 161, while the second source/drain material 107 may be spaced apart from the buffer material 161 by a portion of the channel material 163. The channel material 163 of the TFET 100 of FIG. 7 may thus have an "L-shape" in cross-section, with a height under the gate 128 that is less than a height under the second source/drain material 107. In some embodiments, the top surface of the second source/drain material 107 may be farther from the substrate 102 than the top surface of the first source/drain material 106; in some such embodiments, the bottom surface of the second source/drain material 107 may be farther from the substrate 102 than the top surface of the first source/drain material 106, as shown. In some embodiments, the height 124 of the first source/drain material 106 may be greater than the height 125 of the second source/drain material 107, as shown.

The TFET 100 of FIG. 7 may include any of the materials, material combinations, and dimensions discussed above with reference to FIG. 1. For example, in some embodiments of the TFET 100 of FIG. 7, the first source/drain material 106 may include indium, gallium, and arsenic (e.g., in the form of indium gallium arsenide) and may include a p-type impurity so as to have a p-type conductivity; the second source/drain material 107 may include indium, gallium, and arsenic (e.g., in the form of indium gallium arsenide) and may include an n-type impurity so as to have an n-type conductivity; and the channel material 163 may include indium, gallium, and arsenic (e.g., in the form of indium gallium arsenide). This embodiment of the TFET 100 may be an n-type TFET 100. In some such embodiments, the buffer material 161 may include a group III-V material, such as gallium arsenide, and the substrate 102 may be a crystalline silicon substrate.

Figure 8A:
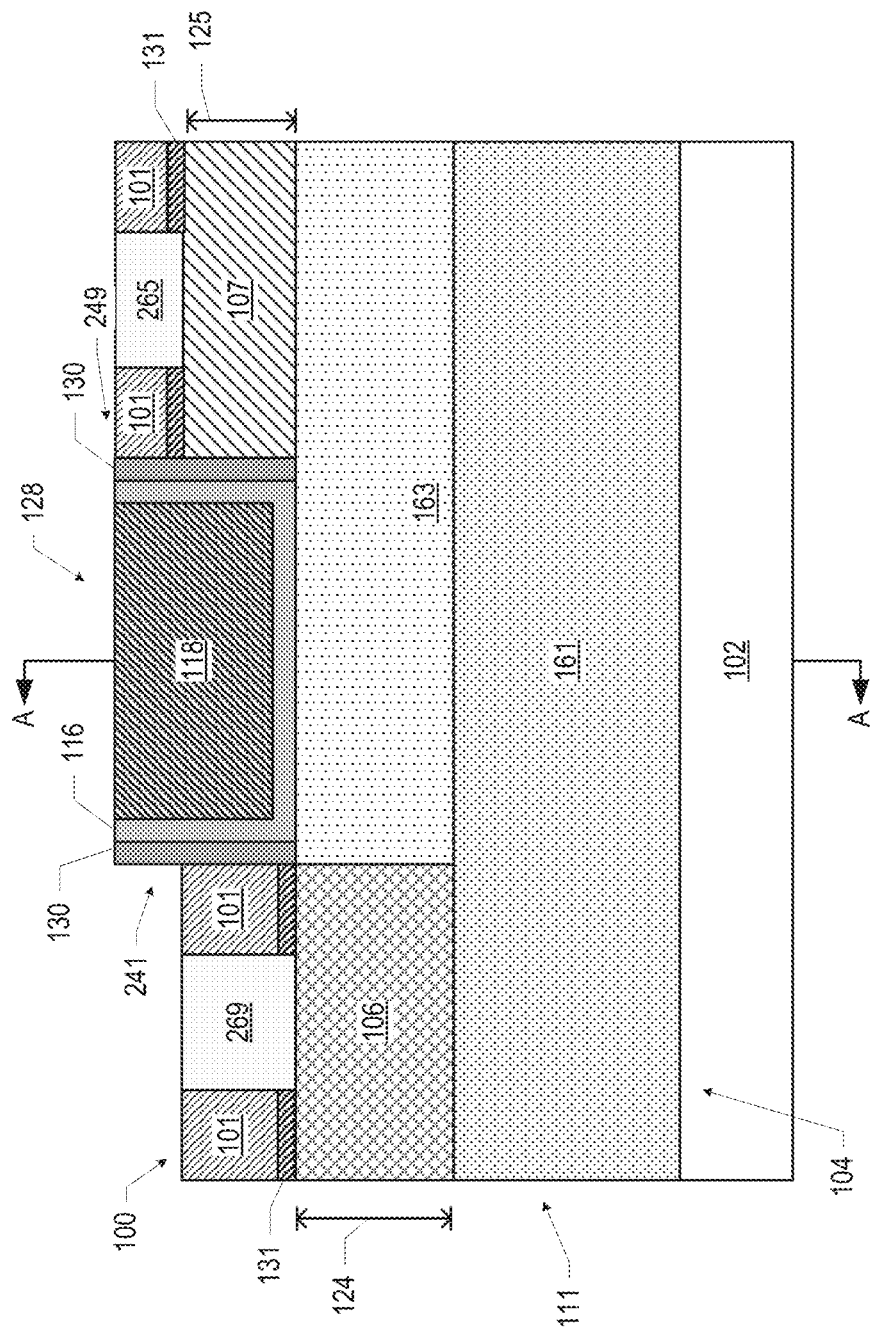

FIGS. 8A-8D are various views of another example of a TFET 100, in accordance with some embodiments. FIG. 8A is a side cross-sectional view of the TFET 100 along the fin 111, FIG. 8B is a side cross-sectional view taken through the section A-A of FIG. 8A (through the gate electrode 118), FIG. 8C is a side view taken toward the first source/drain material region 106, and FIG. 8D is a top view.

Like the TFETs 100 of FIGS. 1-7, the TFET 100 of FIG. 8 may include a first source/drain material region 106, a second source/drain material 107, and a channel material 163 that is disposed at least partially between the first source/drain material region 106 and the second source/drain material 107 to provide a channel for carriers during operation of the TFET 100. The first source/drain material region 106 and the second source/drain material 107 may have opposite conductivity types. The channel material 163 may have a first side face 243 and a second, opposing side face 247. A gate 128 may be disposed above the channel material 163 and may extend down onto the first side face 243 and the second side face 247. FIG. 8 depicts a number of additional elements in the TFET 100; these elements may take any of the forms discussed above, in any appropriate combination, and discussion of these elements is not repeated here for ease of illustration.

In the TFET 100 of FIG. 8, the first source/drain material 106 may extend down to and be in contact with the buffer material 161, while the second source/drain material 107 may be spaced apart from the buffer material 161 by a portion of the channel material 163. In some embodiments, the top surface of the second source/drain material 107 may be farther from the substrate 102 than the top surface of the first source/drain material 106, as shown. The height 124 of the first source/drain material 106 may be different from, or the same as, the height 125 of the second source/drain material 107.

The TFET 100 of FIG. 8 may include any of the materials, material combinations, and dimensions discussed above with reference to FIG. 1. For example, in some embodiments of the TFET 100 of FIG. 8, the first source/drain material 106 may include indium, gallium, and arsenic (e.g., in the form of indium gallium arsenide) and may include an n-type impurity so as to have an n-type conductivity; the second source/drain material 107 may include indium, gallium, and arsenic (e.g., in the form of indium gallium arsenide) and may include a p-type impurity so as to have a p-type conductivity; and the channel material 163 may include indium, gallium, and arsenic (e.g., in the form of indium gallium arsenide). This embodiment of the TFET 100 may be a p-type TFET 100. In some such embodiments, the buffer material 161 may include a group III-V material, such as gallium arsenide, and the substrate 102 may be a crystalline silicon substrate.

Figure 9A:
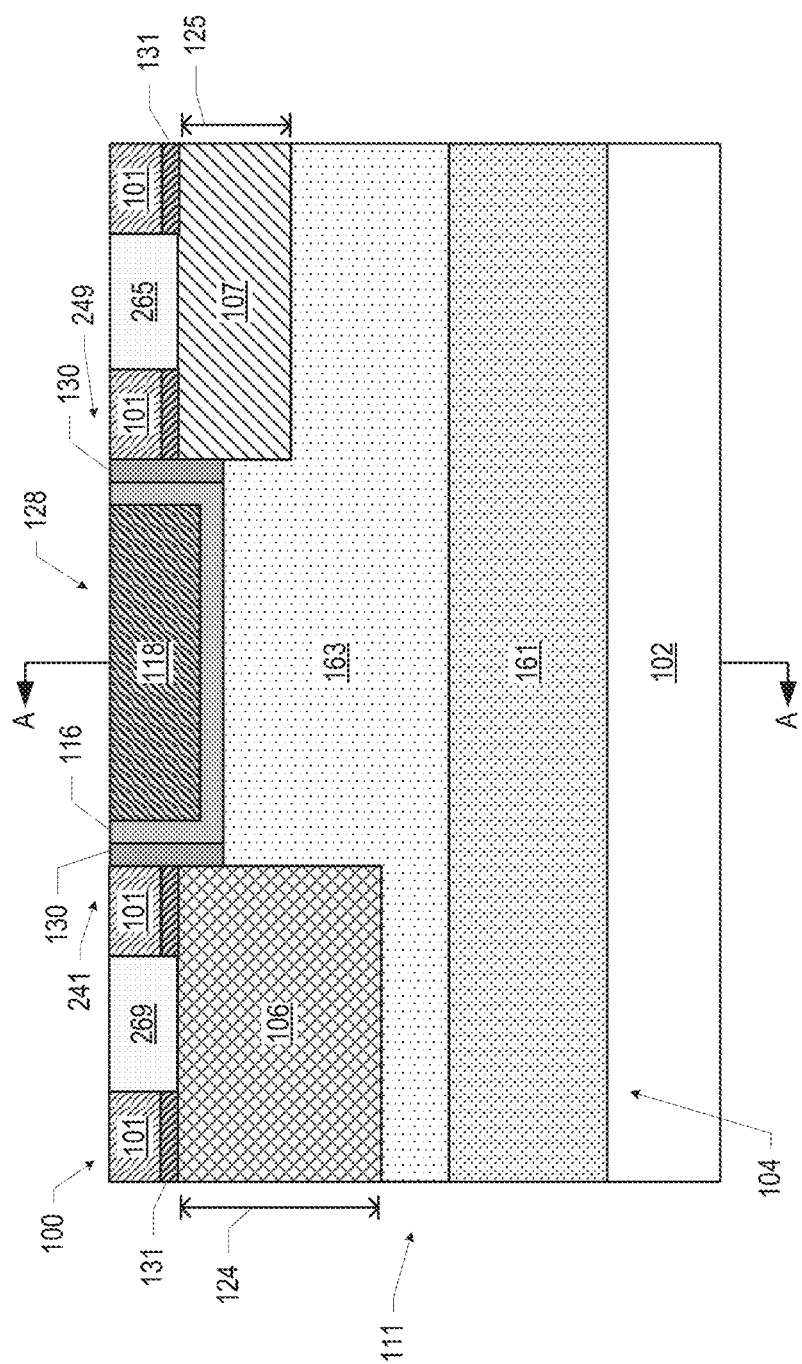

FIGS. 9A-9D are various views of another example of a TFET 100, in accordance with some embodiments. FIG. 9A is a side cross-sectional view of the TFET 100 along the fin 111, FIG. 9B is a side cross-sectional view taken through the section A-A of FIG. 9A (through the gate electrode 118), FIG. 9C is a side view taken toward the first source/drain material region 106, and FIG. 9D is a top view.

Like the TFETs 100 of FIGS. 1-8, the TFET 100 of FIG. 9 may include a first source/drain material region 106, a second source/drain material 107, and a channel material 163 that is disposed at least partially between the first source/drain material region 106 and the second source/drain material 107 to provide a channel for carriers during operation of the TFET 100. The first source/drain material region 106 and the second source/drain material 107 may have opposite conductivity types. The channel material 163 may have a first side face 243 and a second, opposing side face 247. A gate 128 may be disposed above the channel material 163 and may extend down onto the first side face 243 and the second side face 247. FIG. 9 depicts a number of additional elements in the TFET 100; these elements may take any of the forms discussed above, in any appropriate combination, and discussion of these elements is not repeated here for ease of illustration.

In the TFET 100 of FIG. 9, portions of the channel material 163 are disposed between the buffer material 161 and the source/drain materials 106 and 107 (as in the embodiment of FIG. 1). Unlike the embodiment of FIG. 1, the height 124 of the first source/drain material 106 and the height 125 of the second source/drain material 107 may be different (e.g., the height 124 may be greater than the height 125).

The TFET 100 of FIG. 9 may include any of the materials, material combinations, and dimensions discussed above with reference to FIG. 1. For example, in some embodiments of the TFET 100 of FIG. 9, the first source/drain material 106 may include indium, gallium, and arsenic (e.g., in the form of indium gallium arsenide) and may include a p-type impurity so as to have a p-type conductivity; the second source/drain material 107 may include indium, gallium, and arsenic (e.g., in the form of indium gallium arsenide) and may include an n-type impurity so as to have an n-type conductivity; and the channel material 163 may include indium, gallium, and arsenic (e.g., in the form of indium gallium arsenide). This embodiment of the TFET 100 may be an n-type TFET 100. In some such embodiments, the buffer material 161 may include a group III-V material, such as gallium arsenide, and the substrate 102 may be a crystalline silicon substrate.

Figure 10A:
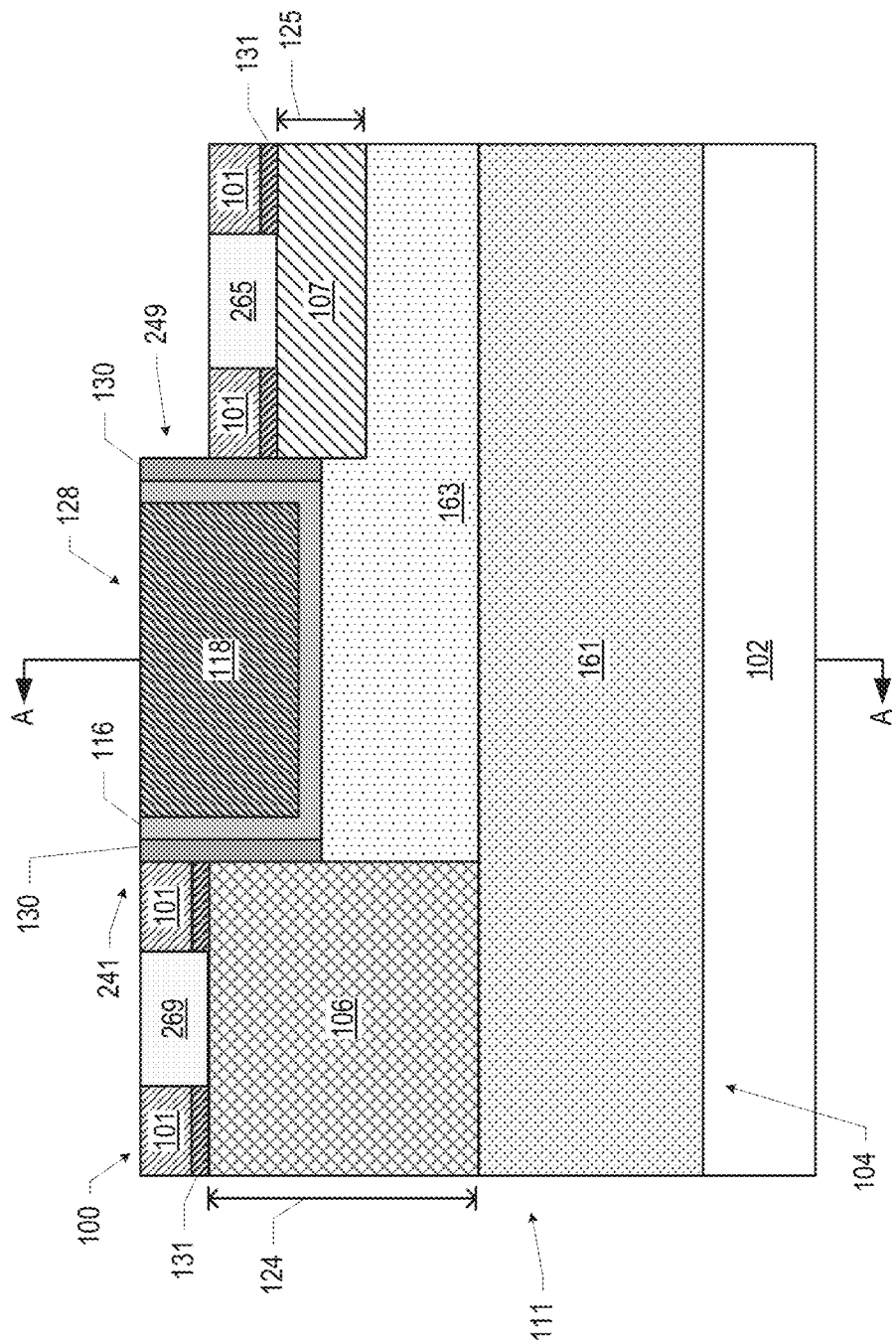

FIGS. 10A-10E are various views of another example of a TFET 100, in accordance with some embodiments. FIG. 10A is a side cross-sectional view of the TFET 100 along the fin 111, FIG. 10B is a side cross-sectional view taken through the section A-A of FIG. 10A (through the gate electrode 118), FIG. 10C is a side view taken toward the first source/drain material region 106, and FIG. 10D is a top view. FIG. 10E, discussed further below, represents the same view as FIG. 10B, but depicts the non-idealities that commonly arise in device manufacture.

Like the TFETs 100 of FIGS. 1-9, the TFET 100 of FIG. 10 may include a first source/drain material region 106, a second source/drain material 107, and a channel material 163 that is disposed at least partially between the first source/drain material region 106 and the second source/drain material 107 to provide a channel for carriers during operation of the TFET 100. The first source/drain material region 106 and the second source/drain material 107 may have opposite conductivity types. The channel material 163 may have a first side face 243 and a second, opposing side face 247. A gate 128 may be disposed above the channel material 163 and may extend down onto the first side face 243 and the second side face 247. FIG. 10 depicts a number of additional elements in the TFET 100; these elements may take any of the forms discussed above, in any appropriate combination, and discussion of these elements is not repeated here for ease of illustration.

In the TFET 100 of FIG. 10, the first source/drain material 106 may extend down to and be in contact with the buffer material 161, while the second source/drain material 107 may be spaced apart from the buffer material 161 by a portion of the channel material 163. Like the TFET 100 of FIG. 5, the channel material 163 of the TFET 100 of FIG. 6 may thus have an "L-shape" in cross-section, with a height under the gate 128 that is greater than a height under the second source/drain material 107. Additionally, the height 124 of the first source/drain material 106 may be greater than the height 125 of the second source/drain material 107, as shown, such that the top surface of the first source/drain material 106 is farther from the substrate 102 than the top surface of the second source/drain material 107 is from the substrate 102.

The TFET 100 of FIG. 10 may include any of the materials, material combinations, and dimensions discussed above with reference to FIG. 1. For example, in some embodiments of the TFET 100 of FIG. 10, the first source/drain material 106 may include indium, gallium, and arsenic (e.g., in the form of indium gallium arsenide) and may include a p-type impurity so as to have a p-type conductivity; the second source/drain material 107 may include indium, gallium, and arsenic (e.g., in the form of indium gallium arsenide) and may include an n-type impurity so as to have an n-type conductivity; and the channel material 163 may include indium, gallium, and arsenic (e.g., in the form of indium gallium arsenide). This embodiment of the TFET 100 may be an n-type TFET 100. In some such embodiments, the buffer material 161 may include a group III-V material, such as gallium arsenide, and the substrate 102 may be a crystalline silicon substrate.

As noted above, although many of the drawings illustrate rectilinear structures with flat walls and right-angle corners, this is simply for ease of illustration and actual devices made using these techniques will exhibit rounded corners, surface roughness, and other features. For example, FIG. 10E is a cross-sectional view of the TFET 100 of FIG. 10, sharing the same perspective of FIG. 10B. As illustrated in FIG. 10E, the first source/drain material 106 and the second source/drain material 107 may have rounded and tapered portions, and elements of the TFET 100 that are represented as having a uniform thickness in idealized drawings will have thicknesses that vary.

The TFETs 100 disclosed herein may be fabricated using any suitable techniques. For example, FIGS. 11-23 provide various views of assemblies in different stages of the manufacture of the TFET 100 of FIG. 1, in accordance with various embodiments. Although FIGS. 11-23 depict the fabrication of the TFET 100 of FIG. 1, the manufacturing techniques represented by FIGS. 11-23 may be used to manufacture any of the TFETs 100 disclosed herein. Some variations of the techniques of FIGS. 11-23 that may be used to form others of the TFETs 100 disclosed herein are discussed below.

In FIGS. 11-23, the "A" sub-figures represent a cross-sectional view analogous to that of FIG. 1A (and FIG. 1E), the "B" sub-figures represent a cross-sectional view analogous to that of FIG. 1B, the "C" sub-figures represent a side view analogous to that of FIG. 1C, and the "D" sub-figures represent a top view analogous to that of FIG. 1D.

FIG. 11 depicts an assembly 300 including a substrate 102 having a fin 244 formed therein. The fin 244 may have opposing faces 242 and 246, and an STI layer 105 may be disposed on the faces 242 and 246. The substrate 102 and the STI layer 105 may include any of the materials discussed herein. For example, in some embodiments, the substrate 102 may be a distinctly crystalline material, such as crystalline silicon or crystalline germanium. In some embodiments, the fin 244 may be formed using conventional photolithography and etching methods. In some embodiments, the STI layer 105 may be formed by first blanket-depositing the STI layer 105 on the substrate 102 and over the fin 244 using conventional chemical vapor deposition (CVD) methods to a thickness greater than the height of the fin 244. Next, the STI layer 105 may be planarized using a conventional chemical mechanical planarization (CMP) method.

Figure 12B:
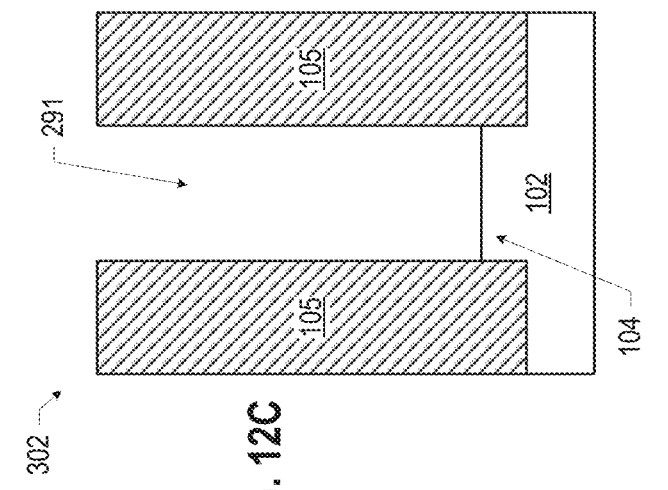
Figure 12C:
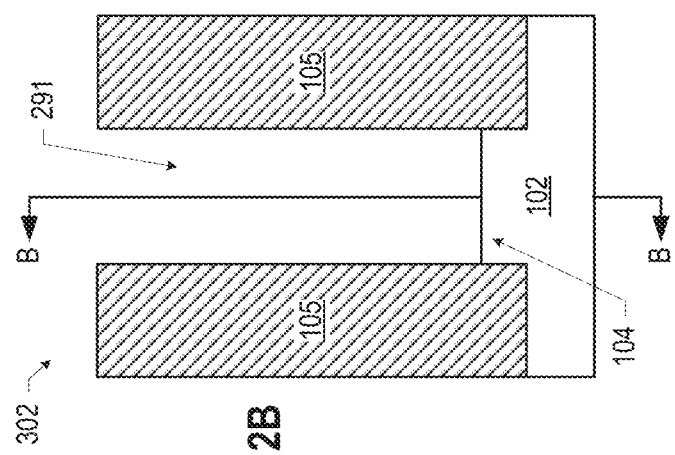
Figure 12D:
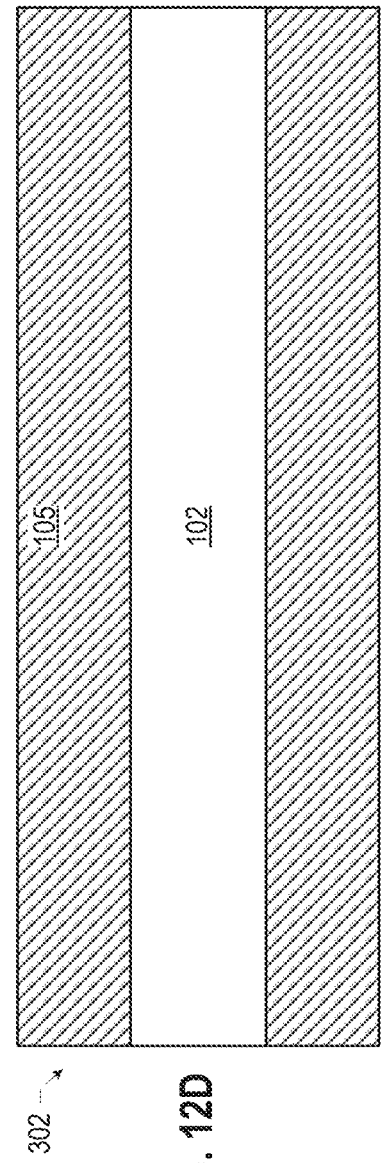

FIG. 12 illustrates an assembly 302 subsequent to recessing the fin 244 of the assembly 300 (FIG. 11) to form a trench 291 whose sidewalls are provided by the STI layer 105 and whose bottom is provided by the remaining substrate 102. In particular, the bottom of the trench 291 is provided by the top surface 104 of the substrate 102, as discussed above. Any suitable etch technique may be used to recess the fin 244. The trench 291 may serve to contain the subsequent growth of the fin 111.

Figure 13A:
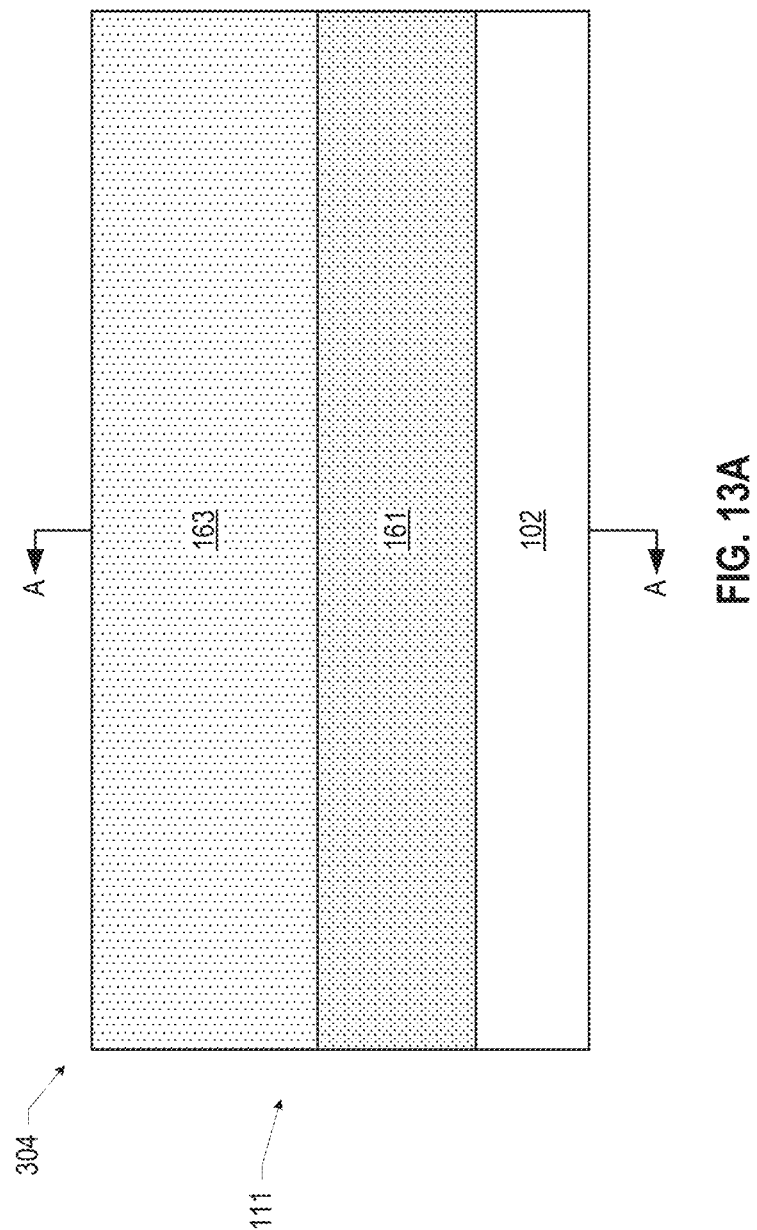

FIG. 13 illustrates an assembly 304 subsequent to forming a buffer material 161 and a channel material 163 in the trench 291 of the assembly 302 (FIG. 12). The buffer material 161 may be formed on the top surface 104 of the substrate 102, and the channel material 163 may be formed on the buffer material 161; the buffer material 161 and the channel material 163 may together provide a fin 111 having side faces. In some embodiments, the buffer material 161 and the channel material 163 may be formed by epitaxial growth and may take the form of any of the embodiments disclosed herein. To manufacture embodiments of the TFETs 100 that do not include a buffer material 161 (e.g., the TFET 100 discussed above with reference to FIG. 3), the formation of the buffer material 161 may be omitted, To manufacture embodiments of the TFETs 100 that include an oxide material 167 under the channel material 163, the buffer material 161 may be grown on the top surface 104, a portion of the buffer material 161 may be etched away to form a recess, the oxide material 167 may be deposited (using any suitable technique) in the recess, and the channel material 163 may be formed on top of the buffer material 161/oxide material 167. To manufacture embodiments of the TFETs 100 that include nanowire portions 110, the material for the nanowire portions 110 (i.e., the channel material 163) may be grown in alternating layers with a sacrificial material on a bottom gate isolation material 114; prior to forming the sacrificial gate 261 (as discussed below with reference to FIGS. 15 and 16), the sacrificial material may be removed, leaving the nanowire portions 110.

The growth of the fin 111 in the trench 291 may geometrically constrain the fin 111. In some embodiments, the large aspect ratio of the trench 291 may reduce the defects in the channel material 163 by aspect ratio trapping (ART); defects that arise in the deposition of the buffer material 161 may propagate diagonally toward, and terminate at, the STI layer 105 providing the walls of the trench 291 and thus may not continue upwards into the channel material 163.

FIG. 14 illustrates an assembly 306 subsequent to recessing the STI layer 105 of the assembly 304 (FIG. 13) to expose at least some of the fin 111, in particular, to expose the channel material 163. In some embodiments, at least some of the buffer material 161 may be exposed when the STI layer 105 is recessed. Any suitable etch technique may be used to recess the STI layer 105.

Figure 15A:
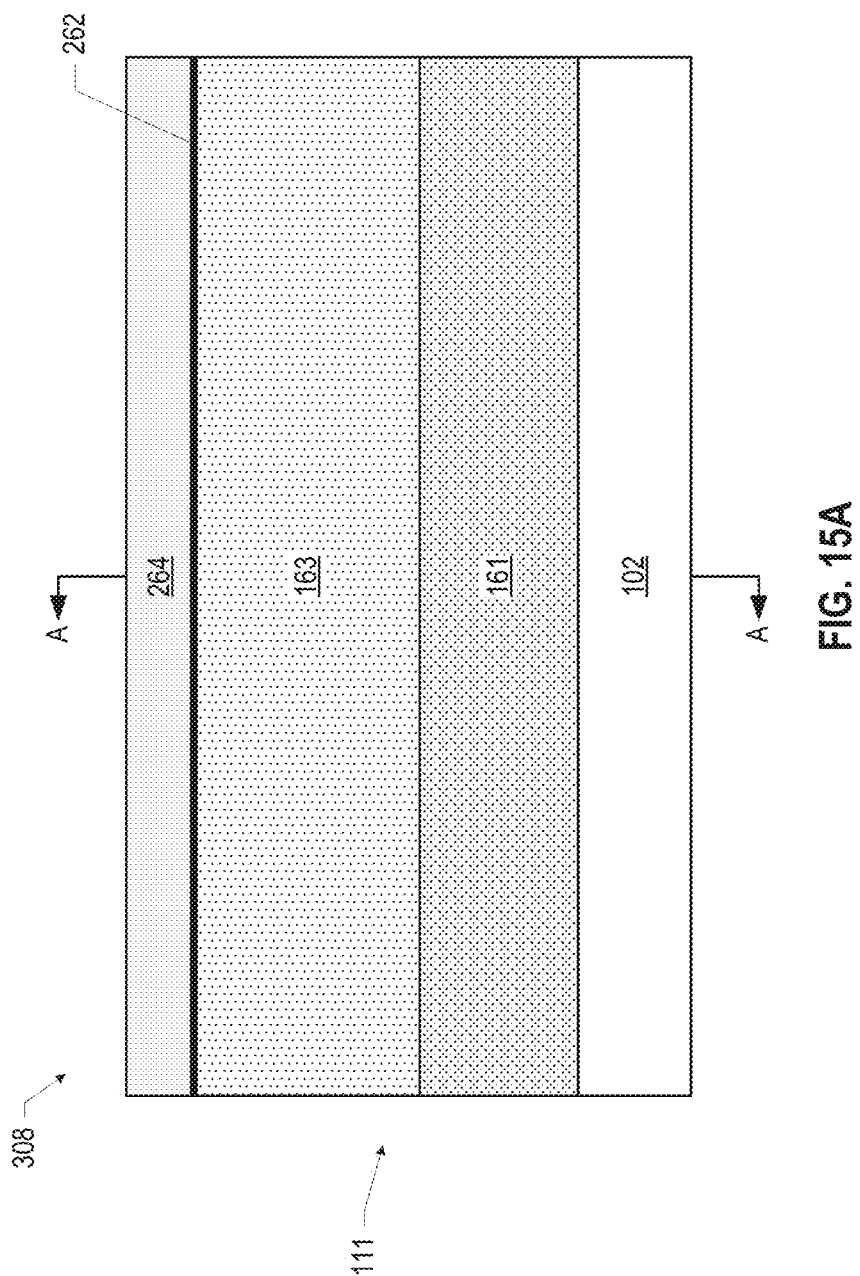

FIG. 15 illustrates an assembly 308 subsequent to providing a sacrificial gate dielectric 262 and a sacrificial gate electrode material 264 over the fin 111 of the assembly 306 (FIG. 14). The sacrificial gate dielectric 262 may be blanket-deposited on top of the fin 111 and on the side faces 243 and 247 of the fin 111. In some embodiments, the sacrificial gate dielectric 262 may be deposited to a thickness between 10 angstroms and 50 angstroms. A sacrificial gate electrode material 264 may then be blanket-deposited on the sacrificial gate dielectric 262 and over the fin 111. The sacrificial gate electrode material 264 may be deposited to a thickness that exceeds the height of the fin 111, and then may be planarized using conventional CMP methods.

Figure 16A:
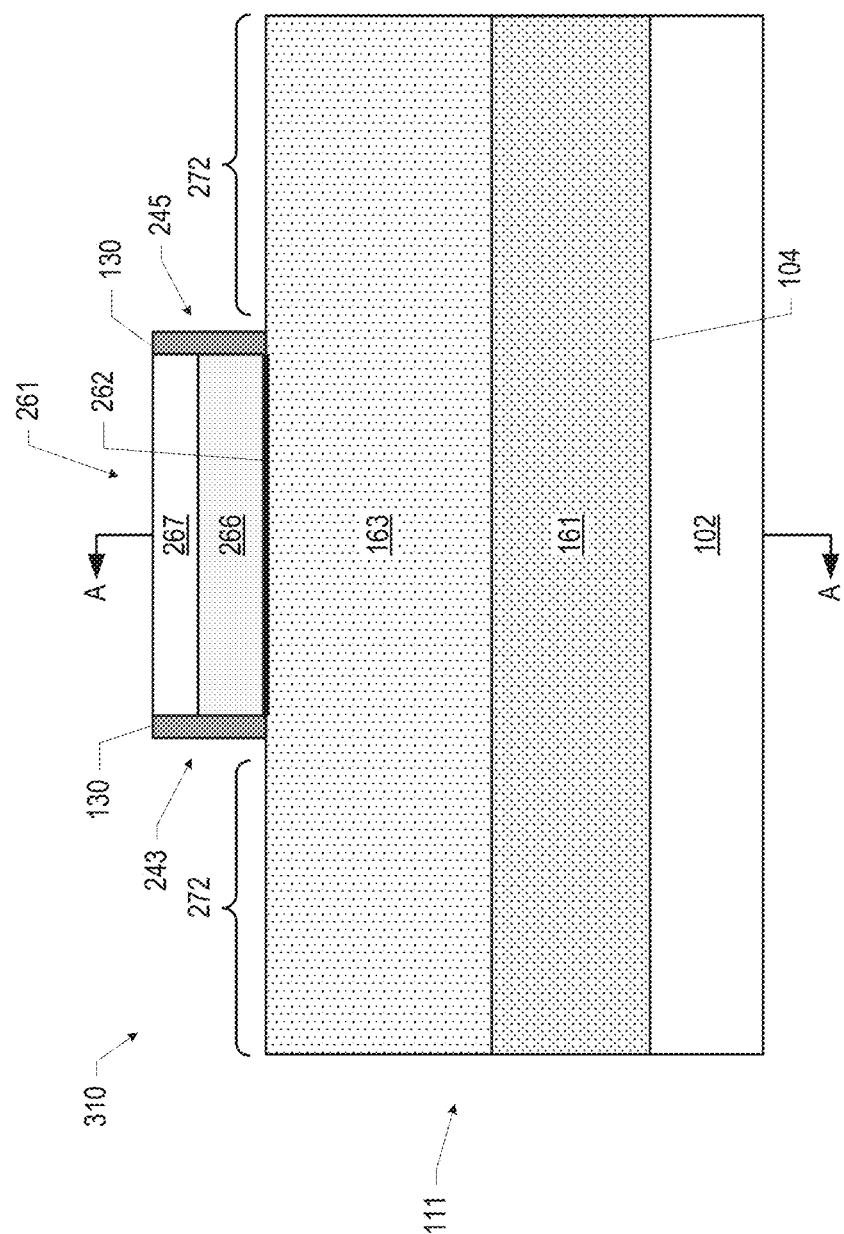

FIG. 16 illustrates an assembly 310 subsequent to providing a hardmask 267, patterning the sacrificial gate dielectric 262 and the sacrificial gate electrode material 264 of the assembly 308 (FIG. 15) to form a sacrificial gate 261, then providing spacers 130 on the side faces 243 and 245 of the sacrificial gate 261. The patterning of the hardmask 267, the sacrificial gate dielectric 262, and the sacrificial gate electrode material 264 may expose sacrificial portions 272 of the fin 111. Conventional photolithography and etching methods may be used to perform the patterning. Although a single sacrificial gate 261 is illustrated in FIG. 16, any desired number of sacrificial gates 261 may be patterned on the fin 111 (e.g., to form multiple TFETs 100 on a single fin 111). The sacrificial gate 261 may serve to protect the underlying regions of the fin 111 during subsequent removal of sacrificial portions 272 of the fin 111, as discussed below.

During the patterning of the sacrificial gate electrode 266, the sacrificial gate dielectric 262 on the sacrificial portions 272 of the fin 111 may be exposed on opposite sides of the sacrificial gate electrode 266. The sacrificial gate dielectric 262 may serve as an etch stop layer during the patterning and formation of the sacrificial gate electrode 266, thereby mitigating damage to the fin 111. In a particular embodiment, the sacrificial gate dielectric 262 may be a dielectric layer (e.g., silicon oxide, silicon nitride, and silicon oxynitride) and the sacrificial gate electrode material 264 may be a semiconductor material (e.g., polycrystalline silicon). After patterning the sacrificial gate electrode material 264, the sacrificial gate dielectric 262 may be removed from the top and the side faces 243 and 247 of the sacrificial portions 272 of the fin 111 (e.g., using a conventional wet etch process) to expose the sacrificial portions 272 of the fin 111. In an embodiment in which the sacrificial gate dielectric 262 is a silicon oxide layer, the sacrificial gate dielectric 262 may be removed using a dilute hydrogen fluoride wet etch.

The pair of spacers 130 may be formed using conventional methods of forming selective spacers, as known in the art. In some embodiments, a conformal dielectric spacer layer, such as but not limited to silicon oxide, silicon nitride, silicon oxynitride, and combinations thereof, is first blanket-deposited on all structures, including the fin 111. The dielectric spacer layer may be deposited in a conformal manner so that it has substantially equal thicknesses on both vertical surfaces (such as the side faces 243 and 247) and horizontal surfaces. The dielectric spacer layer may be deposited using conventional CVD methods such as low-pressure chemical vapor deposition (LPCVD) and plasma enhanced chemical vapor deposition (PECVD), for example. In some embodiments, the dielectric spacer layer may be deposited to a thickness between 2 nanometers and 10 nanometers. Next, an unpatterned anisotropic etch may be performed on the dielectric spacer layer using conventional anisotropic etch methods, such as reactive ion etching (RIE). During the anisotropic etching process, most of the dielectric spacer layer may be removed from horizontal surfaces, leaving the dielectric spacer layer on the vertical surfaces, as shown. Next, an unpatterned isotropic etch may be performed to remove the remaining dielectric spacer layer from any horizontal surfaces, leaving pairs of spacers 130. In some embodiments, the isotropic etch is a wet etch process. In a specific embodiment, where the dielectric spacer layer is silicon nitride or silicon oxide, the isotropic etch may employ a wet etchant solution comprising phosphoric acid or a buffered oxide etch (BOE), respectively. In an alternate embodiment, the isotropic etch may be a dry etch process. In one such embodiment, nitrogen trifluoride gas may be employed in a downstream plasma reactor to isotropically etch the dielectric spacer layers. Although the spacers 130 are illustrated as having substantially rectangular cross-sections, this is for ease of illustration; in some embodiments, the spacers 130 may be thinner farther from the substrate 102 and thicker closer to the substrate 102. In some embodiments, the spacers 130 may be curved on their outer faces. In some embodiments, the spacers 130 may extend up onto the sides of the hardmask 267. In some embodiments, the hardmask 267 may not be included.

FIG. 17 illustrates an assembly 312 subsequent to removing the sacrificial portions 272 of the fin 111 of the assembly 310 (FIG. 16) to expose source/drain regions 274 of the channel material 163. To manufacture embodiments of the TFET 100 in which the source/drain materials 106 and 107 are formed on the buffer material 161 (e.g., as illustrated in FIG. 2), the sacrificial portions 272 of the fin 111 may extend all the way down to the buffer material 161. To manufacture embodiments of the TFET 100 in which the source/drain materials 106 and 107 are formed on the substrate 102 (e.g., as illustrated in FIG. 4), the sacrificial portions 272 of the fin 111 may extend all the way down to the substrate 102. The sacrificial portions 272 of the fin 244 may be removed using conventional etching methods, such as wet etching or plasma dry etching. The sacrificial gate 261 may protect the underlying portions of the fin 111 during this etch.

Figure 18A:
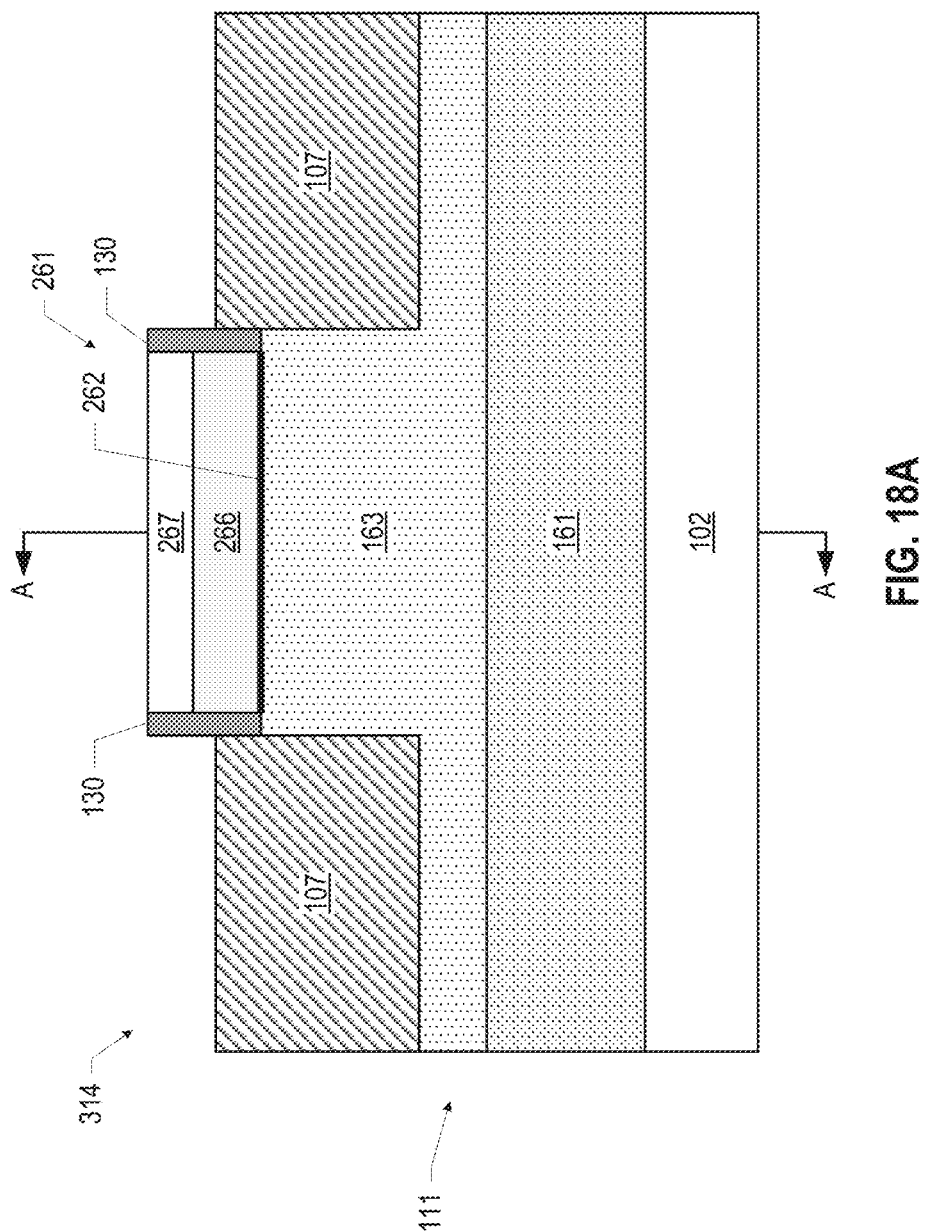

FIG. 18 illustrates an assembly 314 subsequent to forming portions of the second source/drain material 107 on the source/drain regions 274 of the assembly 312 (FIG. 17). In some embodiments, the second source/drain material 107 may be formed using conventional epitaxial deposition methods, such as low-pressure CVD, vapor phase epitaxy, or molecular beam epitaxy. The second source/drain material 107 may include any appropriate material, such as any of the materials discussed above, FIG. 19 illustrates an assembly 316 subsequent to masking off the second source/drain material 107 in one of the source/drain regions 274 of the assembly 314 (FIG. 18) with a mask material 271 (while leaving the second source/drain material 107 in the other of the source/drain regions 274 exposed), then removing the exposed portion of the second source/drain material 107 to leave the associated source/drain region 274 exposed again. Any suitable material may be used to mask the second source/drain material 107, such as a conformal material. The exposed second source/drain material 107 may be removed using conventional etching methods, such as wet etching or plasma dry etching. The sacrificial gate 261 may protect the underlying portions of the fin 111 during this etch, and the mask material 271 may protect the underlying portion of the second source/drain material 107.

Figure 19A:
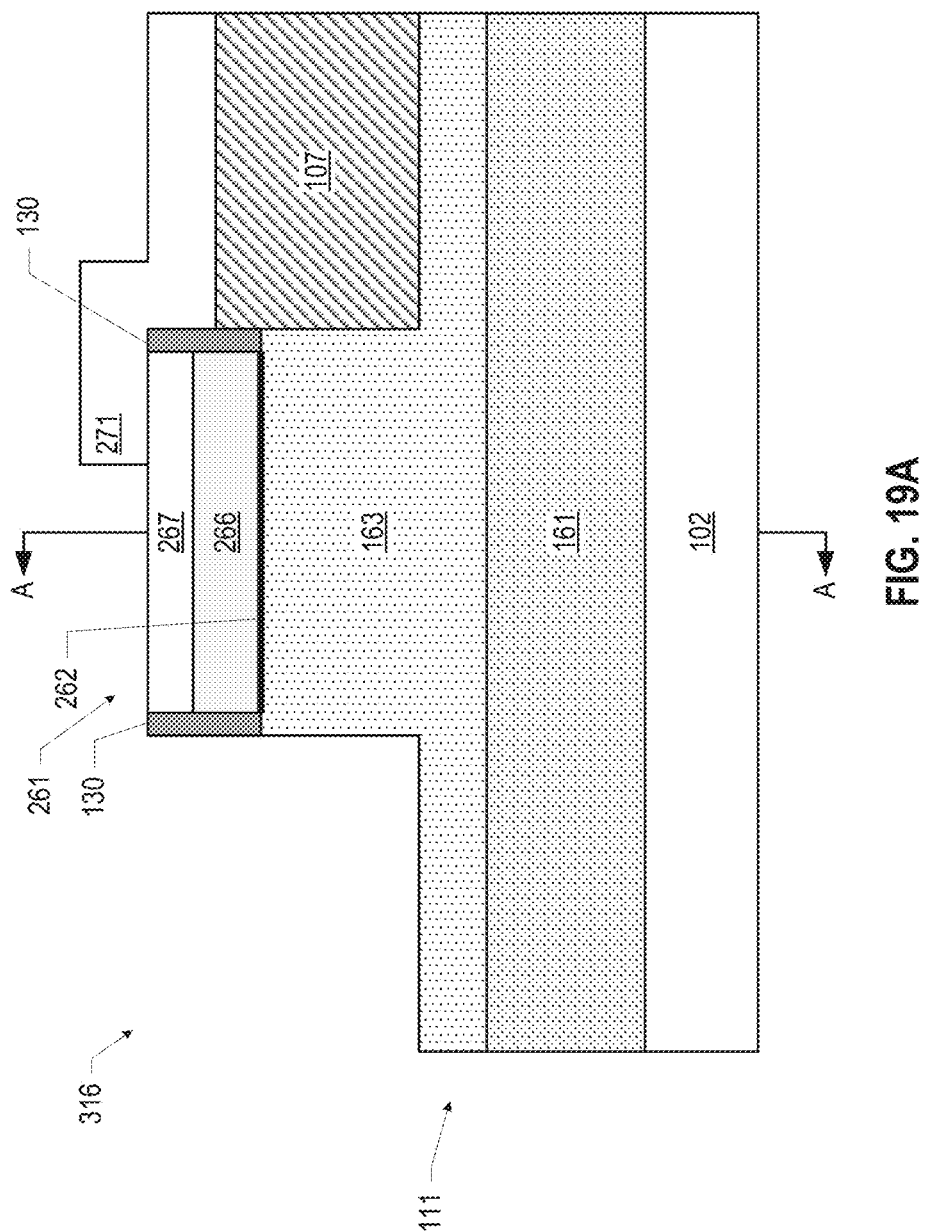
Figure 20C:
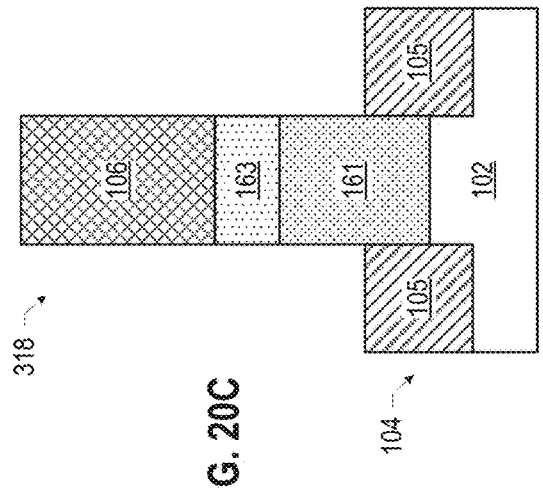
Figure 20B:
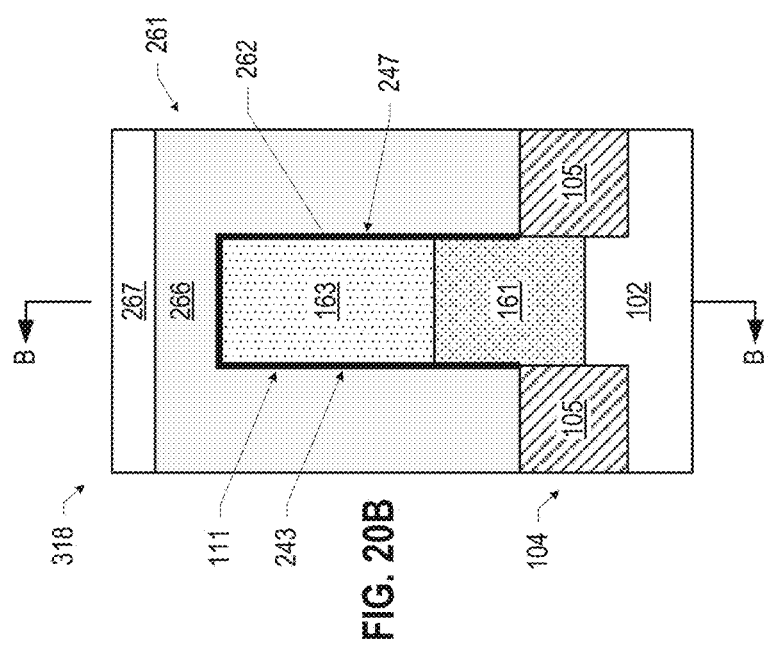
Figure 20D:
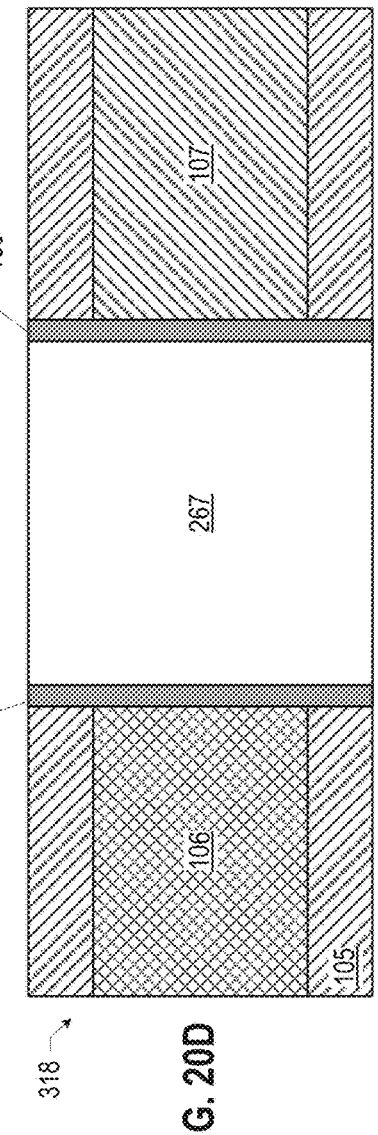

FIG. 20 illustrates an assembly 318 subsequent to forming a portion of the first source/drain material 106 on the exposed source/drain region 274 of the assembly 316 (FIG. 19). In some embodiments, the first source/drain material 106 may be formed using conventional epitaxial deposition methods, such as low-pressure CVD, vapor phase epitaxy, or molecular beam epitaxy. The first source/drain material 106 may include any appropriate material, such as any of the materials discussed above. In some embodiments in which the first source/drain material 106 and the second source drain material 107 are to have different heights (the heights 124 and 125, respectively), the source/drain region 274 may be further etched prior to growth of the first source/drain material 106 in the exposed source/drain region 274 to increase the depth of the exposed source/drain region 274.

In alternative embodiments, the sacrificial portions 272 of the fin 111 are not etched away in the manner discussed above with reference to FIG. 17. Instead, the first source/drain material 106 and the second source/drain material 107 may be formed by selectively doping the sacrificial portions 272 using any suitable techniques (e.g., ion implantation) to achieve a desired concentration level of p-type and n-type impurities. Additionally, an epitaxial semiconductor film may be grown on the top and sidewalls of the first source/drain material 106 and/or the second source/drain material 107 to form raised sources/drains to decrease current crowding, if desired (not shown).

Figure 21A:
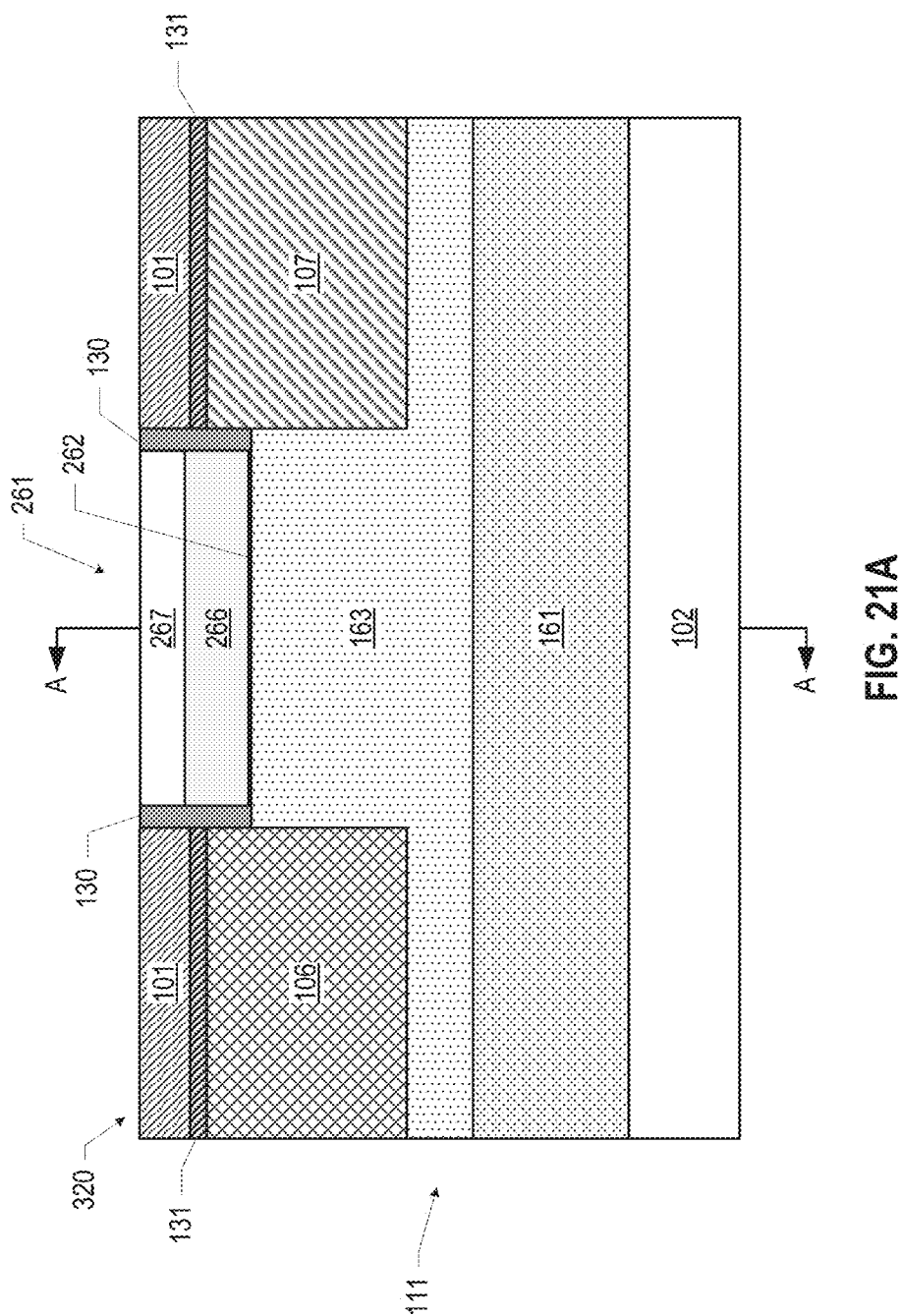

FIG. 21 illustrates an assembly 320 subsequent to depositing a layer of etch stop material 131, then depositing and polishing back an insulating material 101 on the assembly 318 (FIG. 20). The etch stop material 131 may include any suitable etch stop material, such as silicon nitride. In some embodiments, the etch stop material 131 may not be included. The insulating material 101 may be an interlayer dielectric (ILD) and may be blanket-deposited over all structures, including the source/drain materials 106 and 107 and the sacrificial gate 261, using any suitable method (e.g., a CVD method, such as PECVD or LPCVD). A CMP method may be performed to polish back the blanket-deposited insulating material 101 to expose the top of the sacrificial gate 261.

Figure 22A:
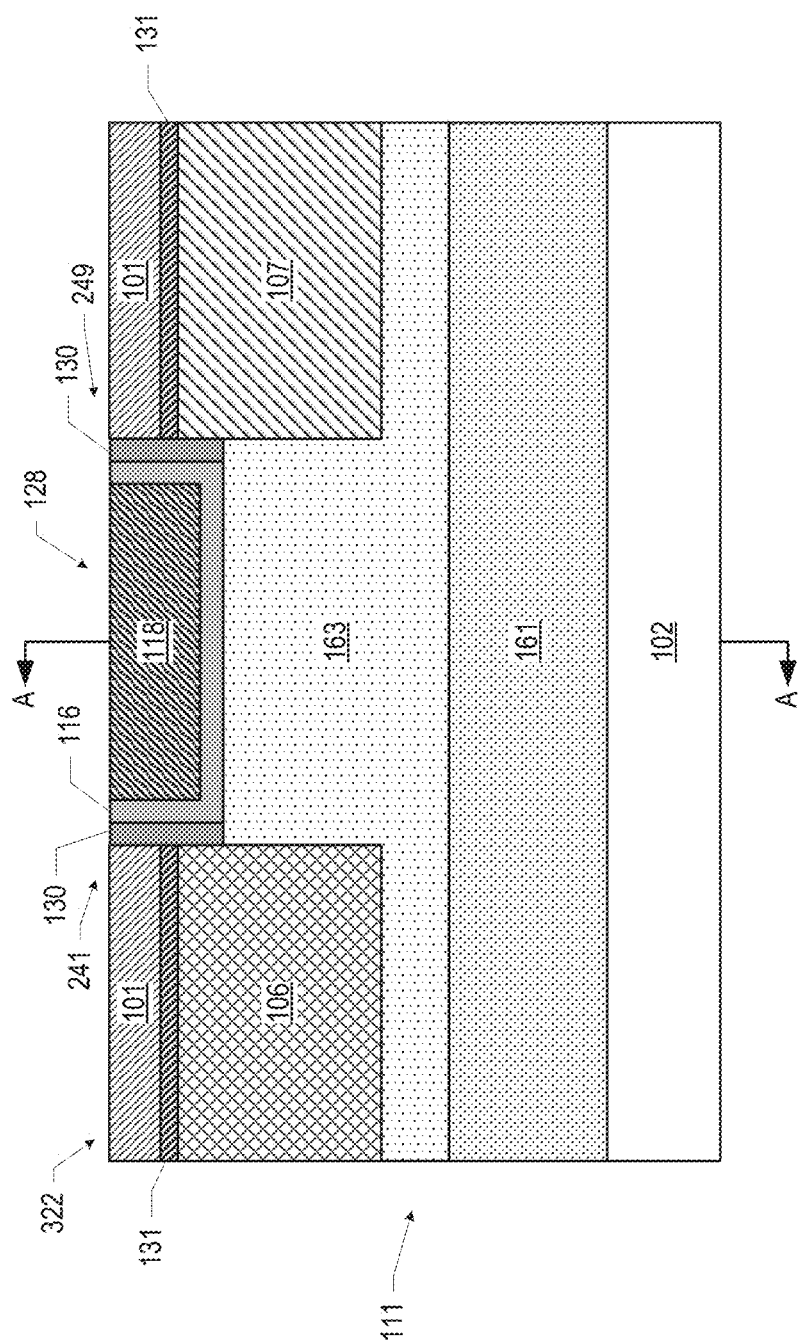

FIG. 22 illustrates an assembly 322 subsequent to removing the sacrificial gate 261 of the assembly 320 (FIG. 21) and forming a gate 128 including a conformal gate dielectric 116 and a gate electrode 118. The gate 128, like the sacrificial gate 261, may be disposed on top of and extend down the side faces of the fin 111. The etch stop material 131 and the insulating material 101 may protect the source/drain materials 106 and 107 during the removal of the sacrificial gate 261. The sacrificial gate electrode 266 may be removed using any suitable etching method. The gate dielectric 116 may be formed using a highly conformal deposition process (e.g., atomic layer deposition (ALD)) in order to ensure the formation of a gate dielectric layer having a uniform thickness on the exposed portions of the fin 111. In a particular embodiment, the gate dielectric 116 may be hafnium oxide and may be deposited to a thickness between 1 nanometer and 6 nanometers. The gate dielectric 116 may be blanket-deposited and thus may also be present on the top surface of the insulating material 101. Next, a gate electrode material may be blanket-deposited on the gate dielectric 116 to form the gate electrode 118. The gate electrode material may be deposited using any suitable deposition process (e.g., ALD). The blanket gate electrode material and gate dielectric 116 deposited on the top of the insulating material 101 may then be chemically mechanically planarized until the top surface of the insulating material 101 is revealed as shown.

Figure 23A:
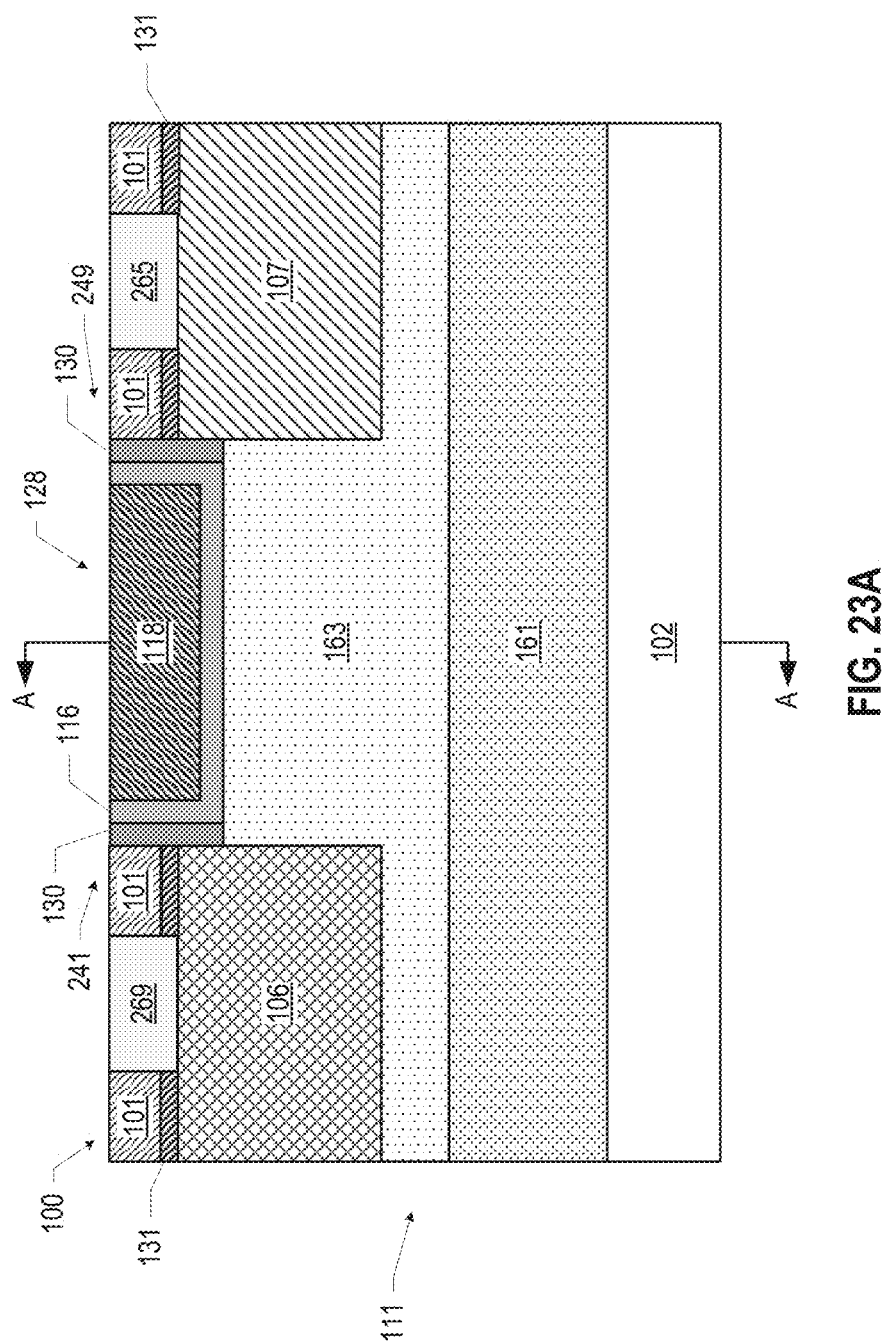

FIG. 23 illustrates an assembly 324 subsequent to removing portions of the etch stop material 131 and the insulating material 101 of the assembly 322 (FIG. 22) to form recesses above the source/drain materials 106 and 107 and forming source/drain contacts 269 and 265, respectively, in the recesses. Any suitable patterning and deposition techniques may be used to form the source/drain contacts 265 and 265. For example, a first conformal layer of a work function metal may be deposited in the recesses, the remainder of the recesses may be filled with another metal (e.g., tungsten or cobalt), and the overburden may be polished back.

Figure 24:
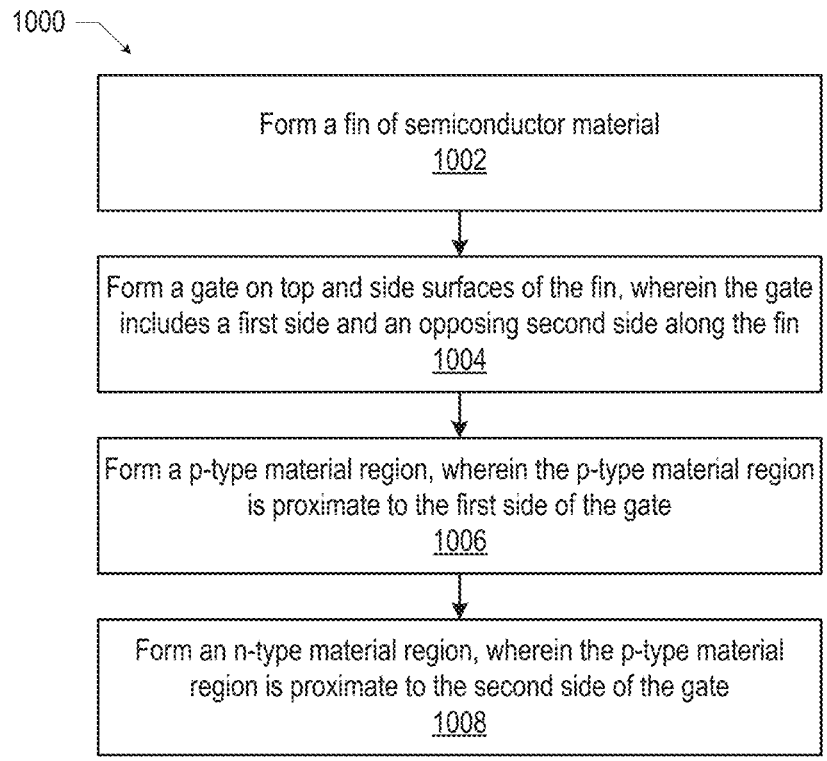
FIG. 24 is a flow diagram of an example method of manufacturing a TFET, in accordance with various embodiments.

FIG. 24 is a flow diagram of an example method 1000 of manufacturing a TFET, in accordance with various embodiments. Although the various operations discussed with reference to the method 1000 are shown in a particular order and once each, the operations may be performed in any suitable order (e.g., in any combination of parallel or series performance) and may be repeated or omitted as suitable. Additionally, although various operations of the method 1000 may be illustrated with reference to particular embodiments of the TFETs 100 disclosed herein, these are simply examples, and the method 1000 may be used to form any suitable device.

At 1002, a fin of semiconductor material may be formed. For example, a fin 111 including at least a channel material 163 may be formed (e.g., as discussed above with reference to FIGS. 11-14)

At 1004, a gate may be formed on top and side surfaces of the fin. The gate may include a first side and an opposing second side along the fin. For example, the sacrificial gate 261 may be formed on the top of the fin 111 and may extend onto the side faces 243 and 247 of the fin. The sacrificial gate 261 may include opposing sides 241 and 249 along the fin 111. The sacrificial gate 261 may be formed using a replacement gate process, as discussed above with reference to FIGS. 15, 16, and 22.

At 1006, a p-type material region may be formed. The p-type material region may be proximate to the first side of the gate. For example, the first source/drain material 106 may be a p-type material and may be proximate to the side 241 of the sacrificial gate 261.

At 1008, an n-type material region may be formed. The n-type material region may be proximate to the second side of the gate. For example, the second source/drain material 107 may be an n-type material and may be proximate to the side 249 of the sacrificial gate 261.

The TFETs 100 disclosed herein may be included in any suitable electronic component. FIGS. 25-29 illustrate various examples of apparatuses that may include any of the TFETs 100 disclosed herein.

Figure 25:
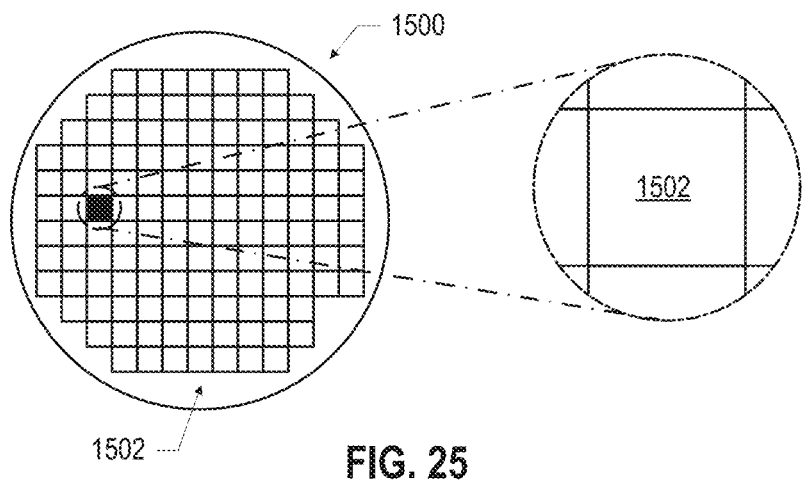
FIG. 25 is a top view of a wafer and dies that may include a TFET, in accordance with any of the embodiments disclosed herein.

FIG. 25 is a top view of a wafer 1500 and dies 1502 that may include one or more TFETs 100, or may be included in an IC package whose substrate includes one or more TFETs 100 (e.g., as discussed below with reference to FIG. 11) in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which each of the dies 1502 is separated from one another to provide discrete "chips" of the semiconductor product. The die 1502 may include one or more TFETs 100 (e.g., as discussed below with reference to FIG. 10), one or more other types of transistors (e.g., some of the transistors 1640 of FIG. 10, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 29) or other logic that is configured to store information in the memory devices or execute instructions stored in the memory array.

Figure 26:
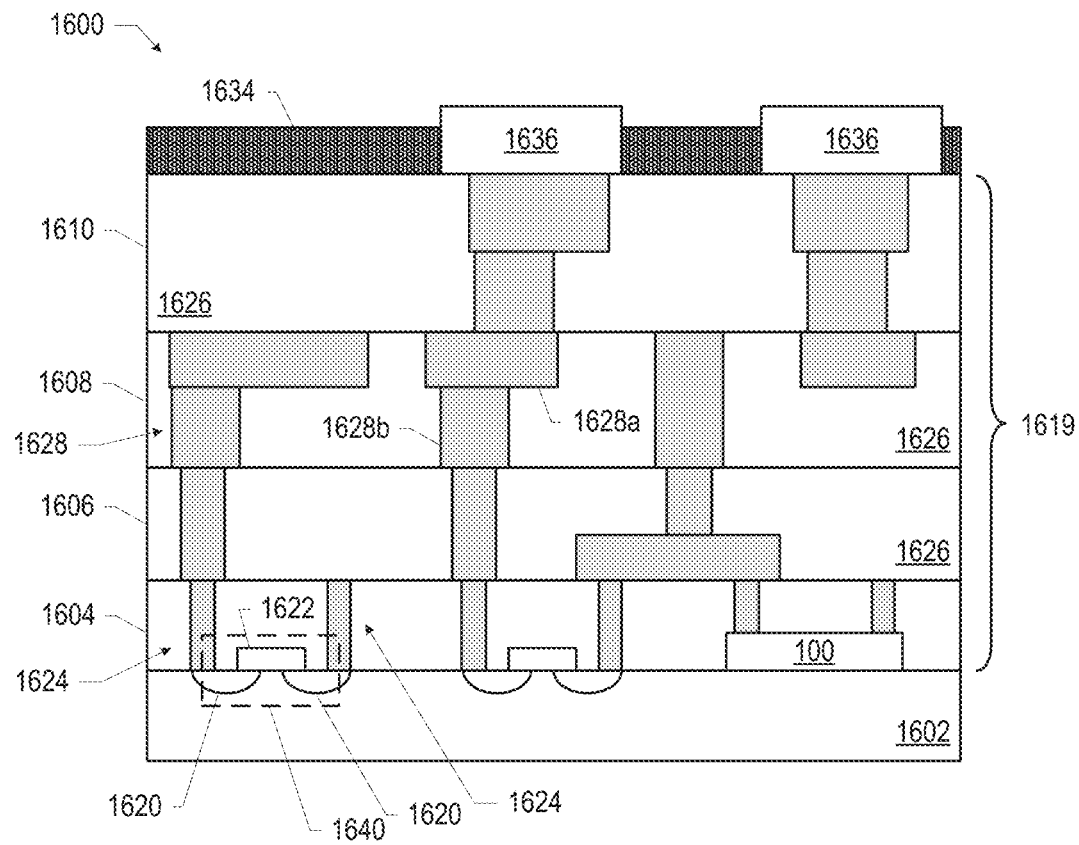
FIG. 26 is a cross-sectional side view of an integrated circuit (IC) device that may include a TFET, in accordance with any of the embodiments disclosed herein.

FIG. 26 is a cross-sectional side view of an IC device 1600 that may include one or more TFETs 100, or may be included in an IC package whose substrate includes one or more TFETs 100 (e.g., as discussed below with reference to FIG. 27), in accordance with any of the embodiments disclosed herein. One or more of the IC devices 1600 may be included in one or more dies 1502 (FIG. 25). The IC device 1600 may be formed on a substrate 1602 (e.g., the wafer 1500 of FIG. 25) and may be included in a die (e.g., the die 1502 of FIG. 25). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 25) or a wafer (e.g., the wafer 1500 of FIG. 25).

The IC device 1600 may include one or more device layers 1604 disposed on the substrate 1602. The device layer 1604 may include features of one or more transistors 1640 (e.g., MOSFETs) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 26 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric layer and a gate electrode layer. The gate dielectric layer may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode layer may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The VD regions 1620 may be formed using either an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

In some embodiments, the device layer 1604 may include one or more TFETs 100, in addition to or instead of the transistors 1640. FIG. 26 illustrates a single TFET 100 in the device layer 1604 for illustration purposes, but any number and structure of TFETs 100 may be included in a device layer 1604. A TFET 100 included in a device layer 1604 may be referred to as a "front end" device. In some embodiments, the IC device 1600 may not include any front end TFETs 100. One or more TFETs 100 in the device layer 1604 may be coupled to any suitable other ones of the devices in the device layer 1604, to any devices in the metallization stack 1619 (discussed below), and/or to one or more of the conductive contacts 1636 (discussed below).

Electrical signals, such as power and/or input/output (I/O) signals, may be routed to and/or from the devices (e.g., transistors 1640 and/or TFETs 100) of the device layer 1604 through one or more interconnect layers disposed on the device layer 1604 (illustrated in FIG. 26 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. In some embodiments, one or more TFETs 100 may be disposed in one or more of the interconnect layers 1606-1610, in accordance with any of the techniques disclosed herein. FIG. 26 illustrates a single TFET 100 in the interconnect layer 1608 for illustration purposes, but any number and structure of TFETs 100 may be included in any one or more of the layers in a metallization stack 1619. A TFET 100 included in the metallization stack 1619 may be referred to as a "back-end" device. In some embodiments, the IC; device 1600 may not include any back-end TFETs 100; in some embodiments, the IC device 1600 may include both front- and back-end TFETs 100. One or more TFETs 100 in the metallization stack 1619 may be coupled to any suitable ones of the devices in the device layer 1604 and/or to one or more of the conductive contacts 1636 (discussed below).

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 26). Although a particular number of interconnect layers 1606-1610 is depicted in FIG. 26, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 26. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 26. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., further away from the device layer 1604) may be thicker.

The IC device 1600 may include a solder resist material 1634 (e.g., polyimide or similar material) and one or more conductive contacts 1636 formed on the interconnect layers 1606-1610. In FIG. 26, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 27:
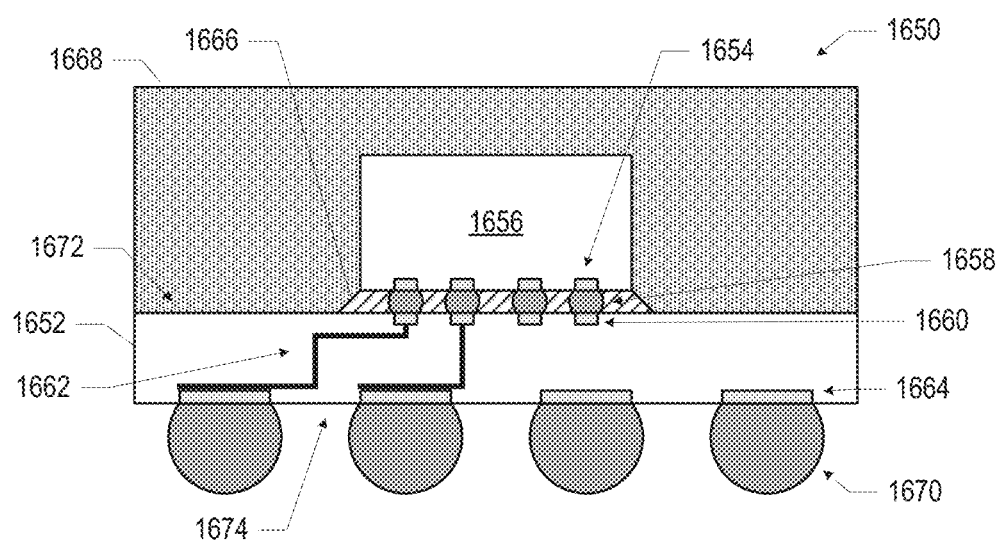
FIG. 27 is a cross-sectional side view of an IC package that may include a TFET, in accordance with various embodiments.

FIG. 27 is a cross-sectional view of an example IC package 1650 that may include one or more TFETs 100. The package substrate 1652 may be formed of a dielectric material and may have conductive pathways extending through the dielectric material between the face 1672 and the face 1674, or between different locations on the 1672 and/or between different locations on the face 1674. These conductive pathways may take the form of any of the interconnect structures 1628 discussed above with reference to FIG. 26. In some embodiments, the package substrate 1652 may include one or more TFETs 100 (not shown) in accordance with any of the embodiments disclosed herein. In some embodiments, no TFETs 100 may be included in the package substrate 1652.

The IC package 1650 may include a die 1656 coupled to the package substrate 1652 via conductive contacts 1654 of the die 1656, first-level interconnects 1658, and conductive contacts 1660 of the package substrate 1652. The conductive contacts 1660 may be coupled to conductive pathways 1662 through the package substrate 1652, allowing circuitry within the die 1656 to electrically couple to various ones of the conductive contacts 1664 (or to other devices included in the package substrate 1652, such as TFETs 100, not shown). The first-level interconnects 1658 illustrated in FIG. 27 are solder bumps, but any suitable first-level interconnects 1658 may be used. As used herein, a "conductive contact" may refer to a portion of conductive material (e.g., metal) serving as an electrical interface between different components; conductive contacts may be recessed in, flush with, or extending away from a surface of a component and may take any suitable form (e.g., a conductive pad or socket).

In some embodiments, an underfill material 1666 may be disposed between the die 1656 and the package substrate 1652 around the first-level interconnects 1658, and a mold compound 1668 may be disposed around the die 1656 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 27 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 28.

In FIG. 27, the IC package 1650 is a flip chip package. The die 1656 may take the form of any of the embodiments of the die 1502 discussed herein (e.g., may include any of the embodiments of the IC device 1600). In some embodiments, the die 1656 may include one or more TFETs 100 (e.g., as discussed above with reference to FIG. 25 and FIG. 26); in other embodiments, the die 1656 may not include any TFETs 100.

Although the IC package 1650 illustrated in FIG. 27 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although a single die 1656 is illustrated in the IC package 1650 of FIG. 27, an IC package 1650 may include multiple dies 1656. An IC package 1650 may include additional passive components, such as surface-mount resistors, capacitors, and inductors disposed on the first face 1672 or the second face 1674 of the package substrate 1652. More generally, an IC package 1650 may include any other active or passive components known in the art.

Figure 28:
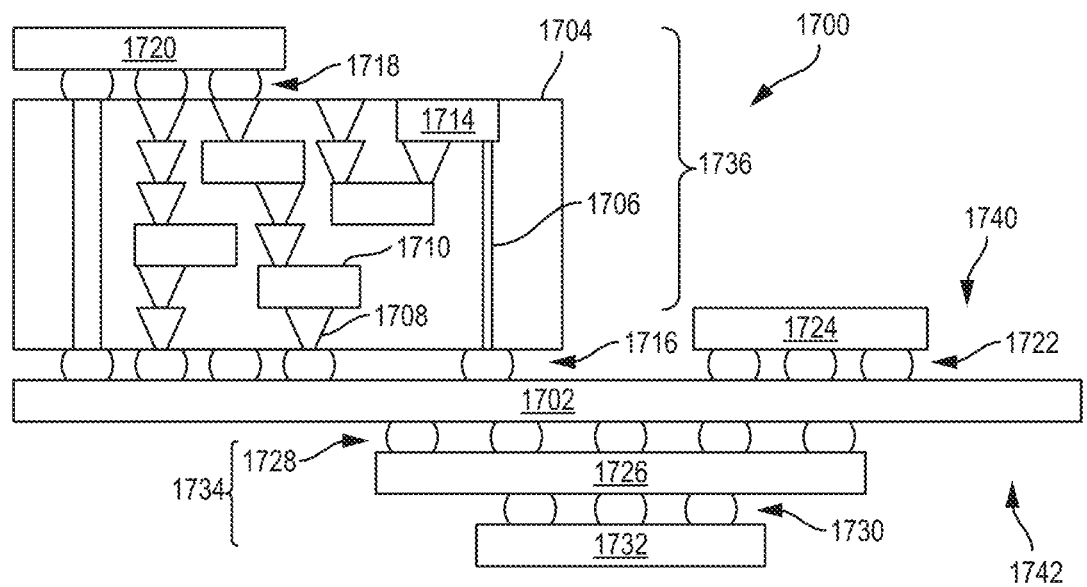
FIG. 28 is a cross-sectional side view of an IC device assembly that may include a TFET, in accordance with any of the embodiments disclosed herein.

FIG. 28 is a cross-sectional side view of an IC device assembly 1700 that may include one or more IC packages or other electronic components (e.g., a die) including one or more TFETs 100, in accordance with any of the embodiments disclosed herein. The IC device assembly 1700 includes a number of components disposed on a circuit board 1702 (which may be, for example, a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 27 (e.g., may include one or more TFETs 100 in a package substrate 1652 or in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC; device assembly 1700 illustrated in FIG. 28 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 28), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 28, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 25), an IC device (e.g., the IC device 1600 of FIG. 26), or any other suitable component. Generally, the interposer 1704 may spread a connection to a wider pitch or reroute a connection to a different connection. For example, the interposer 1704 may couple the IC package 1720 (e.g., a die) to a set of BGA conductive contacts of the coupling components 1716 for coupling to the circuit board 1702. In the embodiment illustrated in FIG. 28, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art. In some embodiments, the interposer 1704 may include one or more TFETs 100 (not shown).

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 28 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 29:
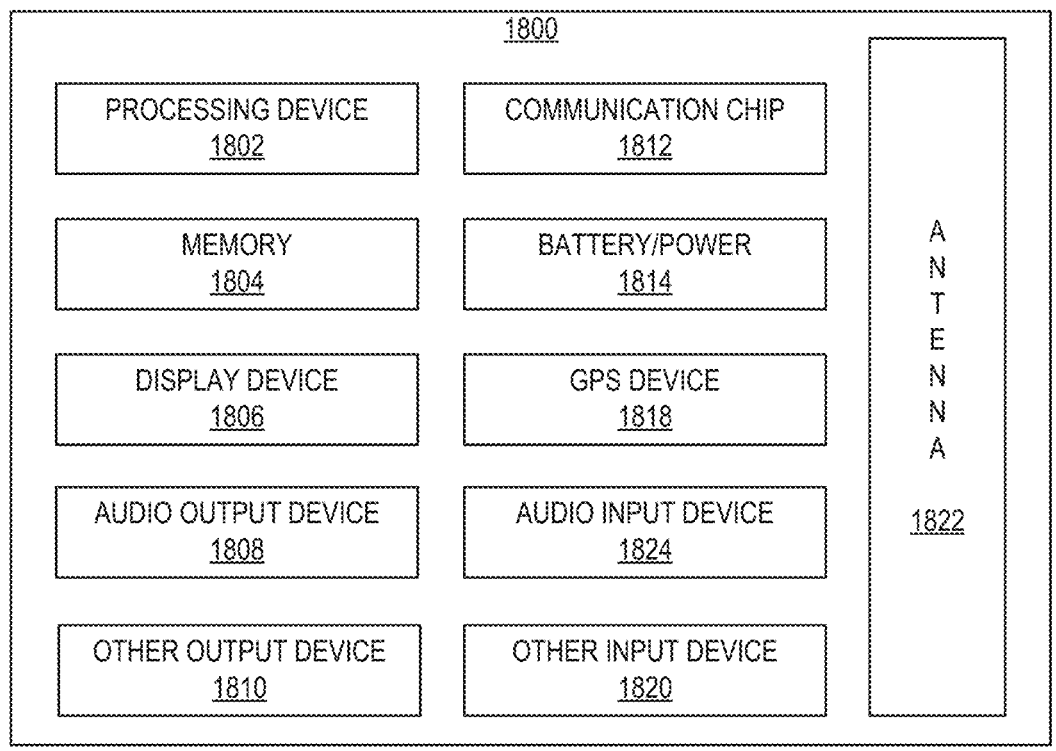
FIG. 29 is a block diagram of an example computing device that may include a TFET, in accordance with any of the embodiments disclosed herein.

FIG. 29 is a block diagram of an example electrical device 1800 that may include one or more TFETs 100, in accordance with any of the embodiments disclosed herein. For example, any suitable ones of the components of the electrical device 1800 may include one or more of the IC packages 1650, IC devices 1600, or dies 1502 disclosed herein. A number of components are illustrated in FIG. 29 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 29, but the electrical device 1800 may include interface circuitry for coupling to the one or more components. For example, the electrical device 1800 may not include a display device 1806 but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DC)), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LIE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power). As noted above, in some embodiments, the electrical device 1800 may be a low power device (e.g., may have a power supply that proves a supply voltage less than 1 volt, or less than 0.5 volts).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds, for example.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (OR) code reader, any sensor, or a radio frequency identification (RFID) reader.

The electrical device 1800 may have any desired form factor, such as a hand-held or mobile electrical device (e.g., a cell phone, a smart phone, a mobile Internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an electronic component, including: a tunneling field effect transistor (TFET), including a first semiconductor material having a p-type conductivity, a second semiconductor material having an n-type conductivity, a channel material at least partially between the first semiconductor material and the second semiconductor material, wherein the channel material has a first side face and a second side face opposite the first side face, and a gate above the channel material, on the first side face, and on the second side face.

Example 2 may include the subject matter of Example 1, and may further specify that the first semiconductor material and the second semiconductor material are above a substrate.

Example 3 may include the subject matter of Example 2, and may further specify that the substrate includes crystalline silicon or crystalline germanium.

Example 4 may include the subject matter of any of Examples 2-3, and may further specify that a buffer material is on the substrate, and the first semiconductor material and the second semiconductor material are on the buffer material.

Example 5 may include the subject matter of Example 4, and may further specify that the buffer material includes a group III-V material.

Example 6 may include the subject matter of Example 5, and may further specify that the buffer material includes gallium, arsenic, antimony, indium, phosphorus, aluminum, aluminum arsenide, aluminum antimonide, gallium arsenide, gallium antimonide, indium phosphide, indium gallium arsenide, aluminum gallium arsenide, indium aluminum arsenide, aluminum arsenic antimonide, aluminum gallium antimonide, indium gallium antimonide, or gallium arsenic antimonide.

Example 7 may include the subject matter of Example 4, and may further specify that the buffer material includes germanium or silicon.

Example 8 may include the subject matter of any of Examples 4-7, and may further specify that the channel material is on the buffer material.

Example 9 may include the subject matter of any of Examples 4-8, and may further specify that the channel material is on an oxide material.

Example 10 may include the subject matter of Example 9, and may further specify that the oxide material is on the substrate.

Example 11 may include the subject matter of any of Examples 4-10, and may further specify that the channel material is between the first semiconductor material and the buffer material, and the channel material is between the second semiconductor material and the buffer material.

Example 12 may include the subject matter of any of Examples 2-11, and may further specify that a portion of the channel material is between the first semiconductor material and the substrate.

Example 13 may include the subject matter of Example 12, and may further specify that the channel material is not present between the second semiconductor material and the substrate.

Example 14 may include the subject matter of Example 12, and may further specify that a portion of the channel material is between the second semiconductor material and the substrate.

Example 15 may include the subject matter of any of Examples 12-14, and may further specify that a height of the channel material under the first semiconductor material is greater than a height of the channel material under the gate.

Example 16 may include the subject matter of any of Examples 12-14, and may further specify that a height of the channel material under the first semiconductor material is less than a height of the channel material under the gate.

Example 17 may include the subject matter of any of Examples 2-16, and may further specify that a portion of the channel material is between the second semiconductor material and the substrate.

Example 18 may include the subject matter of Example 17, and may further specify that the channel material is not present between the first semiconductor material and the substrate.

Example 19 may include the subject matter of any of Examples 17-18, and may further specify that a height of the channel material under the second semiconductor material is greater than a height of the channel material under the gate.

Example 20 may include the subject matter of any of Examples 17-18, and may further specify that a height of the channel material under the second semiconductor material is less than a height of the channel material under the gate.

Example 21 may include the subject matter of any of Examples 1-20, and may further specify that the first semiconductor material comprises source material and the second semiconductor material comprises drain material, or the first semiconductor material comprises drain material and the second semiconductor material comprises source material.

Example 22 may include the subject matter of any of Examples 1-21, and may further specify that the channel material has a top face and a bottom face opposite the top face, and the gate is on the top face and the bottom face.

Example 23 may include the subject matter of any of Examples 1-22, and may further specify that a height of the first semiconductor material is different from a height of the second semiconductor material.

Example 24 may include the subject matter of any of Examples 1-23, and may further specify that a height of the channel material is different from a height of the first semiconductor material.

Example 25 may include the subject matter of any of Examples 1-24, and may further specify that a height of the channel material is different from a height of the second semiconductor material.

Example 26 may include the subject matter of any of Examples 1-25, and may further spec that the channel material includes gallium, indium, arsenic, indium gallium arsenide, or indium arsenide.

Example 27 may include the subject matter of any of Examples 1-26, and may further specify that the first semiconductor material includes gallium, antimony, indium, arsenic, gallium antimonide, indium gallium arsenide, or indium arsenide.

Example 28 may include the subject matter of any of Examples 1-27, and may further specify that the second source drain material includes gallium, phosphorous, arsenic, indium, indium arsenide, indium gallium arsenide, or indium phosphide.

Example 29 may include the subject matter of any of Examples 1-28, and may further specify that: the first semiconductor material includes indium, gallium, and arsenic; the second semiconductor material includes indium, gallium, and arsenic; and the channel material includes indium, gallium, and arsenic.

Example 30 may include the subject matter of any of Examples 1-28, and may further specify that: the first semiconductor material includes gallium and antimony; the second semiconductor material includes indium and arsenic; and the channel material includes indium and arsenic.

Example 31 may include the subject matter of any of Examples 1-28, and may further specify that: the first semiconductor material includes indium and arsenic; the second semiconductor material includes indium and phosphorous; and the channel material includes indium, gallium, and arsenic.

Example 32 may include the subject matter of any of Examples 1-28, and may further specify that the first semiconductor material, the second semiconductor material, and the channel material includes a same group III-V material.

Example 33 may include the subject matter of any of Examples 1-28, and may further specify that the First semiconductor material, the second semiconductor material, and the channel material include silicon.

Example 34 may include the subject matter of any of Examples 1-28, and may further specify that the first semiconductor material, the second semiconductor material, and the channel material include germanium.

Example 35 may include the subject matter of any of Examples 1-34, and may further specify that the gate includes a gate dielectric and a gate electrode.

Example 36 may include the subject matter of Example 35, and may further specify that the gate dielectric is a multilayer gate dielectric.

Example 37 may include the subject matter of any of Examples 35-36, and may further specify that the gate electrode includes multiple metals.

Example 38 is a method of manufacturing a tunneling field effect transistor (TFET), including: forming a fin of semiconductor material; forming a gate on top and side surfaces of the fin, wherein the gate includes a first side and an opposing second side along the fin; forming a p-type material region, wherein the p-type material region is proximate to the first side of the gate; and forming an n-type material region, wherein the n-type material region is proximate to the second side of the gate.

Example 39 may include the subject matter of Example 38, and may further specify that forming the p-type material region and forming the n-type material region includes: removing a first portion of the fin to form a first recess proximate to the first side of the gate; removing a second portion of the fin to form a second recess proximate to the second side of the gate; growing an n-type material in the first recess and in the second recess, wherein the n-type material in the second recess is the n-type material region; masking the n-type material region; removing the n-type material from the first recess; and growing a p-type material in the first recess, wherein the p-type material in the first recess is the p-type material region.

Example 40 may include the subject matter of any of Examples 39, and may further include, after removing the n-type material from the first recess, increasing a depth of the first recess, wherein the p-type material is grown in the first recess after increasing the depth of the first recess.

Example 41 may include the subject matter of Example 38, and may further specify that forming the p-type material region and forming the n-type material region includes: doping a first portion of the fin with an n-type impurity to form the n-type material region; and doping a second portion of the fin with a p-type impurity to form the p-type material region.

Example 42 may include the subject matter of Example 38, and may further specify that forming the p-type material region and forming the n-type material region includes: removing a first portion of the fin to form a first recess proximate to the first side of the gate; removing a second portion of the fin to form a second recess proximate to the second side of the gate; growing a p-type material in the first recess and in the second recess, wherein the p-type material in the second recess is the p-type material region; masking the p-type material region; removing the p-type material from the first recess; and growing an n-type material in the first recess, wherein the n-type material in the first recess is the n-type material region.

Example 43 may include the subject matter of Example 42, and may further include, after removing the p-type material from the first recess, increasing a depth of the first recess, wherein the n-type material is grown in the first recess after increasing the depth of the first recess.

Example 44 may include the subject matter of any of Examples 38-43, and may further specify that forming the fin of semiconductor material includes: patterning a crystalline semiconductor material to form an initial fin; providing a shallow trench isolation (STI) material around the initial fin; removing at least some of the initial fin to form a trench in the STI material; and providing a semiconductor material in the trench to form the fin of semiconductor material.

Example 45 may include the subject matter of any of Examples 38-44, and may further specify that the fin of semiconductor material includes a layer of indium gallium arsenide on a layer of gallium arsenide.

Example 46 may include the subject matter of any of Examples 38-, and may further specify that the fin of semiconductor material includes a layer of indium arsenide on a layer of gallium antimonide.

Example 47 may include the subject matter of any of Examples 38-44, and may further specify that the fin of semiconductor material includes a layer of indium gallium arsenide on a layer of gallium arsenic antimonide.

Example 48 may include the subject matter of any of Examples 38-44, and may further specify that the fin of semiconductor material includes germanium.

Example 49 may include the subject matter of any of Examples 38-44, and may further specify that the fin of semiconductor material includes silicon.

Example 50 may include the subject matter of any of Examples 38-44, and may further specify that the fin of semiconductor material includes a layer of a semiconductor material on an oxide material, wherein the semiconductor material includes a group IV material or a group III-V material.

Example 51 is a computing device, including: a die including a tunneling field effect transistor (TFET), wherein the TFET includes a first semiconductor material having a p-type conductivity, a second semiconductor material having an n-type conductivity, a channel material at least partially between the first semiconductor material and the second semiconductor material, wherein the channel material has a first side face and a second side face opposite the first side face, and a gate above the channel material, on the first side face, and on the second side face.

Example 52 may include the subject matter of Example 51, and may further specify that the computing device includes a power supply that provides a supply voltage that is less than 0.5 volts.

Example 53 may include the subject matter of any of Examples 51-52, and may further specify that the first semiconductor material has a different height than the second semiconductor material.

Example 54 may include the subject matter of any of Examples 51-53, and may further specify that the computing device is a mobile computing device.

Example 55 may include the subject matter of any of Examples 51-54, and may further specify that the computing device is a wearable computing device.

Example 56 may include the subject matter of any of Examples 51-55, and may further include a touchscreen display.

Example 57 may include the subject matter of any of Examples 51-56, and may further specify that the TFET is included in a metallization stack of the die.

Example 58 may include the subject matter of any of Examples 51-56, and may further specify that the first semiconductor material comprises source material and the second semiconductor material comprises drain material, or the first semiconductor material comprises drain material and the second semiconductor material comprises source material.

The invention claimed is:
1. An electronic component, comprising:
 a tunneling field effect transistor (TFET), including:
  a first semiconductor material having a p-type conductivity, the first semiconductor material having a first height,
  a second semiconductor material having an n-type conductivity, the second semiconductor material having a second height different from the first height,
  a channel material at least partially between the first semiconductor material and the second semiconductor material, wherein the channel material has a first side face and a second side face opposite the first side face, and
  a gate above the channel material, on the first side face, and on the second side face.
2. The electronic component of claim 1, wherein the first semiconductor material and the second semiconductor material are above a substrate.
3. The electronic component of claim 2, wherein the substrate includes crystalline silicon or crystalline germanium.
4. The electronic component of claim 2, wherein a buffer material is on the substrate, and the first semiconductor material and the second semiconductor material are above the buffer material.
5. The electronic component of claim 4, wherein the buffer material includes a group III-V material.
6. The electronic component of claim 5, wherein the buffer material includes gallium, arsenic, antimony, indium, phosphorus, aluminum, aluminum arsenide, aluminum antimonide, gallium arsenide, gallium antimonide, indium phosphide, indium gallium arsenide, aluminum gallium arsenide, indium aluminum arsenide, aluminum arsenic antimonide, aluminum gallium antimonide, indium gallium antimonide, or gallium arsenic antimonide.
7. The electronic component of claim 4, wherein the buffer material includes germanium or silicon.
8. The electronic component of claim 4, wherein the channel material is on the buffer material.
9. The electronic component of claim 4, wherein the channel material is on an oxide material.
10. The electronic component of claim 2, wherein a portion of the channel material is between the second semiconductor material and the substrate.
11. The electronic component of claim 10, wherein the channel material is not present between the first semiconductor material and the substrate.
12. The electronic component of claim 1, wherein the first semiconductor material comprises source material and the second semiconductor material comprises drain material, or the first semiconductor material comprises drain material and the second semiconductor material comprises source material.
13. The electronic component of claim 1, wherein the channel material has a top face and a bottom face opposite the top face, and the gate is on the top face and the bottom face.
14. The electronic component of claim 1, wherein the first semiconductor material, the second semiconductor material, and the channel material includes a same group III-V material.
15. The electronic component of claim 2, wherein the first semiconductor material has a bottom face and the second semiconductor material has a bottom face, and a first distance between the bottom face of the first semiconductor material and the substrate is different from a second distance between the bottom face of the first semiconductor material and the substrate.
16. The electronic component of claim 2, wherein the first semiconductor material has a top face and the second semiconductor material has a top face, and a first distance between the top face of the first semiconductor material and the substrate is different from a second distance between the top face of the first semiconductor material and the substrate.
17. A computing device, comprising:
 a die including a tunneling field effect transistor (TFET), wherein the TFET includes:
  a first semiconductor material having a p-type conductivity, the first semiconductor material having a first height,
  a second semiconductor material having an n-type conductivity, the second semiconductor material having a second height different from the first height,
  a channel material at least partially between the first semiconductor material and the second semiconductor material, wherein the channel material has a first side face and a second side face opposite the first side face, and a gate above the channel material, on the first side face, and on the second side face.

18. The computing device of claim 17, wherein the computing device includes a power supply that provides a supply voltage that is less than 0.5 volts.

19. The computing device of claim 17, wherein the computing device is a mobile computing device.

20. The computing device of claim 17, wherein the TFET is included in a metallization stack of the die.

* * * * *